US008198016B2

(12) United States Patent
Hatakeyama et al.

(10) Patent No.: US 8,198,016 B2
(45) Date of Patent: *Jun. 12, 2012

(54) PATTERNING PROCESS

(75) Inventors: Jun Hatakeyama, Jyoetsu (JP); Tsutomu Ogihara, Jyoetsu (JP); Mutsuo Nakashima, Jyoetsu (JP); Kazuhiro Katayama, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 400 days.

This patent is subject to a terminal disclaimer.

(21) Appl. No.: 12/453,241

(22) Filed: May 4, 2009

(65) Prior Publication Data

US 2009/0286188 A1 Nov. 19, 2009

(30) Foreign Application Priority Data

May 15, 2008 (JP) ................................ 2008-128242
Feb. 3, 2009 (JP) ................................ 2009-022685

(51) Int. Cl.
*G03F 7/00* (2006.01)
*G03F 7/004* (2006.01)
*G03F 7/095* (2006.01)
*G03F 7/26* (2006.01)
*G03F 7/40* (2006.01)

(52) U.S. Cl. .................. 430/312; 430/271.1; 430/273.1; 430/313; 430/314; 430/317; 430/322; 430/323; 430/328; 430/330; 430/331; 430/905; 430/913; 430/914

(58) Field of Classification Search ............... 430/270.1, 430/271.1, 273.1, 312, 313, 314, 317, 322, 430/323, 328, 330, 331, 905, 913, 914
See application file for complete search history.

(56) References Cited

U.S. PATENT DOCUMENTS

| | | | | |
|---|---|---|---|---|
| 5,294,680 | A | 3/1994 | Knors et al. | |
| 5,686,223 | A * | 11/1997 | Cleeves | 430/312 |
| 6,221,562 | B1 * | 4/2001 | Boyd et al. | 430/314 |
| 6,448,420 | B1 | 9/2002 | Kinsho et al. | |
| 7,033,735 | B2 * | 4/2006 | Ho et al. | 430/312 |

(Continued)

FOREIGN PATENT DOCUMENTS

EP 1845132 A2 * 10/2007

(Continued)

OTHER PUBLICATIONS

Machine translation of JP2007-119678 (no date).*

(Continued)

*Primary Examiner* — Amanda C. Walke
(74) *Attorney, Agent, or Firm* — Oliff & Berridge, PLC

(57) ABSTRACT

The present invention provides a patterning process, in which a resistance with regard to an organic solvent used for a composition for formation of a reverse film is rendered to a positive pattern to the degree of necessity and yet solubility into an alkaline etching liquid is secured, thereby enabling to finally obtain a negative image by a positive-negative reversal by performing a wet etching using an alkaline etching liquid. A resist patterning process of the present invention using a positive-negative reversal comprises at least a step of forming a resist film by applying a positive resist composition; a step of obtaining a positive pattern by exposing and developing the resist film; a step of crosslinking the positive resist pattern thus obtained; a step of forming a reverse film; and a step of reversing the positive pattern to a negative pattern by dissolving into an alkaline wet-etching liquid for removal.

17 Claims, 3 Drawing Sheets

U.S. PATENT DOCUMENTS

| | | | | |
|---|---|---|---|---|
| 7,067,231 | B2 * | 6/2006 | Harada et al. | 430/270.1 |
| 7,205,093 | B2 * | 4/2007 | Hinsberg, III | 430/273.1 |
| 7,297,616 | B2 * | 11/2007 | Cameron et al. | 438/514 |
| 7,550,249 | B2 * | 6/2009 | Abdallah et al. | 430/270.1 |
| 7,741,015 | B2 * | 6/2010 | Hatakeyama et al. | 430/312 |
| 7,833,694 | B2 * | 11/2010 | Hasegawa et al. | 430/270.1 |
| 7,935,477 | B2 * | 5/2011 | Hsu et al. | 430/313 |
| 7,943,289 | B2 * | 5/2011 | Rangarajan et al. | 430/322 |
| 2004/0241577 | A1 | 12/2004 | Hatakeyama et al. | |
| 2004/0259037 | A1 | 12/2004 | Hatakeyama et al. | |
| 2007/0122740 | A1 | 5/2007 | Hatakeyama et al. | |
| 2007/0275325 | A1 | 11/2007 | Hatakeyama et al. | |
| 2008/0199814 | A1 * | 8/2008 | Brzozowy et al. | 430/312 |
| 2009/0087786 | A1 * | 4/2009 | Hatakeyama | 430/285.1 |
| 2010/0040838 | A1 * | 2/2010 | Abdallah et al. | 428/195.1 |
| 2010/0086870 | A1 * | 4/2010 | Ogihara et al. | 430/270.1 |
| 2010/0086872 | A1 * | 4/2010 | Ogihara et al. | 430/272.1 |

FOREIGN PATENT DOCUMENTS

| | | |
|---|---|---|
| JP | A-64-7525 | 1/1989 |
| JP | A-1-92741 | 4/1989 |
| JP | A-1-191423 | 8/1989 |
| JP | A-2-154226 | 6/1990 |
| JP | A-6-27654 | 2/1994 |
| JP | A-6-118631 | 4/1994 |
| JP | A-6-118656 | 4/1994 |
| JP | B2-7-69611 | 7/1995 |
| JP | A-8-87115 | 4/1996 |
| JP | A-8-179509 | 7/1996 |
| JP | A-2000-327633 | 11/2000 |
| JP | A-2001-92154 | 4/2001 |
| JP | A-2004-205658 | 7/2004 |
| JP | A-2004-205676 | 7/2004 |
| JP | A-2004-205685 | 7/2004 |
| JP | A-2004-354554 | 12/2004 |
| JP | A-2005-10431 | 1/2005 |
| JP | A-2005-43420 | 2/2005 |
| JP | A-2005-128509 | 5/2005 |
| JP | A-2005-250434 | 9/2005 |
| JP | A-2006-53543 | 2/2006 |
| JP | A-2006-227391 | 8/2006 |
| JP | A-2006-259249 | 9/2006 |
| JP | A-2006-259482 | 9/2006 |
| JP | A-2006-285095 | 10/2006 |
| JP | A-2006-293298 | 10/2006 |
| JP | 2007119678 A * | 5/2007 |
| JP | A-2007-171895 | 7/2007 |
| JP | A-2007-199653 | 8/2007 |
| JP | A-2007-316282 | 12/2007 |
| JP | A-2008-26600 | 2/2008 |
| JP | A-2008-96684 | 4/2008 |

OTHER PUBLICATIONS

Lin, "Semiconductor Foundry, Lithography, and Partners," *Proceedings of SPIE*, vol. 4690, Mar. 2002, pp. xxix-xlii.

Owa et al., "Immersion lithography; its potential performance and issues," *Proceedings of SPIE*, vol. 5040, 2003, pp. 724-733.

Maenhoudt et al., "Double Patterning scheme for sub-0.25 k1 single damascene structures at NA=0.75, λ=193nm," *Proceedings of SPIE*, vol. 5754, 2005, pp. 1508-1518.

Shibuya et al., "Performance of Resolution Enhancement Technique Using Both Multiple Exposure and Nonlinear Resist," *Jpn. J. Appl. Phys.*, vol. 33, Dec. 1994, pp. 6874-6877.

Nakamura et al., "Contact Hole Formation by Multiple Exposure Technique in Ultra-low $k_1$ Lithography," *Proceedings of SPIE*, vol. 5377, 2004, pp. 255-263.

* cited by examiner

PATTERNING PROCESS

BACKGROUND OF THE INVENTION

1. Field of the Invention

The present invention relates to a resist patterning process, comprising forming a positive pattern by exposure and development, making the positive pattern soluble in an alkaline liquid, coating a reverse film on it, and then reversing the positive pattern to a negative pattern by an alkaline etching.

2. Description of the Related Art

In recent years, as LSI progresses toward a higher integration and a further acceleration in speed, a finer pattern rule is required. In the light-exposure used as a general technology nowadays, the resolution inherent to the wavelength of a light source is approaching to its limit. In 1980s, a g-line (436 nanometers) or an i-line (365 nanometers) of a mercury lamp was used in a resist patterning process as an exposure light. As a means for further miniaturization, shifting to a shorter wavelength of an exposing light was assumed to be effective. As a result, in a weight production process after a DRAM (Dynamic Random Access Memoir) with a 64-Mega bit (processing dimension of less than 0.25 micrometer) in 1990s, a KrF excimer laser (248 nanometers), a shorter wavelength than an i-line (365 nanometers), was used in place of the i-line as an exposure light source. However, in production of DRAMs with an integration of 256 M and higher than 1 G which require further miniaturized process technologies (processing dimension of equal to or less than 0.2 micrometer), a light source with a further short wavelength is required, and thus a photo lithography using an ArF excimer laser (193 nanometers) has been investigated seriously since about a decade ago. At first, an ArF lithography was planned to be applied to a device starting from a 180 nanometers node device, but a KrF excimer laser lithography lived long to a weight production of a 130 nanometers node device, and thus a full-fledged application of an ArF lithography will start from a 90 nanometers node. Further, a study of a 65 nanometers node device by combining with a lens having an increased numerical aperture (NA) till 0.9 is now underway. Further shortening of wavelength of an exposure light is progressing towards the next 45 nanometers node device, and for that an $F_2$-lithography with a 157 nanometers wavelength became a candidate. However, there are many problems with an $F_2$-lithography; a cost-up of a scanner due to the use of a large quantities of expensive $CaF_2$ single crystals for a projector lens, extremely poor sustainability of a soft pellicle, which leads to a change of an optical system due to introduction of a hard pellicle, a decrease in an etching resistance of a resist film, and the like. Because of these problems, it was proposed to postpone an $F_2$-lithography and to introduce an ArF immersion lithography earlier (Proc. SPIE Vol. 4690, xxix).

In an ArF immersion lithography, a proposal is made to impregnate water between a projector lens and a wafer. A refractive index of water at 193 nanometers is 1.44, and therefore a patterning is possible even if a lens with a numerical aperture (NA) of equal to or more than 1.0 is used, and moreover, theoretically NA may be increased to nearly 1.44. In the beginning, deterioration of a resolution and a shift of a focus due to a change of refractive index associated with a change of water temperature were pointed out. However, the problems associated with the change in the refractive index have been solved by controlling the water temperature within 1/100° C. In addition, it was also confirmed that the effect of heat generation from a resist film by exposure was almost insignificant. As to the concern of water microbubbles in a pattern reversal, it was also confirmed that evolution of bubbles from a resist film by exposure was insignificant if water is fully degassed. In the early period of an immersion lithography in 1980s, a proposal was made to immerse an entire stage into water. However, a partial fill method having nozzles of water supply and drainage in which water is introduced only between a projector lens and a wafer in order to meet the movement of a high-speed scanner was adopted. By using an immersion in water, designing of a lens with NA of 1 or higher became theoretically possible. However, there appeared a problem in it that a lens of an optical system based on a conventional refractive index system becomes extraordinary large, thereby leading to distortion of a lens due to its own weight. A proposal was made to design a catadioptric optical system for a more compact lens, which accelerated to design a lens having NA of 1.0 or more. Now a possibility of a 45 nanometers node is shown by combining a lens having NA of 1.2 or more with a super resolution technology (Proc. SPIE Vol. 5040, p. 724), and furthermore a development of a lens with NA 1.35 is underway.

As a 32 nanometers node lithography technique, a lithography of a vacuum ultraviolet beam (EUV) with a wavelength of 13.5 nanometers is known. Problems of an EUV lithography are requirements for a higher laser output power, a higher sensitivity of a resist film, a higher resolution, a lower line width roughness (LWR), a non-defective MoSi laminate mask, a lower aberration of a reflective mirror, and the like, and thus there are mounting problems to be addressed.

A maximum resolution in a water-immersion lithography using a lens with NA of 1.35 is 40 to 38 nanometers, and there is no possibility to reach 32 nanometers. Accordingly, development of a material having a higher refractive index is underway to increase NA further. A limiting factor of NA in a lens is determined by a minimum refractive index among a projector lens, a liquid, and a resist film. In the case of a water immersion, a refractive index of water is the lowest as compared with a projector lens (refractive index of a synthetic quartz is 1.5) and a resist film (refractive index of a conventional methacrylate is 1.7), and thus NA of the projector lens has been determined by a refractive index of water. Recently, a highly transparent liquid having a refractive index of 1.65 is being developed. In this case, a refractive index of a projector lens made of a synthetic quartz is the lowest, and thus a material for a projector lens with a high refractive index needs to be developed. A refractive index of LUAG ($Lu_3Al_5O_{12}$) is equal to or more than 2, and thus it is expected as the most promising material, but has problems of a large double refraction and absorption. In addition, even though a projector lens material with a refractive index of 1.8 or more is developed, NA of 1.55 is the highest with a liquid having refractive index of 1.65, thereby with it, 35 nanometers may be resolved, but 32 nanometers not. To resolve 32 nanometers, a liquid with a refractive index of 1.8 or more and a resist and a protecting film with a refractive index of 1.8 or more are necessary. The biggest problem of a material with a refractive index of 1.8 or more lies in a liquid with a high refractive index, because an absorption and a refractive index are in a trade-off relationship, and accordingly a material for it has not been found yet. In case of an alkane compound, a bridged cyclic compound is preferable than a linear compound in order to increase a refractive index, but a cyclic compound has a problem that it cannot follow a high-speed scanning of a stage of an exposure instrument because of its high viscosity. In addition, if a liquid having a refractive index of 1.8 or more is developed, the minimum refractive index lies in a resist film, and therefore, a resist film with the refractive index of 1.8 or more is also needed.

Recently, a double patterning process, in which a pattern is formed by a first exposure and development, and a second pattern is formed exactly in the space of the first pattern by a second exposure, is drawing an attention (Proc. SPIE Vol. 5754, p. 1508 (2005)). Many processes are proposed as the double patterning method. For example, there is a method in which a photo resist pattern with a line-and-space interval of 1:3 is formed by a first exposure and development, an underlying hard mask is processed by a dry etching, an another hard mask film is formed on it by exposure and development of the photo mask film to form a line pattern in a space formed by the first exposure, and then the hard mask is dry-etched to form a line-and-space pattern with a half width of the first pattern pitch. There is also another method in which a photo resist pattern with a line-and-space interval of 1:3 is formed by a first exposure and development, an underlying hard mask is processed by a dry etching, a photo resist film is coated on it, the second exposure is made on a remaining part of the hard mask, and then the hard mask is dry-etched. In both methods, hard masks are processed by two dry-etching steps.

In the former methods, the hard mask needs to be made twice. In the latter method, only one film of the hard mask is needed, but a trench pattern, in which a resolution is more difficult as compared with a line pattern, needs to be formed. In the latter method, a negative resist composition may be used for the formation of the trench pattern. With this method, a high-contrast light similar to that used to form a line by a positive pattern may be used. However, a negative resist composition has a lower dissolution contrast as compared with the positive resist composition, and thus, the negative resist composition gives a lower resolution as compared with the case in which the line is formed by the positive resist composition when the negative resist composition is used to form the same dimension of the trench pattern. In the latter method, it may be possible to apply a thermal flow method in which a wide trench pattern is formed by using a positive resist composition, and then the trench pattern is shrunk by heating a substrate, and a RELACS method in which a water-soluble film is coated on a trench pattern after development, and then the trench is shrunk by a thermal crosslink of a resist film surface. In these methods, however, there are problems of deterioration of a proximity bias and a low throughput due to further complicated processes.

In the both former and latter methods, two etchings are necessary in the substrate processing, thereby causing problems of a lower throughput as well as a deformation and a misalignment of the pattern due to the two etchings.

To perform the etching only once, there is a method in which a negative resist composition is used in the first exposure and a positive resist composition is used in the second exposure. There is another method in which a positive resist composition is used in the first exposure and a negative resist composition dissolved in a higher alcohol which has 4 or more carbon atoms and does not dissolve the positive resist composition is used in the second exposure. In these methods, the resolution is deteriorated due to the use of a negative resist composition having a low resolution.

Not to perform PEB (post exposure bake) and development between the first and the second exposure is the simplest method with a high throughput. In this case, after the first exposure, the second exposure is done on the exchanged mask having a displaced pattern, which is followed by PEB, development and dry etching. However, a photo energy of the first exposure is compensated by a photo energy of the second exposure, leading to a zero contrast, and thus a pattern is not formed. In this case, it is reported that, when an acid is generated in a nonlinear fashion by using an acid-generator which absorbs two photons or by using a contrast enhancement lithography (CEL), the energy compensation is relatively small even if an exposure is displaced by a half-pitch, and thus a pattern with a corresponding half-pitch displacement is formed even though the contrast is small (Jpn. J. App. Phys., Vol. 33 (1994), p. 6874-6877, Part 1, No. 12B, December 1994). In this case, if a mask is changed in every exposure, a throughput is remarkably deteriorated, and thus the second exposure is done after the first exposure is done with a certain collective amounts. However, in this case, a care is necessary for a dimensional change and the like caused by an acid-diffusion between the first and the second exposures.

The most critical problem in the double patterning is the overlay accuracy of the first and the second patterns. A magnitude of the position displacement corresponds to variation of the line dimension. Thus, for example, to form the 32-nanometers line with 10% accuracy, the overlay accuracy within 3.2 nanometers is necessary. Because the overlay accuracy of the present scanner is about 8 nanometers, a substantial improvement in accuracy is necessary.

Technologies to form a narrow space pattern and a small hole pattern include, not only a double patterning method, but also a afore-mentioned method using a negative resist, a thermal flow method, and a RELACS method. However, there have been problems in these methods; the resolution is low with the negative resist, and the thermal flow method and the RELACS method tend to easily vary in its dimension at a time of thermal shrink.

A method for reversing a positive pattern to a negative pattern has been known for long. For example, in Japanese Patent Laid-Open (kokai) No. H2-154266 and Japanese Patent Laid-Open (kokai) No. H6-27654, a naphthoquinone resist capable of doing a pattern reversal is proposed. A method to leave a FIB-cured part behind by an all-out exposure followed thereafter (Japanese Patent Laid-Open (kokai) No. S64-7525), and a method in which an indene carboxylic acid formed by exposing a light on a naphthoquinone diazide sensitizer is made alkali-insoluble by converting it to indene by a thermal treatment in the presence of a base, and then a positive-negative reversal is executed by an all-out exposure (Japanese Patent Laid-Open (kokai) No. H1-191423 and Japanese Patent Laid-Open (kokai) No. H1-92741), are proposed.

In the positive-negative reversal method by changing a developer, a method to obtain a negative pattern by developing hydroxystyrene partially protected by t-BOC (tert-butoxycarbonyl group) in an organic solvent or by a supercritical carbon dioxide are proposed.

A positive-negative reversal method using a silicon-containing material, in which a space part of a positive resist pattern is covered by a silicon-containing film, then the positive-negative reversal is made by removing a positive pattern part by using an oxygen gas etching to obtain a film pattern containing a silicon, thereby forming a fine hole pattern, is proposed (Japanese Patent Laid-Open (kokai) No. 2001-92154 and Japanese Patent Laid-Open (kokai) No. 2005-43420).

Miniaturization of a hole pattern is more difficult than a line pattern. To form fine holes by a conventional method, when a positive resist film is combined with a hole pattern mask and the pattern is formed by an under exposure, an exposure margin is extremely narrow. Accordingly, a method in which a large hole is formed and developed, and then shrunk the hole by a thermal flow method, a RELACS method, and the like, is proposed. However, a dimensional difference between after development and after shrink is large, and thus there is a problem of a decreased control precision with an increase of the dimensional shrink. A method in which a line pattern is formed by using a positive resist film in the X-direction by a dipole illumination, the resist pattern is cured, a resist composition is coated again on it, and then a line pattern in the Y-direction is exposed by a dipole illumination to form a hole pattern through a clearance of a latticed line pattern is proposed (Proc. SPIE Vol. 5377, p. 255 (2004)). Although a hole pattern with a large margin may be formed by combining X and Y lines by using a dipole illumination having a high contrast, etching of line patterns arranged one above the other with a high dimensional precision is difficult.

To make dimension of a hole small by this method, a wide line and a narrow space need to be formed. However, this is difficult also from a theoretical viewpoint, because a sufficient optical contrast to resolve a fine space cannot be obtained by using a positive resist.

SUMMARY OF THE INVENTION

To form an extraordinary fine pattern, when a negative resist film is used, there are problems in that a fine pattern is not formed because of a low resolution and that bridging takes place between spaces. In a thermal flow method and a RELACS method, there is a problem of a tendency to easily vary in its dimension in a thermal shrinkage.

On the other hand, the problem associated with the use of a negative resist film might be solved if a positive pattern having a high resolution could be reversed to a negative pattern after its formation.

As mentioned above, there are many reports with regard to the methods in which a positive pattern obtained from a positive resist having a high resolution is reversed to a negative pattern. In Japanese Patent Laid-Open (kokai) No. 2005-43420 in particular, the reference is also made to the case of an organic solvent type composition containing a silicon-embedded material for the positive-negative reversal. It teaches that, in the method before it involving a water-soluble silicon resin used in a material for formation of a reverse film, there is a risk of collapsing a positive pattern by an organic solvent used for coating if an organic solvent type composition of the material for formation of the reverse film is coated on a substrate formed of a positive pattern, but, when the resist pattern-forming resins are crosslinked for insolulization by curing with EB and the like in order to give an organic-solvent resistance, an organic solvent type composition of the material for formation of the reverse film may be used, and thus a selection of materials may be expanded widely. However, when this process is employed, a resist pattern cannot be removed by dissolution in the last stage of the reversal because a positive pattern is insolubilized and thus a removing method by dissolution cannot be used, leading to an inevitable use of a reactive dry etching method in view of the current technologies. And therefore, as the material for formation of the reverse film containing silicon, titanium, and the like, there is no choice but to select a material capable of performing dry etching. Furthermore, when a silicon type material is used for the embedding material, one additional process of reversing a pattern of a silicon-type material into a pattern of an organic material becomes also necessary in processing an inorganic substrate.

On the other hand, Japanese Patent Laid-Open (kokai) No. 2001-92154 teaches that removal of a positive pattern by wet etching is advantageous, and discloses that, as its method, a method in which a reverse film of an organic silicon is formed, without a special treatment, by applying an organic silicon in an organic solvent after a positive pattern is obtained. In this Document, a damage of a positive pattern by an intermixing is not mentioned. Although it teaches that a high polar solvent, used in preparation of an organic silicon composition, (including a hydroxyl compound such as propyleneglycol monomethyl ether and a lactate ester, esters such as propyleneglycol monomethyl ether acetate, ketones such as acetone, or the like) as well as a low polar solvent (such as toluene and cumene) may be used as well, but only toluene and cumene are used in Examples. However, to confirm this, attempts were made using a solvent containing a high polar solvent, for example, a monoalkyl ether of ethyleneglycol, diethyleneglycol, triethyleneglycol, and the like; a monoalkyl ether of propyleneglycol, dipropyleneglycol, butanediol, pentanediol, and the like, more specifically; such as butanediol monomethyl ether, propyleneglycol monomethyl ether, ethyleneglycol monomethyl ether, butanediol monoethyl ether, propyleneglycol monoethyl ether, ethyleneglycol monoethyl ether, butanediol monopropyl ether, propyleneglycol monopropyl ether, ethyleneglycol monopropyl ether, and propyleneglycol monoethyl ether acetate, as a solvent for a reverse film to apply onto a positive pattern not specially treated, then the pattern was dissolved by a coating solvent, and thus the positive-negative reversal with a required precision could not be performed. Accordingly, it was found that this method is actually applicable only for a reverse film material having a high solubility in a low polar solvent, and that such a composition containing a silicon having a silicon-oxygen bond (siloxane bond) which is partially soluble in an alkaline developer, and the like, cannot be used as a reverse film material.

In the method of Japanese Patent Laid-Open (kokai) No. 2001-92154, a photo resist surface comes out to the surface after a wet etching, but the photo resist is not dissolved by a wet etching, and thus a surface after the wet etching is smooth. Because of this, to find whether or not an image reversal is done well by a dry etching using an oxygen gas, the process is made longer by one step.

The present invention was made to improve the above situation and provide a patterning process by a positive-negative reversal performed by a wet etching using an alkaline wet etching in the process to finally obtain a negative pattern, wherein a positive pattern firstly obtained is rendered with a necessary resistance to an organic solvent used in a material for formation of a reverse film, and at the same time a solubility to an alkaline etching liquid is secured. And thus, a technology with which a material for formation of a reverse film of a silicon type is made applicable is provided. In addition, a technology with which a hydroxyl group-containing solvent and a highly polar solvent such as esters and ketones may also be used in preparation of a composition of a reverse material as mentioned above is provided. Furthermore, the present invention has an object to provide a method for forming, with a wide bridge margin, extremely fine space pattern and hole pattern having a high optical contrast, which cannot be obtained by this.

The present invention was made with an object to address the problems as mentioned above, and provides a resist patterning process using a positive-negative reversal, comprising at least a step in which a composition for formation of a chemically-amplified positive resist film containing a resin containing a repeating unit having an acid-labile group dissociable by an acid is applied on a processing substrate to form a resist film; a step of pattern-irradiating a high energy beam on the resist film, making an acid generated by the exposure to act on the acid-labile group, taking place a dissociation reaction in an exposed part of the acid-labile group of the resin, and forming a positive pattern by developing in an alkaline developer; a step of dissociating the acid-labile group in the positive resist pattern with a concurrent crosslinking in such a degree as not to lose its solubility in an alkaline wet-etching liquid in a positive-negative reversal step to be followed, thereby rendering a resistance with regard to an organic solvent used in a composition for formation of a reverse film used in a step of forming a reverse film to be followed; a step of forming a reverse film by using a composition for formation of a reverse film containing an organic silicon compound having a siloxane bond on the positive resist pattern rendered with the resistance; and a step of reversing the positive pattern to a negative pattern by dissolving the positive pattern rendered with the resistance into an alkaline wet-etching liquid for its removal.

Accordingly, after a positive pattern is formed, a chemically amplified positive resist in the positive resist pattern is partially crosslinked in such a degree as to render a resistance with regard to an organic solvent for a composition for formation of a reverse film used in a step of forming a reverse film to be followed, thereby enabling to dissolve in a alkaline wet-etching liquid used in the positive-negative reversal step to be followed. Thus, the reverse film is formed by using a composition for formation of a reverse film containing an organic silicon compound having a siloxane bond such as a conventional silicon type, and thus the pattern may be formed by the positive-negative reversal. With this, a fine pattern with a high precision may be formed at low cost.

In this case, a step, in which the acid-labile group in the positive resist pattern is dissociated with concurrent crosslinking in such a degree as not to lose its solubility into an alkaline wet-etching liquid used in a positive-negative reversal step thereby rendering a resistance with regard to an organic solvent used in a composition for formation of a reverse film used in a step of formation of a reverse film, is preferably performed in such a manner as to render a solubility in terms of an etching rate of 2 nanometers/second or faster when an etching is done in an aqueous tetramethyl ammonium hydroxide (TMAH, 2.38% by weight) as the alkaline wet-etching liquid, and a resistance with regard to the solvent, as expressed by a film loss, of 10 nanometers or less when contacted with the solvent for 30 second wherein the solvent is selected from ethyleneglycol, diethyleneglycol, triethyleneglycol, propyleneglycol, dipropyleneglycol, butanediol, pentanediol, propyleneglycol monomethyl ether acetate, cyclohexanone, propyleneglycol monomethyl ether, propyleneglycol monoethyl ether, propyleneglycol monopropyl ether, propyleneglycol monobutyl ether, and ethyl lactate, singly or as a mixture thereof.

As mentioned above, a positive pattern is more surely reversed to a negative pattern, thereby enabling to form a resist pattern with high precision, if the etching rate in an alkaline wet-etching liquid used in the positive-negative reversal step is secured, and the acid-labile group in the positive resist pattern is dissociated with a concurrent crosslinking in such a degree as to render a resistance with regard to an organic solvent used in a composition for formation of a reverse film.

In this case, the composition for formation of the reverse film may contain, in addition to the organic silicon compound, an oxide of an element belonging to Group III, Group IV, and Group V other than a silicon atom.

In addition, the organic silicon compound may be a silsesquioxane material in particular.

An organic silicon compound, in particular, a silsesquioxane material, has been used as a reverse film since the past. It has appropriate resistance and solubility with regard to an alkaline wet-etching liquid used in the positive-negative reversal step, and thus a fine pattern with high precision may be formed by the positive-negative reversal. In this case, a dissolution rate into the alkaline wet-etching liquid may be finely controlled by an oxide of the elements other than a silicon contained therein.

A rate of dissolution by the alkaline wet-etching liquid, the indicator of resistance and solubility, is preferably equal to or more than 0.02 nanometer/second and equal to or less than 2 nanometers/second, for example.

A step, in which the acid-labile group in the positive resist pattern of the present invention is dissociated with a concurrent crosslinking in such a degree as not to lose its solubility in the alkaline wet-etching liquid used in the positive-negative reversal step thereby rendering a resistance with regard to an organic solvent used in the composition for formation of the reverse film used in the step of formation of the reverse film, is performed by concurrent crosslinking and dissociation of the acid-labile group contained in the resist composition in the resist pattern by irradiating a light to the obtained positive pattern and/or heating it, thereby dissociating the acid-labile group contained in the resist composition in the resist pattern by an acid thereby generated and crosslinking concurrently.

Solubilization of the positive resist pattern obtained in the present invention into an alkaline liquid and partial crosslinking may be done by heating and/or irradiating a light to the positive resist pattern obtained as mentioned above. The method and the conditions for it may be arbitrarily selected depending on the positive resist composition used, the acid-generator blended, the kind of the acid-labile group, and the like.

This may be performed, for example, with using a composition for forming of a chemically amplified positive resist film for coating on a processing substrate which is added by a heat-inductive acid-generator, by heating the obtained positive resist pattern to generate an acid from the heat-inductive acid-generator and concurrently dissociate the acid-labile group in the positive resist by the acid thereby generated.

In this case, a heat-inductive acid-generator represented by the following general formula (P1a-2) may be used:

(P1a-2)

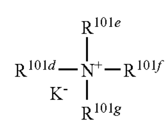

Wherein, $K^-$ represents a sulfonic acid whose at least one α-position is fluorinated, perfluoroalkyl imidic acid, or perfluoroalkyl methide acid. Each of $R^{101d}$, $R^{101e}$, $R^{101f}$, and $R^{101g}$ represents any of a hydrogen atom, a linear, a branched, or a cyclic alkyl group, an alkenyl group, an oxoalkyl group, an oxoalkenyl group having 1 to 12 carbon atoms, an aryl group having 6 to 20 carbon atoms, an aralkyl group and aryloxoalkyl group having 7 to 12 carbon atoms, wherein a part or all of hydrogen atoms of these groups may be substituted by an alkoxy group. $R^{101d}$ and $R^{101e}$, and $R^{101d}$, $R^{101e}$ and $R^{101f}$ may be bonded to form a ring together with a nitrogen atom to which these groups are bonded, and when forming the ring, $R^{101d}$ and $R^{101e}$, and $R^{101d}$, $R^{101e}$, and $R^{101f}$ represent an alkylene group having 3 to 10 carbon atoms or form a heteroaromatic ring containing the nitrogen atom in the formula in it.

The composition for forming of a chemically amplified positive resist film to be coated on a processing substrate, containing a repeating unit having a lactone ring or a 7-oxanorbornane ring and a repeating unit having an alicyclic acid-labile group dissociable by an acid, may be used, while dissociation of the acid-labile group in the positive resist and crosslinking may be performed concurrently by heating the obtained positive resist pattern as mentioned above.

In this case, the repeating unit having the 7-oxanorbornane ring represented by a repeating unit "a" as shown by the following general formula (1) may be used:

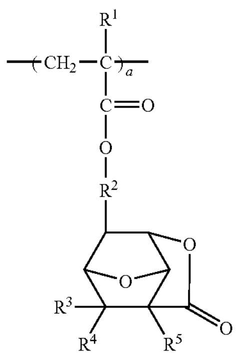

(1)

Wherein, $R^1$ represents a hydrogen atom or a methyl group; $R^2$ represents a single bond, or a linear, a branched, or a cyclic alkylene group having 1 to 6 carbon atoms, optionally containing an ether group or an ester group, while, if it is a linear, a branched, or a cyclic alkylene group having 1 to 6 carbon atoms, a carbon atom to which the ester group in the formula is bonded is a primary or a secondary; and each of $R^3$, $R^4$, and $R^5$ represents a hydrogen atom, or a linear, a branched, or a cyclic alkyl group having 1 to 6 carbon atoms. Here, number "a" is in the range of $0<a<1.0$.

Further, the repeating unit having an acid-labile group dissociable by an acid may be a repeating unit "b" as shown by the following general formula (3):

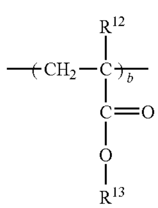

(3)

wherein, $R^{12}$ represents a hydrogen atom or a methyl group; and $R^{13}$ represents an acid-labile group.

In the present invention, a pattern-exposure of a high energy beam to the resist film may be done by an liquid immersion exposure method using water as the liquid.

The present invention may be preferably executed when a pattern-exposure of a high energy beam to the resist film is done by a liquid immersion exposure method using water as the liquid. With this, a high resolution may be attained.

In this case, it is preferable that the resist film is formed by applying a composition for forming of a chemically amplified positive resist film on a processing substrate to form a resist film, and on it a top coat is formed.

With this, a surface of the resist film is protected in a liquid immersion exposure step, and thus a pattern with a higher precision may be obtained.

In the patterning process of the present invention, a high energy beam is pattern-irradiated on the resist film to form a dot pattern in the step of forming the positive pattern, and then a hole pattern may be formed by reversing the positive dot pattern in the positive-negative reversal step.

In this case, the dot pattern is preferably formed as following. Namely, to form the dot pattern by a pattern-exposure of a high energy beam onto the resist film in the step of forming the positive pattern, an exposure is done onto a necessary part of the resist film in such a manner as to form a first line pattern on the resist film, then the resist film is exposed to form a second line pattern perpendicularly intersected with the first line pattern, and then the development using the alkaline developer as mentioned before is done after heat-treatment.

In the present invention, even a hole pattern which is difficult for miniaturization may be formed with a high precision, because a dot pattern is formed when the pattern-exposure of a high energy beam is done in the step of forming the positive pattern, and then a hole pattern is formed by reversing the positive dot pattern in the positive-negative reversal step.

In this case, it is preferable to process the substrate as following. Namely, a film containing 75% by weight or more carbons is formed on the processing substrate by a CVD method (a chemical vapor deposition method) or a spin coating method in advance in the step of forming the resist film, then the positive pattern is formed on the carbon film, and with this, the carbon film is processed by dry etching by using a pattern of the silicon-containing film having the reversed positive pattern as a mask, and then the processing substrate is processed by using the carbon film as a mask.

In the present invention, because the first pattern is formed on an organic film, there is no problem of a footing profile. Especially, by making the organic film formed of carbons with 75% by weight or more, a high etching resistance may be secured at the time of dry-etching of a processing substrate.

It is preferable that an anti-reflection film formed of a hydrocarbon material is further formed on the carbon film formed in advance on the processing substrate, and then the resist film is formed on the anti-reflection film.

As explained above, in the present invention, a notching phenomenon of a photo resist caused by a diffuse reflection in a photo lithography step may be avoided by forming an anti-reflection film formed of a hydrocarbon material further on a film containing 75% or more by weight carbons which is formed on the processing substrate by a CDV method or a spin coating method.

According to the present invention, a positive-negative reversal may be done in a simple process with high precision, because; by a partial crosslinking of the positive pattern, even if a reverse film is formed by applying a composition for formation of a reverse film containing a solvent having a hydroxyl group or a highly polar solvent such as esters and ketones on the positive pattern, the reverse film material may be embedded into a space of the positive resist pattern without damaging the positive resist pattern, and in addition, the positive pattern obtained from the positive resist may be removed by a wet etching. Further, it also becomes possible to use, for a reverse film, a material like a silicon-containing organic material especially having a silanol group, which is difficult to be dissolved unless it contains a highly polar solvent such as a solvent having a hydroxyl group, ketones, esters. When a reverse film having an appropriate alkali-dissolution rate is used as the reverse film, a step of removing the reverse film laminated on the positive pattern and a step of wet etching of the positive pattern may be done simultaneously, and thus the process may be greatly simplified.

When a positive pattern is reversed to a negative pattern by the method of the present invention, by using a first fine line pattern, a fine reversed space pattern having the same dimension may be formed. Accordingly, as to the trench pattern too, formation of a superfine trench pattern may be possible when a line pattern formable a finer pattern is formed by exposure, and then made into a trench pattern by the afore-mentioned pattern-reversal technology. Moreover, a hole pattern may also be formed by reversing a dot pattern. A hole pattern with a finer hole than a conventional hole may also be formed as following; after the line pattern is formed as the first pattern, the second line pattern perpendicularly intersected with the first pattern is exposed and developed to form a dot pattern, and thereafter a film having an appropriate alkali-dissolution rate is formed and then developed with a pattern reversal to form a hole pattern.

BRIEF DESCRIPTION OF THE DRAWINGS

FIG. 1(A) A state of a positive resist film formed on a substrate having a processing film via an underlying film, FIG. 1(B) A state of a positive pattern formed by exposure and development, FIG. 1(C) A state being deprotected and crosslinked by an acid and heat, FIG. 1(D) A state being coated by a reverse pattern film FIG. 1(E) A state of a reversed positive-negative pattern formed by wet etching of a reverse pattern film, FIGS. 1(F) and (G) A state of a substrate's processing film after etched by using a positive-negative reverse pattern;

DETAILED DESCRIPTION OF THE INVENTION

Figure 1:
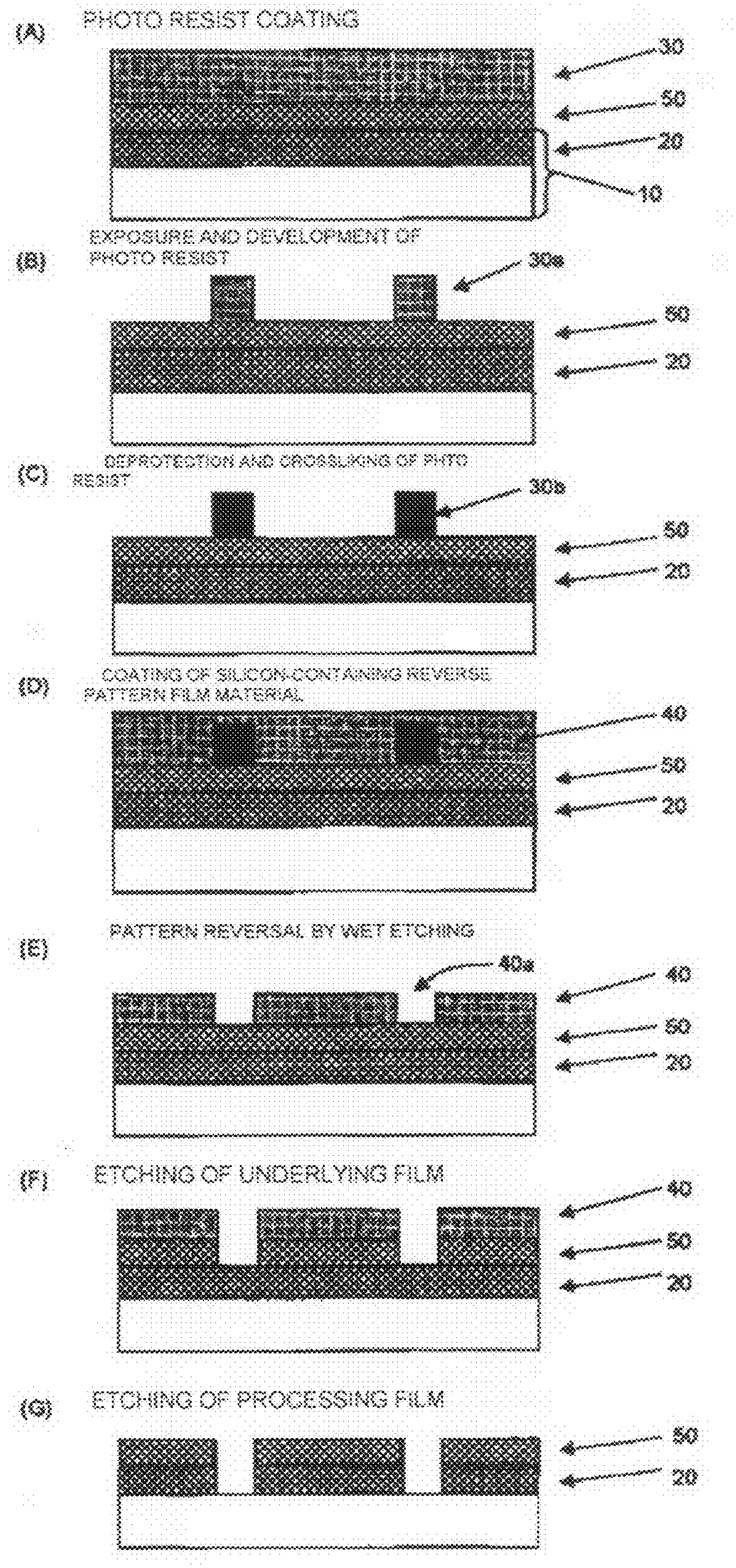
FIG. 1 is a flow diagram explaining the pattern formation method of the present invention.

Inventors of the present invention carried out investigation on the resist patterning process with high precision by reversing a positive pattern to a negative pattern. And as a result, it was found that, by a partial crosslinking of a resin of a chemically amplified positive resist composition in a positive resist pattern, crosslinking may be done in such a degree as to render a necessary resistance with regard to an organic solvent used in a composition for formation of a reverse film thereby enabling it to dissolve into an alkaline wet-etching liquid. It was found further that, when the afore-mentioned operation is incorporated into the process for the negative patterning process by the positive-negative reversal, a material for formation of a reverse film using a conventional silicon-resin type material may be used for the reverse film material. Based on these findings, the present invention was accomplished.

As mentioned before, some attempts to form a pattern, which is optically disadvantageous if it is used as it is, by a positive-negative reversal have already been made by using a positive resist having a high resolution. One problem to be solved in its development was, when a reverse film is formed on a positive pattern once formed, how to form a new film without collapsing the obtained pattern. To solve this problem, it was attempted to use a water-soluble composition whose positive pattern is not soluble as a composition for formation of a reverse film. However, in this case, the material for formation of a reverse film is extremely limited to be water-soluble so that it was proposed, in Japanese Patent Laid-Open (kokai) No. 2005-43420, that a positive pattern is crosslinked by an EB-cure to insolubilize it in a solvent or in a developer, which is followed by formation of a reverse film. Another problem to be solved was how to remove the positive pattern selectively from the reverse film, wherein the selective removal was made by using a SOG, which is resistant to dry etching by an oxygen gas, an organic silicon material, and the like, used for the reverse film, as Japanese Patent Laid-Open (kokai) No. 2005-43420 teaches.

On the other hand, that the resist film such as shown in Japanese Patent Laid-Open (kokai) No. 2005-43420 is crosslinked and insolubilized by exposure of a high energy beam has been known as a phenomenon which takes place when a too-high exposure energy is irradiated on a chemically amplified resist film in an early development stage of the chemically amplified resist film. Namely, it is the phenomena in which when a polyhydroxystyrene unit, which is a component of a chemically-amplified type resist polymer, is irradiated with a high energy light, a hydrogen radical of a phenyl-bonded methine group is liberated, thereby leading to an instant formation of crosslinkages among resins by the liberated radicals, resulted in insolubilization of the resin. It is assumed that the radical formation causing this crosslinkage takes place not only in a styrene skeleton but also in a polyacrylic acid skeleton. A similar crosslinkage formation is assumed to take place in a methylene group bonded to a hetero atom. However, inventors of the present invention observed that insolubilization of the resist film by this crosslinkage formation does not take place all at once when a light exposure is made in stepwise, but takes place via a point where a dissolution rate is slightly decreased. Inventors of present invention took notice this phenomenon and considered its application. In other word, it was assumed that the initial decrease in the dissolution rate observed was due to the formation of an intramolecular or an intermolecular crosslinkage to a limited degree, and that, if the crosslinkage was formed in a limited degree, there might be a possibility to obtain a resistance to an organic solvent like a coating solvent without completely losing its dissolution rate into an alkaline developer. Accordingly, they investigated formation of a pattern having a resistant to an organic solvent like the one generally for a composition for formation of a reverse film and yet not completely losing its dissolution rate into an alkaline developer, and found that the formation of a pattern like this was possible.

As mentioned above, when the method, in which the resistance to an organic solvent is given to the positive pattern without completely losing its dissolution property into an alkaline liquid, is incorporated into the method for the resist patterning process using a positive-negative reversal, a following method of the present invention for patterning process by reversing a positive pattern to a negative pattern becomes possible. Namely, by a usually used method for forming a positive pattern, a resist film is formed by pre-baking after coated with a chemically amplified positive resist composition. Then, after a pattern-exposure is made, an exposed area is made soluble into an alkaline developer by dissociating an acid-labile group of a resin in an exposed area by a post-exposure heating. A development in the alkaline developer is followed to obtain a positive pattern. Thereafter, a resistant to an organic solvent used in a composition for formation of a reverse film is given to the positive pattern obtained without completely losing its dissolution rate into the alkaline developer. Then, a composition for formation of a reverse film containing the organic solvent as mentioned above is applied on a substrate formed of the positive pattern with the obtained resistance to an organic solvent used in a composition for formation of a reverse film. In this step, the reverse film is applied in such a manner to fill clearances completely, but also there may be the case where the film is formed above the positive pattern to a certain degree by lamination. In such a case, as Japanese Patent Laid-Open (kokai) No. 2001-92154 and Japanese Patent Laid-Open (kokai) No. 2005-43420 teach, if the positive pattern is removed by an alkaline wet-etching liquid via a step of removing the reverse film laminated over the pattern after formation of the reverse film, only the reverse film of the part not having the positive pattern remains, thereby obtaining the reverse film with the reversed positive-negative pattern. Here, removal of the reverse film formed above the positive pattern may be concomitantly made in the alkaline wet-etching liquid because the reverse film has a moderate solubility. The alkaline wet-etching liquid is for dissolution of the positive pattern, and its concentration may be adjusted arbitrarily, but a developer to obtain the positive pattern may be used.

If the dissolution rate of a silicon-containing film is too fast in a developer of tetramethyl ammonium hydroxide (TMAH) with the concentration of 2.38% by weight, which is generally used, a developer diluted by water may be used. Because a silicon compound having many silanols has a high solubility in an alkaline liquid, there is a case in which a diluted solution has a more suitable solubility. In this case, it needs to be in such concentration as to dissolve the positive resist pattern after heat-treatment at a high temperature. The positive resist contains a carboxyl group by deprotection of the acid-labile group, and thus it is soluble in the developer diluted even by about 1000-folds. Accordingly, the concentration of a TMAH developer may be 0.00238 to 5%.

In a method of the present invention for a resist patterning process by using a positive-negative reversal, a composition for formation of a reverse film containing an organic silicon compound containing a siloxane bond may be used as the composition for formation of the reverse film, in addition, to the organic silicon compound, an oxide of an element belonging to Group III, Group IV, and Group V other than a silicon atom may also be used.

Although a three-filmed process formed of a silicon-containing organic material as a resist underlying film for a photo lithography and a hydrocarbon with the carbon density of 80% by weight or more as an underlying film of the resist underlying film has been studied, there is a problem of a footing profile of the photo resist pattern after development, when a silicon content is increased or a photo resist is applied on an intermediate film comprising an organic material containing an oxide of at least one element belonging to Group III, Group IV, and Group V, other than a silicon atom.

In the case of the present invention, there is no problem of a footing profile because the first pattern may be formed on an organic film. Accordingly, a reverse film having an increased silicon content or containing an organic material containing an oxide of at least one element belonging to Group III, Group IV, and Group V, other than silicon atom may be used.

In addition, when a reverse film of slightly soluble in an alkaline liquid, as will be mentioned later, is used, the reverse film which is laminated over the positive resist pattern as mentioned above may be removed by an alkaline wet-etching liquid without using a conventional method involving a dry etching or an organic solvent. Accordingly, when this method is used, the reverse film laminated over the resist pattern and the resist pattern are removed simultaneously in a single operation, and thus the process is greatly shortened as a whole.

In the formation of the resist film of the present invention, a film containing carbons of 75% by weight or more is formed on the processing substrate by a CVD method (a chemical vapor deposition method) or a spin coating method in advance, thereby forming the positive pattern on the carbon film. With this, it is possible to process the carbon film by dry etching by using a pattern of the silicon-containing film having the reversed positive pattern as the mask, and then process the substrate by using the carbon film as the mask, and thus the first pattern may be formed on the organic film, leading to no problem of a footing profile. Especially to make the carbon content of the organic film 75% by weight or more, a high etching resistance may be secured in the step of dry etching of the processing substrate.

In addition, in the present invention, the resist film may be formed on an anti-reflection film after the anti-reflection film formed of a hydrocarbon material is further formed on a carbon film formed in advance on the processing substrate. Because of this, a notching phenomenon of a photo resist caused by a diffuse reflection in a photo lithography step may be avoided.

The key point of the present invention lies in that a resistance to an organic solvent used in a composition for formation of a reverse film is given to the positive pattern without completely losing its solubility into an alkaline wet-etching liquid by a partial crosslinking in order to prevent deformation or collapse due to dissolution of the positive pattern during formation of the reverse film by coating from occurring. A partial crosslinking like this may be done by irradiating a high energy beam with an appropriate energy amount, as mentioned above. However, inventors of the present invention carried out the investigation on other crosslinking formation methods, because control of the formation of crosslinking by exposure of a high energy beam in a photo beam and the like is often difficult because of problems of allowance of an exposure energy amount and an evenness of the exposure depending on a kind of the resist. As a result, the inventors of the present invention found that a limited crosslinking in such a degree as to render the resistance with regard to an organic solvent may be possible by heating, and an intended control may be possible relatively easily especially by heating in the presence of an acid if the positive pattern obtained from a resist composition containing a unit such as a lactone skeleton which is crosslinkable under a severe reaction condition is used.

In a step of partial crosslinking of a resist in the positive pattern with heat to render a resistance with regard to an organic solvent used in a composition for formation of a reverse film without completely losing its solubility into an alkaline wet-etching liquid, a method of the present invention of resist patterning process may be easily used by designing target conditions as shown below although the amount of an acid to be generated and an optimum temperature are different depending on materials used.

Namely, a heat is given, after a relevant amount of a high energy beam of light, EB, and the like is irradiated, or without irradiated, to a resist film to generate an acid, with which an acid-labile group of a resin is dissociated to render a solubility into an alkaline liquid. With this, a partial crosslinking takes place simultaneously by a light and/or a heat, thereby rendering a resistance with regard to an organic solvent used in a composition for formation of a reverse film. The target solubility to be rendered is preferably 2 or more nanometers/second as the etching rate in an aqueous liquid of 2.38% by weight of tetramethyl ammonium hydroxide (TMAH), which is generally used in an alkaline development. Further, when the resistance to an organic solvent used in a composition for formation of a reverse film is rendered in such a degree as to show a film loss of 10 nanometers or less when a resist pattern after crosslinking is contacted with a solvent used in a composition for formation of a reverse film for 30 seconds and preferably for 60 seconds, there is no risk of occurring a problem to not obtain a negatively-reversed pattern with a damaged form which occurs when the reverse film as mentioned above is applied. To find this treatment conditions, when a bulk film obtained by a resist-coating, a pre-baking, and a post-exposure heating, with skipping only a pattern-exposure in a series of steps as mentioned above is treated by candidate steps rendering a resistance with regard to an organic solvent used in a composition for formation of a reverse film without losing its solubility into the alkaline wet-etching liquid, the two dissolution rates may be easily obtained. From the results obtained, specific conditions of the present invention may be determined easily by experiments by controlling materials to be used and conditions for crosslinking.

An organic solvent effectively used in the present invention in a composition for formation of a reverse film is those which can dissolve an organic polymer having a group like an adhesive group well and is excellent in coating properties. Examples of them include a monoalkyl ether of ethyleneglycol, diethyleneglycol, triethyleneglycol, and the like, and a monoalkyl ether of propyleneglycol, dipropyleneglycol, butanediol, pentanediol, and the like. Specifically a solvent selected from butanediol monomethyl ether, propyleneglycol monomethyl ether, ethyleneglycol monomethyl ether, butanediol monoethyl ether, propyleneglycol monoethyl ether, ethyleneglycol monoethyl ether, butanediol monopropyl ether, propyleneglycol monopropyl ether, ethyleneglycol monopropyl ether, propyleneglycol monomethyl ether acetate, cyclohexanone, propyleneglycol monomethyl ether, propyleneglycol monoethyl ether, propyleneglycol monopropyl ether, propyleneglycol monobutyl ether, and ethyl lactate may be used singly or as a mixture of two or more kinds thereof. The criterion giving a resistance to the organic solvent used in composition for formation of a reverse film is determined by the film loss; if the crosslinking treatment gives the solvent-resistance of less than about 10 nanometers or less when it is contacted with a solvent singly or a mixed solvent of two or more kinds for 30 seconds, and preferably for 60 seconds, a solvent thereof may be used universally, and thus is particularly preferable.

Temperature of the heat-treatment as mentioned above may be equal to or slightly less than the temperature of a post-exposure heating at the time of obtaining a positive pattern, because the thermal reaction is only for decomposition of the acid-labile group when a partial crosslinking is done with a high energy beam. However, when a high energy beam is not used or used mainly for generating an acid, namely, about the same amount of energy as the pattern exposure in the preceding step is used, or in other word, the crosslink is formed mainly by heat, it is preferable to set a higher temperature than a temperature in pre-baking to form a resist film and a temperature in the post-exposure heating. Use of a material whose heating temperature is set higher than the preceding step does not cause deterioration itself of the resolution of the positive resist.

This positive-negative reversing method may be used advantageously in the following case. Namely, the positive pattern may possibly form a finer pattern by over exposure. Accordingly, although formation of a lone space (a trench pattern) with less than an exposure limit is technically difficult, formation of an extremely narrow trench-pattern may be possible if a narrow pattern with less than a usual exposure limit is formed by using an over exposure, and then this is reversed by the method of the present invention.

Further, formation of a fine hole pattern is technically more difficult than the trench pattern, but formation of the holes with extremely small dimension may be possible if a dot pattern is formed by an over exposure, and then this is reversed by the method of the present invention.

The present invention will be explained in more detail with referring to a case in which a material for a reverse film having a slight solubility in an alkaline wet-etching liquid (possibly it may be the same as an alkaline developer used in the development of a resist pattern. Hereinafter it may be referred to as the alkaline developer) as a typical embodiment of the present invention.

The most preferable embodiment of the patterning process of the present invention is shown by a flow diagram of FIG. 1. A positive resist composition containing a polymer having a repeating unit containing an alicyclic structure having an acid-labile group dissociable by an acid, and having a dissolution rate of 2 nanometers/second or more (the rate of its crosslinked product obtained by concurrent dissociation of the acid-labile group and crosslink into the alkaline developer) is applied to coat onto a substrate 10 to form a resist film 30 (FIG. 1(A)), and then a necessary part of the positive film 30 is exposed with a high energy beam after a heat-treatment and then a positive resist pattern 30*a* is formed by developing the resist film by using the alkaline-developer after the heat-treatment (FIG. 1(B)). Then, an acid is generated in the positive resist pattern, and the system is heated to dissociate the acid-labile group of the polymer in the resist pattern and crosslink the polymer simultaneously (FIG. 1(C)). Thereafter, a reverse film 40 is formed in such a way as to cover over it on the substrate by using a composition for formation of a reverse film containing an organic silicon compound having a siloxane bond with a dissolution rate into the alkaline developer being faster than 0.02 nanometer/second and slower than 2 nanometers/second (FIG. 1(D)), and then a surface of this film is dissolved by the alkaline developer and simultaneously the positive resist pattern is removed by dissolution to form a negative pattern 40*a* obtained by reversing the resist pattern to the reverse film (FIG. 1(E)). By using this negative resist pattern, a pattern may be formed on a substrate (FIG. 1(F) and FIG. 1(G)).

In this case, a dot pattern is formed as a positive resist pattern, and a hole pattern may be formed by reversing this.

As the polymer used as a base resin of the chemically amplified positive resist composition used in the patterning process of the embodiment, a compound containing a repeating unit having a lactone ring, particularly a repeating unit having a 7-oxanorbornane ring, and preferably a repeating unit "a" represented by the following general formula (1) may be advantageously used. This unit is for an adhesive unit, and thus the present invention may be suitably applicable even if a base resin does not have a further additional component.

(1)

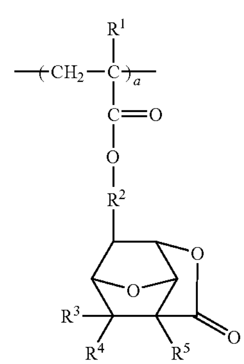

Wherein, $R^1$ represents a hydrogen atom or a methyl group; $R^2$ represents a single bond, or a linear, a branched, or a cyclic alkylene group having 1 to 6 carbon atoms, optionally containing an ether group or an ester group, while, if it is a linear, a branched, or a cyclic alkylene group having 1 to 6 carbon atoms, a carbon atom to which the ester group in the formula is bonded is a primary or a secondary; and each of $R^3$, $R^4$, and $R^5$ represents a hydrogen atom, or a linear, a branched, or a cyclic alkyl group having 1 to 6 carbon atoms. Here, number "a" is in the range of $0<a<1.0$.

Here, the alkylene group having 1 to 6 carbon atoms may be exemplified by a methylene group, an ethylene group, a n-propylene group, an isopropylene group, a n-butylene group, an isobutylene group, a sec-butylene group, a n-pentylene group, an isopentylene group, a cyclopentylene group, a n-hexylene group, a cyclohexylene group, and the like.

The alkyl group having 1 to 6 carbon atoms may be exemplified by a methyl group, an ethyl group, a n-propyl group, an isopropyl group, a n-butyl group, an isobutyl group, a sec-butyl group, a n-pentyl group, an isopentyl group, a cyclopentyl group, a n-hexyl group, a cyclohexyl group, and the like.

A monomer to obtain a repeating unit "a" represented by the general formula (1) may be Ma shown in the following general formula (2), and specifically exemplified by the followings. Here, $R^1$ to $R^5$ represent the same meanings as before.

(2)

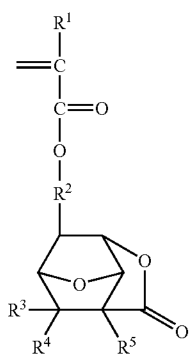

Ma

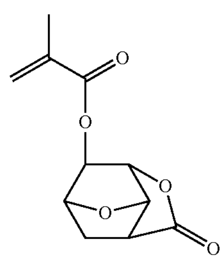

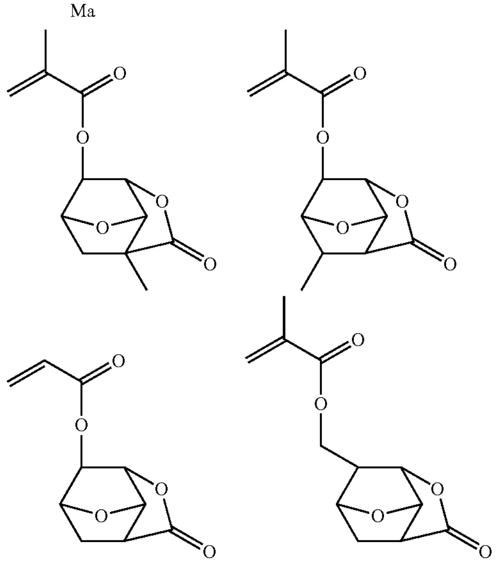

-continued

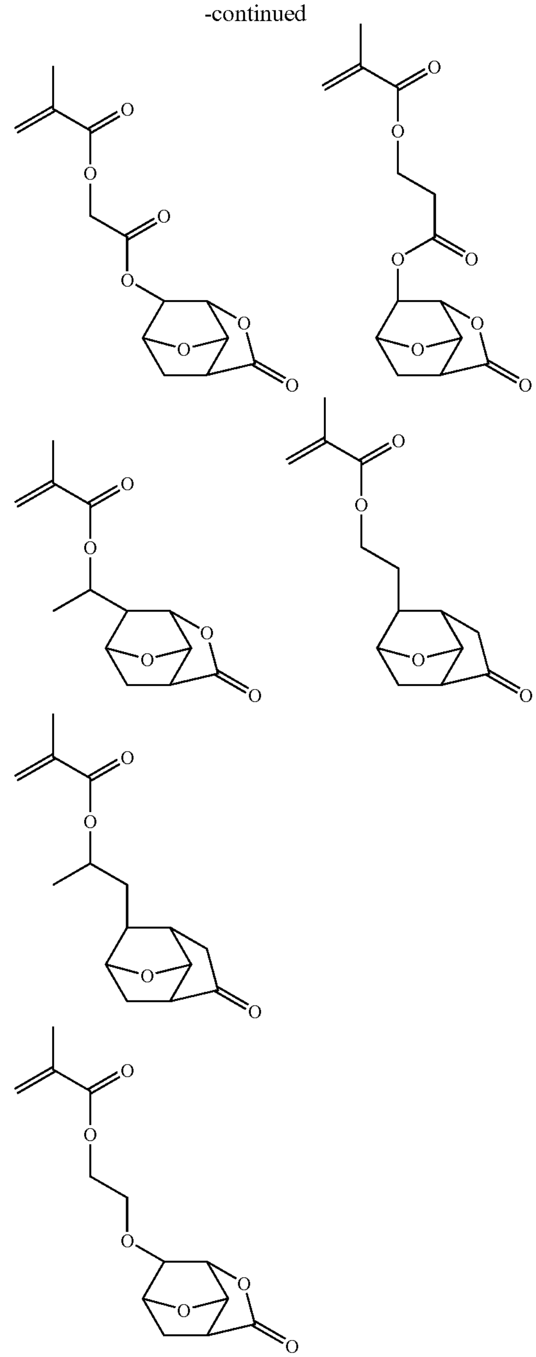

In the step of the embodiment, after formation of the first positive pattern by exposure and development, deprotection of the acid-labile group is done concurrently with crosslinking by an acid and a heat, and thereafter, a film having an appropriate alkaline-solubility (a reverse film) is applied onto it, and then an alkaline wet-etching (development) is done.

The first positive pattern is made alkaline-soluble by deprotection of the acid-labile group and not soluble into a solvent (a solvent used in a material for formation of a reverse film) by crosslinking of a 7-oxanorbornene ring. Accordingly, when a solution for a reverse pattern film obtained by dissolving a reverse film material into an organic solvent is applied on the first positive pattern, the first positive pattern is not mixed with the material for a reverse pattern film.

Then, when the reverse film is dissolved to the point of the first pattern surface by an alkaline wet-etching liquid, dissolution of the first positive pattern starts, resulting in the reversal of the pattern because the dissolution rate of the positive pattern is faster.

When a polymer having a repeating unit containing a oxirane or an oxetane is used as a resist base polymer, the rates of ring-opening of an oxirane ring and a oxetane ring by an acid are very fast, and thus the crosslinking takes place at a temperature of such a process as a post-exposure bake (PEB), say at 90 to 130° C., thereby leading to insolubilization of it in an alkaline liquid, and thus it does not function as a positive resist composition of the present invention. On the other hand, a ring-opening reaction of a 1,4-epoxy bond of the 7-oxanorobornane ring by an acid is sluggish as compared with an oxirane ring and an oxetane ring, and thus, a crosslinking reaction does not take place at the temperature range of the PEB heating. A repeating unit having the 7-oxanorbornane ring is acid-stable until development and thereby exerts an adhesion property as a hydrophilic group and a function of an improved solubility in an alkaline liquid. However, the ring-opening reaction of the 1,4-epoxy bond of the 7-oxanorbornane ring as well as a crosslinking reaction take place by action of the acid, which is generated by a flood exposure or a heating, and by heating above 170° C. after the development; and with it, insolubilization into the solvent and deprotection of the acid-labile group by an acid and a heat take place simultaneously, and thus a solubility into an alkaline liquid is increased. In order to generate an acid, a heat-inductive acid-generator may be added into a resist composition, or a UV beam with a wavelength of less than nanometers may be irradiated to the entire pattern.

As a base resin used in the positive resist composition in the patterning process of the present invention, a polymer having a crosslinkable repeating unit "a" represented by the general formula (1) and a repeating unit "b" having an acid-labile group represented by the following general formula (3) is preferably used.

(3)

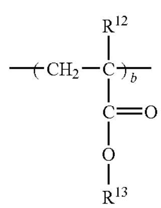

Wherein, $R^{12}$ represents a hydrogen atom or a methyl group; and $R^{13}$ represents an acid-labile group, and $0<b\leqq 0.8$.

Here, a monomer Mb to obtain a repeating unit "b" represented by the general formula (3) is shown by the following general formula:

Mb

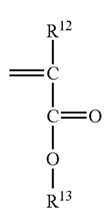

wherein, $R^{12}$ and $R^{13}$ represent the same meanings as before.

In the general formula (3), the acid-labile group represented by $R^{13}$ may be selected from many, but groups represented by the following general formulae (AL-10) and (Al-11), a tertiary alkyl group represented by the general formula (AL-12), an oxoalkyl group having 4 to 20 carbon atoms, and the like may be exemplified.

(AL-10)

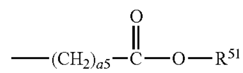

(AL-11)

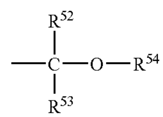

(AL-12)

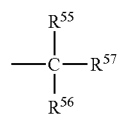

In the formulae (AL-10) and (AL-11), each of $R^{51}$ and $R^{54}$ represents a monovalent hydrocarbon group such as a linear, a branched, or a cyclic alkyl group having 1 to 40 carbon atoms, in particular 1 to 20 carbon atoms, optionally containing a hetero atom such as an oxygen, a sulfur, a nitrogen, and a fluorine; each of $R^{52}$ and $R^{53}$ represents a hydrogen atom or a monovalent hydrocarbon group such as a linear, a branched, or a cyclic alkyl group having 1 to 20 carbon atoms, optionally containing a hetero atom such as an oxygen, a sulfur, a nitrogen, and a fluorine; and a5 represents an integer of 0 to 10. $R^{52}$ and $R^{53}$, $R^{52}$ and $R^{54}$, and $R^{53}$ and $R^{54}$ may be bonded with each other, together with a carbon atom or a carbon atom and an oxygen atom to which these groups are bonded to form a ring having 3 to 20 carbon atoms, in particular 4 to 16 carbon atoms, and in particular an aliphatic ring.

Each of $R^{55}$, $R^{56}$, and $R^{57}$ represents a monovalent hydrocarbon group such as a linear, a branched, or a cyclic alkyl group having 1 to 20 carbon atoms, optionally containing a hetero atom such as an oxygen, a sulfur, a nitrogen, and a fluorine. $R^{55}$ and $R^{56}$, $R^{55}$ and $R^{57}$, and $R^{56}$ and $R^{57}$ may be bonded with each other, together with a carbon atom to which these groups are bonded to form a ring having 3 to 20 carbon atoms, in particular 4 to 16 carbon atoms, and in particular an aliphatic ring.

Specific examples of the compound represented by the formula (AL-10) include a tert-butoxy carbonyl group, a tert-butoxy carbonyl methyl group, a tert-amyloxy carbonyl group, a tert-amyloxy carbonyl methyl group, a 1-ethoxyethoxy carbonyl methyl group, a 2-tetrahydropyranyloxy carbonyl methyl group, and a 2-tetrahydrofuranyloxy carbonyl methyl group. Further, there may also be mentioned substituent groups represented by the following formulae (AL-10)-1 to (AL-10)-10.

(AL-10)-1

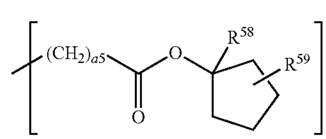

-continued (AL-10)-2

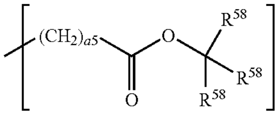

(AL-10)-3

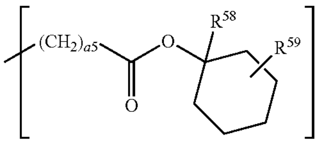

(AL-10)-4

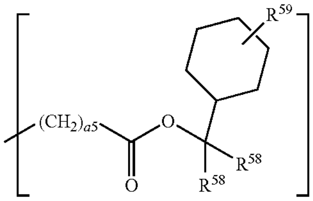

(AL-10)-5

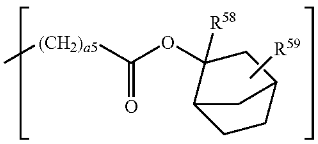

(AL-10)-6

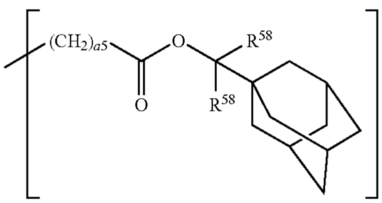

(AL-10)-7

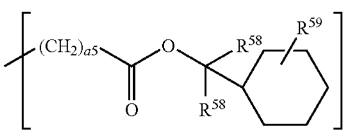

(AL-10)-8

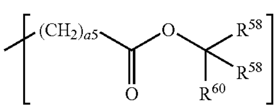

(AL-10)-9

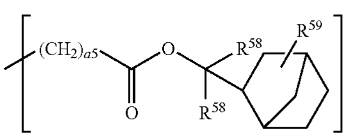

(AL-10)-10

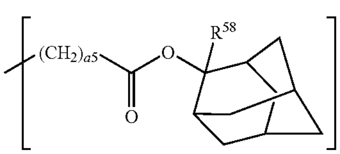

In the formulae (AL-10)-1 to (AL-10)-10, $R^{58}$ represents the same or different linear, branched, or cyclic alkyl group having 1 to 8 carbon atoms, an aryl group having 6 to 20 carbon atoms, and an aralkyl group having 7 to 20 carbon atoms; $R^{59}$ represents a hydrogen atom, or a linear, a branched, or a cyclic alkyl group having 1 to 20 carbon atoms; and $R^{60}$ represents an aryl group having 6 to 20 carbon atoms or an aralkyl group having 7 to 20 carbon atoms.

The acetal compound represented by the general formula (AL-11) may be exemplified by the following general formulae (AL-1l)-1 to (AL-1l)-34.

(AL-11)-1

$—CH_2—O—CH_3$ (AL-11)-2

$—CH_2—O—CH_2—CH_3$ (AL-11)-3

$—CH_2—O—(CH_2)_2—CH_3$ (AL-11)-4

$—CH_2—O—(CH_2)_3—CH_3$ (AL-11)-5

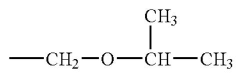

(AL-11)-6

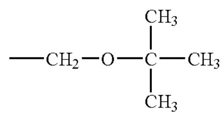

(AL-11)-7

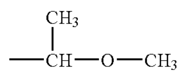

(AL-11)-8

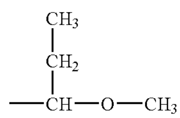

(AL-11)-9

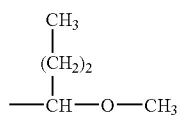

(AL-11)-10

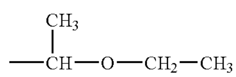

(AL-11)-11

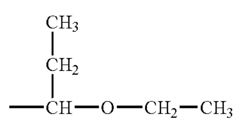

(AL-11)-12

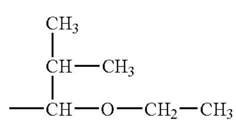

(AL-11)-13

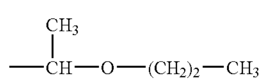

(AL-11)-14

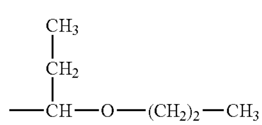

(AL-11)-15

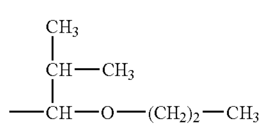

(AL-11)-16

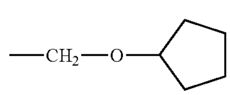

-continued (AL-11)-17

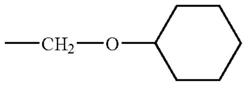

(AL-11)-18

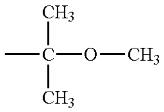

(AL-11)-19

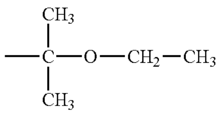

(AL-11)-20

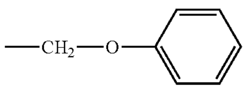

(AL-11)-21

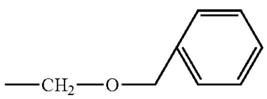

(AL-11)-22

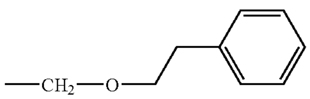

(AL-11)-23

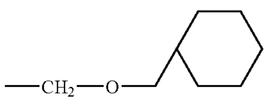

(AL-11)-24

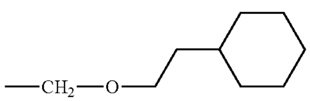

(AL-11)-25

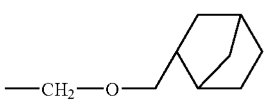

(AL-11)-26

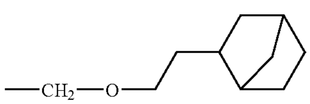

(AL-11)-27

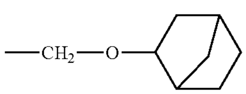

(AL-11)-28

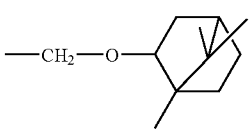

(AL-11)-29

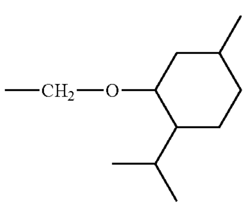

(AL-11)-30

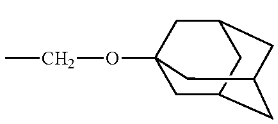

-continued (AL-11)-31

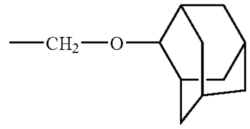

(AL-11)-32

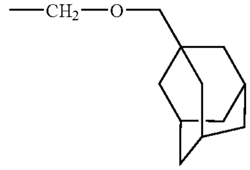

(AL-11)-33

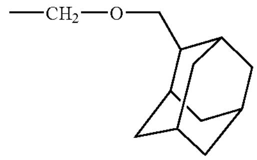

(AL-11)-34

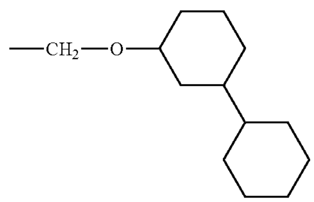

In addition, a base resin may be crosslinked intramolecularly or intermolecularly by the acid-labile group represented by the following general formula (AL-11a) or (AL-11b).

(AL-11a)

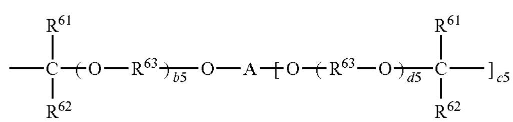

(AL-11b)

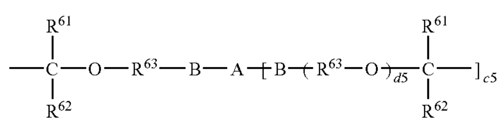

In the above formulae, each of $R^{61}$ and $R^{62}$ represents a hydrogen atom, or a linear, a branched, or a cyclic alkyl group having 1 to 8 carbon atoms. Here, $R^{61}$ and $R^{62}$ may be bonded to form a ring together with the carbon atoms to which they are bonded. When forming the ring, each of $R^{61}$ and $R^{62}$ represents a linear or a branched alkylene group having 1 to 8 carbon atoms; $R^{63}$ represents a linear, a branched, or a cyclic alkylene group having 1 to 10 carbon atoms; and each of b5 and d5 represents 0 or an integer of 1 to 10, preferably 0 or an integer of 1 to 5, and c5 represents an integer of 1 to 7. Further, A represents an aliphatic or an alicyclic saturated hydrocarbon group with (c5+1) valency having 1 to 50 carbon atoms, an aromatic hydrocarbon group, or a heterocyclic group.

These groups may be intervened by a hetero atom such as O, S, and N, or a part of the hydrogen atoms attached to their carbon atom may be substituted by a hydroxyl group, a carboxyl group, a carbonyl group, or a fluorine atom. Also, B represents —CO—O—, —NHCO—O—, or —NH-CONH—.

In this case, A is preferably a linear, a branched, or a cyclic alkylene group with a valency of 2 to 4 having 1 to 20 carbon atoms, an alkane triyl group, an alkane tetrayl group, and an arylene group having 6 to 30 carbon atoms. These groups may be intervened by a hetero atom such as O, S, and N, and a part of the hydrogen atoms attached to their carbon atom may be substituted by a hydroxyl group, a carboxyl group, an acyl group, or a halogen atom. Here, c5 represents preferably an integer of 1 to 3.

The crosslinkable acetal groups represented by the general formula (AL-11a) or (AL-11b) may be specifically exemplified by the groups shown by the following formulae (AL-11)-35 to (AL-11)-42.

(AL-11)-35

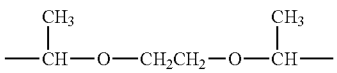

(AL-11)-36

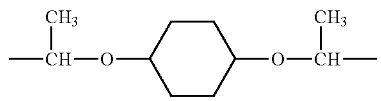

(AL-11)-37

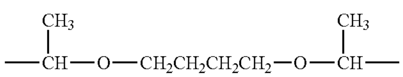

(AL-11)-38

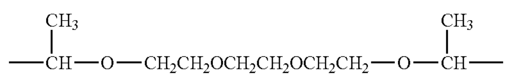

(AL-11)-39

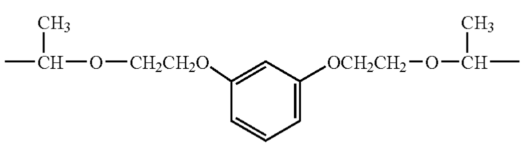

(AL-11)-40

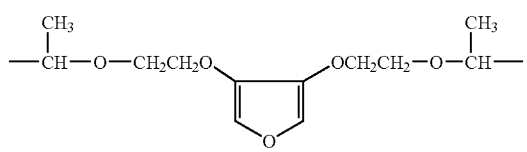

(AL-11)-41

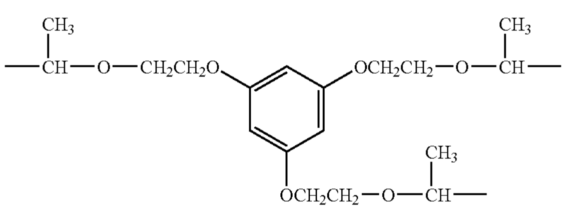

(AL-11)-42

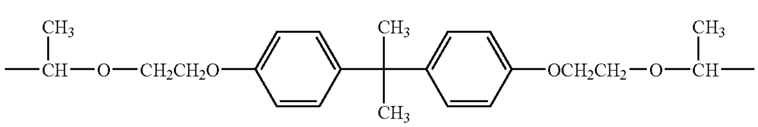

The tertiary alkyl group represented by the formula (AL-12) may be exemplified by a tert-butyl group, a triethyl carbyl group, a 1-ethylnorbonyl group, a 1-methylcyclohexyl group, a 1-ethylcyclopentyl group, a tert-amyl group, and the like, or groups represented by the following formulae (AL-12)-1 to (AL-12)-16.

(AL-12)-1

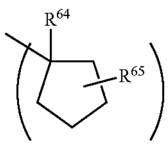

(AL-12)-2

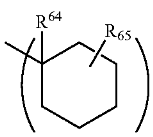

(AL-12)-3

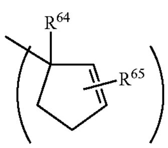

(AL-12)-4

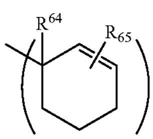

(AL-12)-5

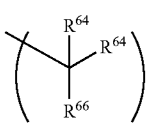

(AL-12)-6

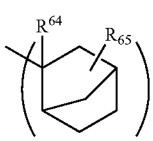

(AL-12)-7

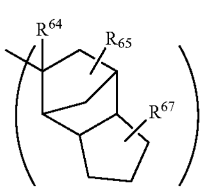

(AL-12)-8

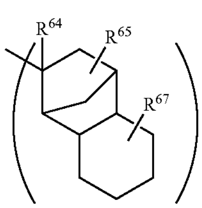

(AL-12)-9

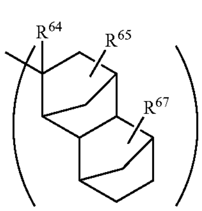

-continued (AL-12)-10

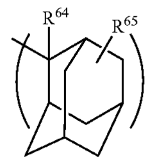

(AL-12)-11

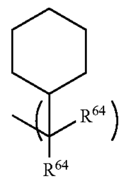

(AL-12)-12

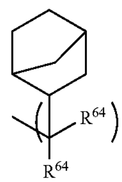

(AL-12)-13

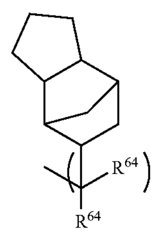

(AL-12)-14

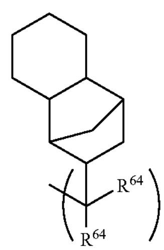

(AL-12)-15

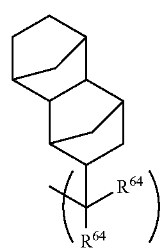

(AL-12)-16

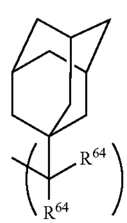

In the above formulae, $R^{64}$ represents the same or different linear, branched, or cyclic alkyl group having 1 to 8 carbon atoms, an aryl group having 6 to 20 carbon atoms, or an aralkyl group having 7 to 20 carbon atoms; each of $R^{65}$ and $R^{67}$ represents a hydrogen atom, or a linear, a branched, or a cyclic alkyl group having 1 to carbon atoms; and $R^{66}$ represents an aryl group having 6 to 20 carbon atoms, or an aralkyl group having 7 to 20 carbon atoms.

Further, as shown by the following formulae (AL-12)-17 and (AL-12)-18, a polymer may contain $R^{68}$ with the valency of 2 or more, including an alkylene group and an arylene group, by which a polymer may be crosslinked intramolecularly or intermolecularly. In the formulae (AL-12)-17 and (AL-12)-18, $R^{64}$ represents the same meaning as before; and $R^{68}$ represents a linear, a branched, or a cyclic alkylene group having 1 to 20 carbon atoms, or an arylene group, optionally containing a hetero atom such as an oxygen atom, a sulfur atom, and a nitrogen atom. Here, b6 represents an integer of 1 to 3.

(AL-12)-17

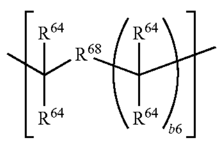

(AL-12)-18

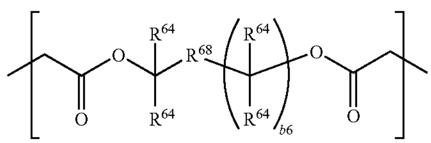

In addition, $R^{64}$, $R^{65}$, $R^{66}$, and $R^{67}$ may contain a hetero atom such as an oxygen atom, a nitrogen atom, and a sulfur atom. Specific example may be represented by the following general formulae (AL-13)-1 to (AL-13)-7.

(AL-13)-1

$—(CH_2)_4OH$ (AL-13)-2

$—(CH_2)_2O(CH_2)_3CH_3$ (AL-13)-3

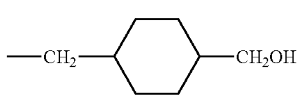

(AL-13)-4

$—(CH_2)_2O(CH_2)_2OH$ (AL-13)-5

$—(CH_2)_6OH$ (AL-13)-6

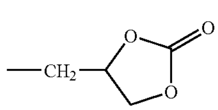

(AL-13)-7

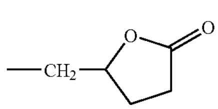

As the acid-Labile group of the formula (AL-12), a group having the exo structure as shown by the following formula (AL-12)-19 is preferable.

(AL-12)-19

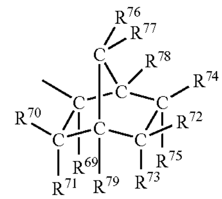

Wherein, $R^{69}$ represents a linear, a branched, or a cyclic alkyl group having 1 to 8 carbon atoms, or an aryl group having 6 to 20 carbon atoms optionally substituted. Each of $R^{70}$ to $R^{75}$, $R^{78}$, and $R^{79}$ independently represents a hydrogen atom, or a monovalent hydrocarbon group, such as an alkyl group, having 1 to 15 carbon atoms optionally containing a hetero atom; and each of $R^{76}$ and $R^{77}$ represents a hydrogen atom. Alternatively, $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{79}$, $R^{76}$ and $R^{77}$ or $R^{77}$ and $R^{78}$ may form a ring with each other, together with a carbon atom to which they are bonded, and in that case each of them represents a divalent hydrocarbon group, such as an alkylene group, having 1 to 15 carbon atoms optionally containing a hetero atom. Further, $R^{70}$ and $R^{79}$, $R^{76}$ and $R^{79}$, or $R^{72}$ and $R^{74}$ may form a double bond by a direct bond between groups connected to neighboring carbons. Furthermore, the formula also represents its mirror image.

Here, an ester monomer to obtain the following repeating unit having the exo structure as shown in the general formula (AL-12)-19 is mentioned in Japanese Patent Laid-Open (kokai) No. 2000-327633.

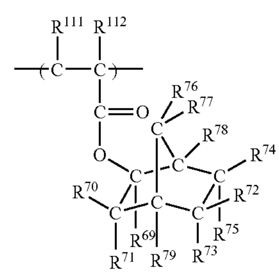

Specific examples may be cited in the following, but not restricted to them. Each of $R^{111}$ and $R^{112}$ independently represents a hydrogen atom, a methyl group, $—COOCH_3$, $—CH_2COOCH_3$, and the like.

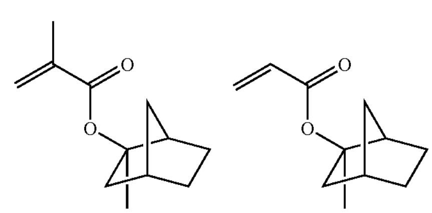

-continued

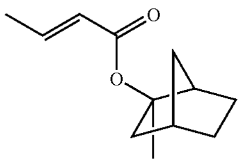
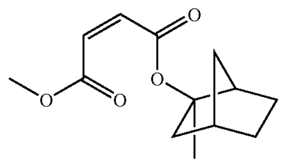
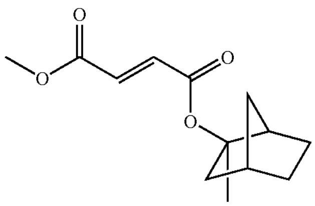
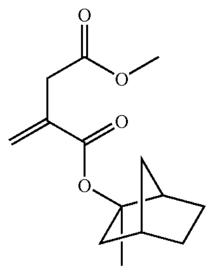
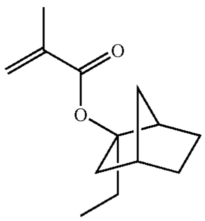
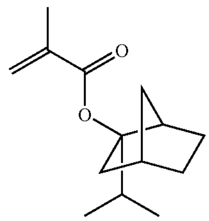
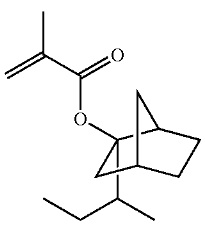
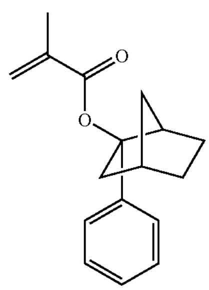
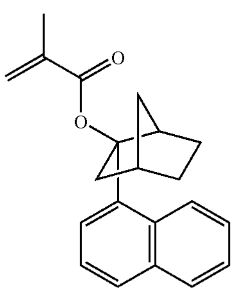
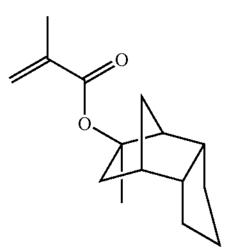
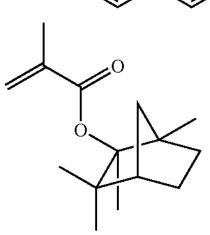
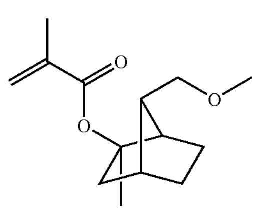
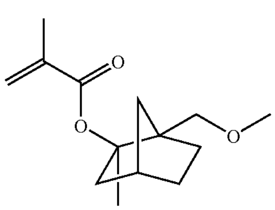

-continued

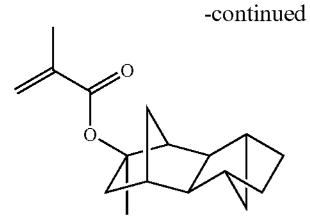
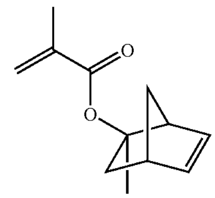
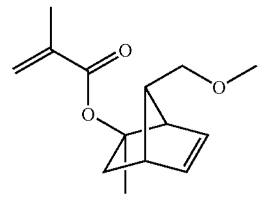
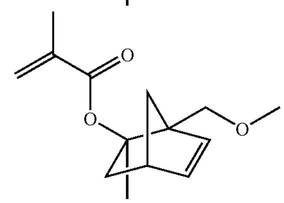
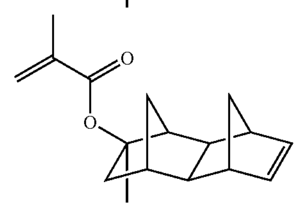
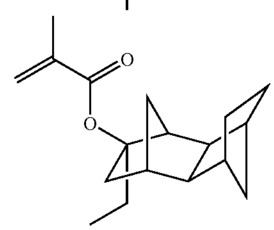
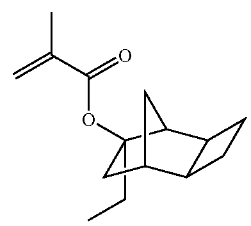
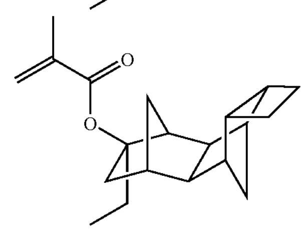

Further, the acid-labile groups shown in (AL-12) may be exemplified by the acid-labile group containing a furane diyl group, a tetrahydrofurane diyl group, or an oxanorbornane diyl group, as shown by the following formula (AL-12)-20.

(AL-12)-20

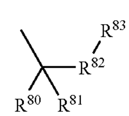

Wherein, each of $R^{80}$ and $R^{81}$ independently represents a monovalent hydrocarbon group such as a linear, a branched, or a cyclic alkyl group having 1 to 10 carbon atoms. Alternatively, $R^{80}$ and $R^{81}$ may form an aliphatic hydrocarbon ring having 3 to 20 carbon atoms by bonding with each other, together with the carbon atoms to which they are bonding.

$R^{82}$ represents a divalent group selected from a furane diyl group, a tetrahydrofurane diyl group, or an oxanorbornane diyl group; and $R^{83}$ represents a hydrogen atom, or a monovalent hydrocarbon group such as a linear, a branched, or a cyclic alkyl group having 1 to 10 carbon atoms optionally containing a hetero atom.

The monomers to obtain the following repeating unit, which is substituted by the acid-labile group containing a furane diyl group, a tetrahydrofurane diyl group, or an oxanorbornane diyl group

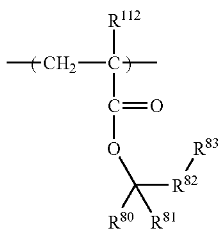

may be exemplified by the following. Here, $R^{112}$ represents the same meanings as before. Further, Me and Ac in the formula represent a methyl group and an acetyl group, respectively.

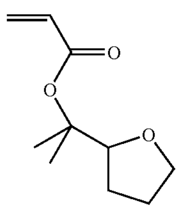
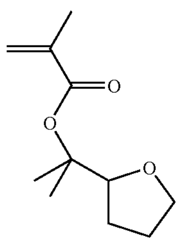
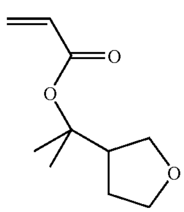
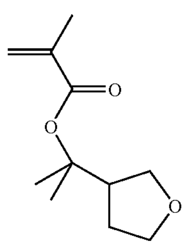
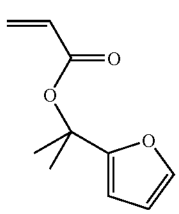
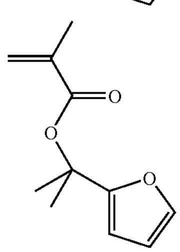
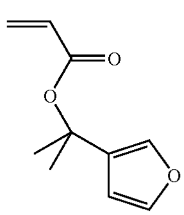
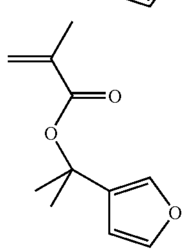

-continued

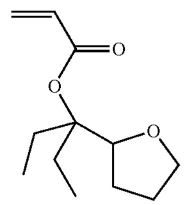
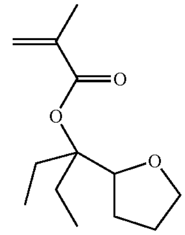
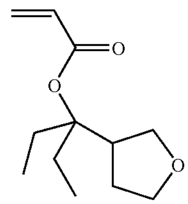
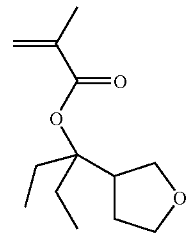
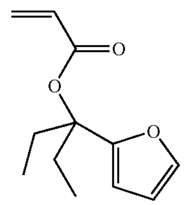
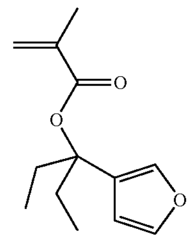
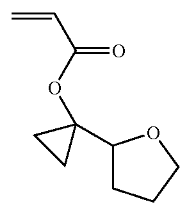
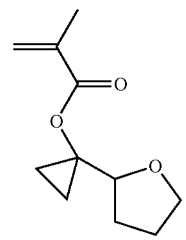
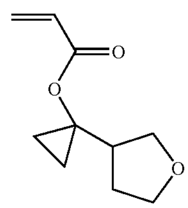
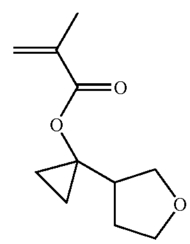
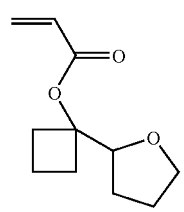
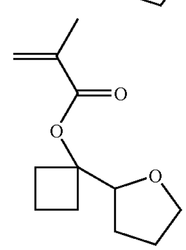
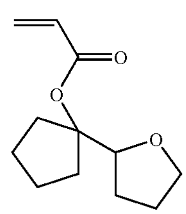
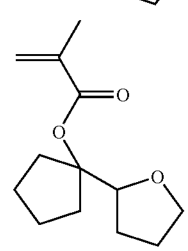

-continued
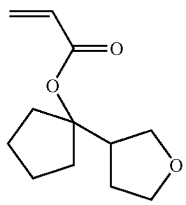
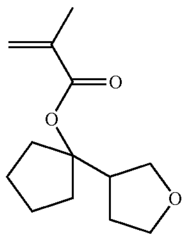
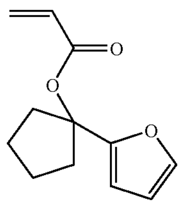
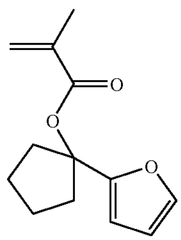
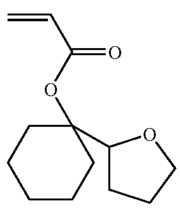
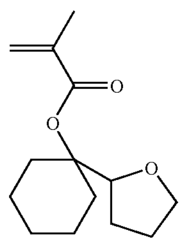
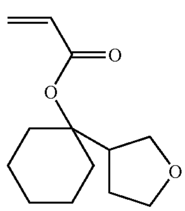
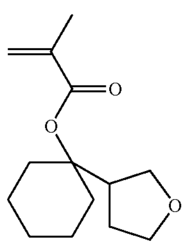
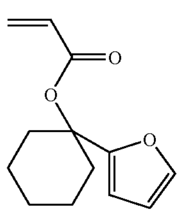
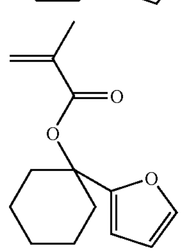
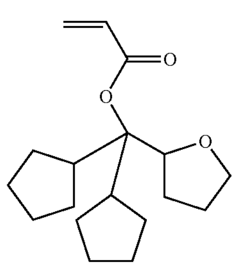
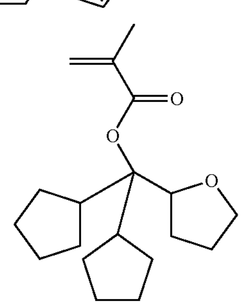
-continued
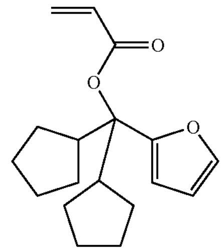
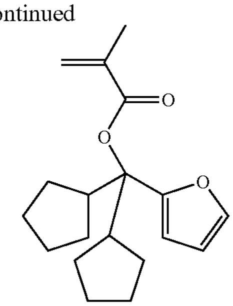
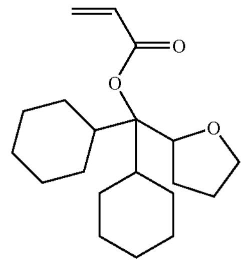
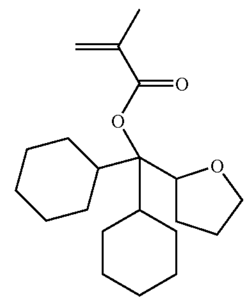
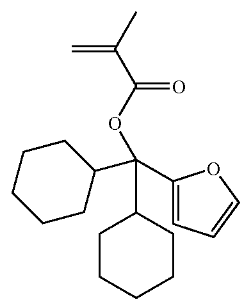
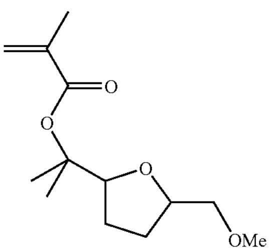
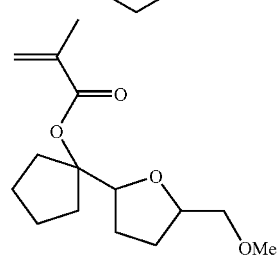
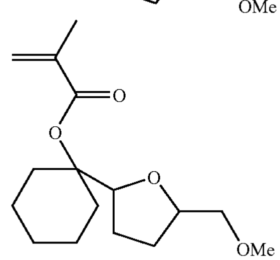
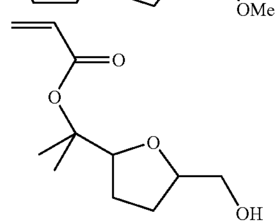

-continued

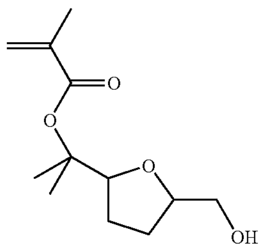

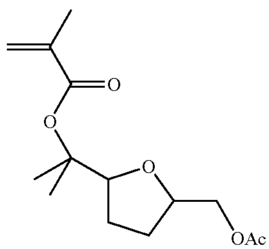

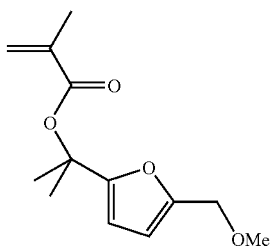

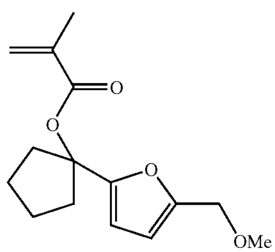

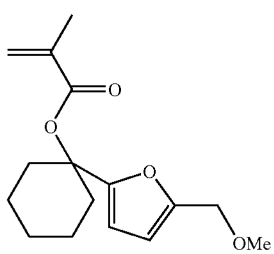

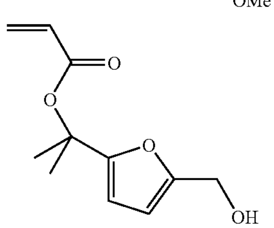

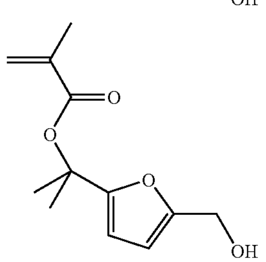

-continued

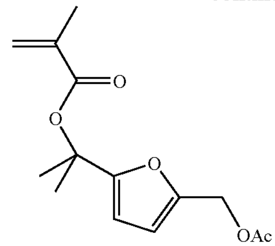

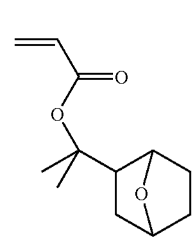

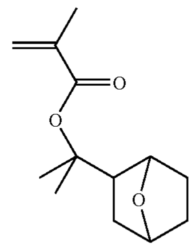

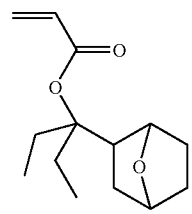

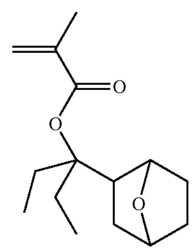

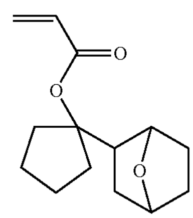

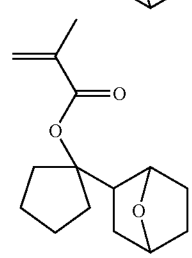

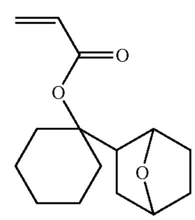

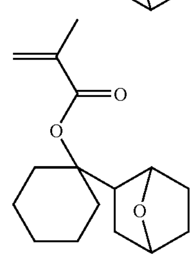

A polymer as a base resin of a resist composition used in the patterning process in the embodiment contains preferably a repeating unit "a" represented by the general formula (1) and a repeating unit "b" represented by the general formula (3). In addition, it may be copolymerized with a repeating unit "c" derived from a monomer having an adhesion group such as a hydroxyl group, a cyano group, a carbonyl group, an ester group, an ether group, a lactone ring, and a carboxylic anhydride group.

Specifically, the monomer giving the repeating unit "c" may be exemplified by the following.
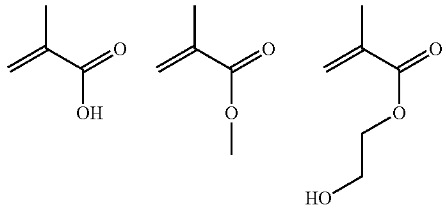
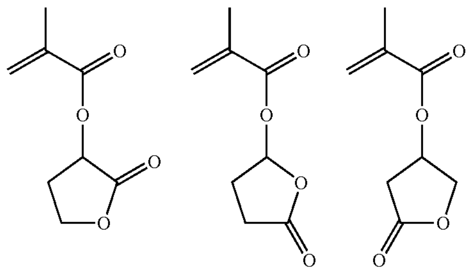
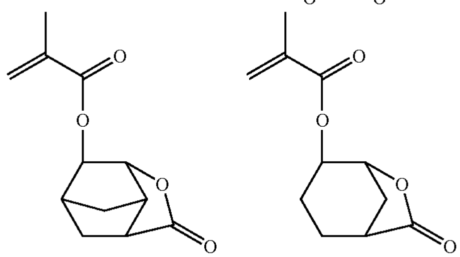
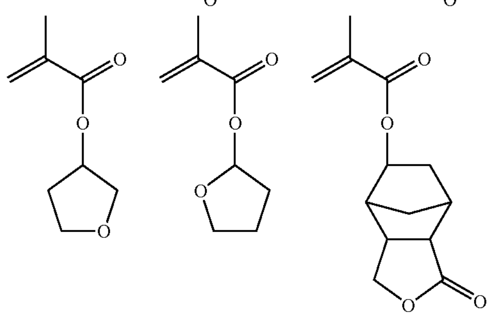
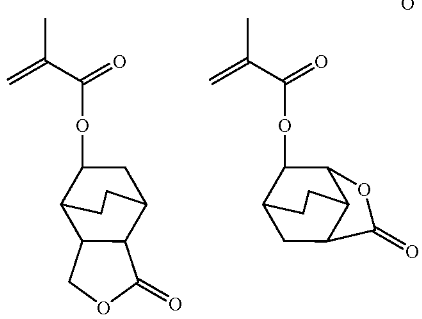
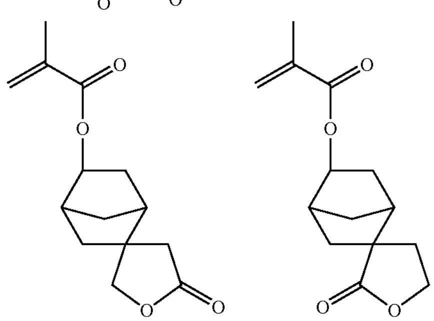
-continued
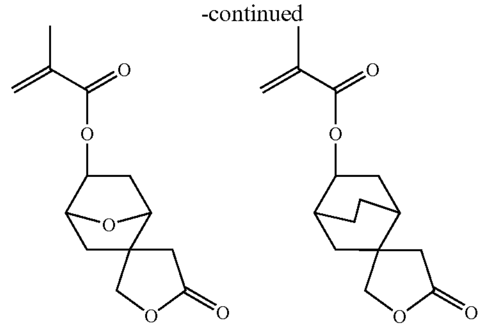
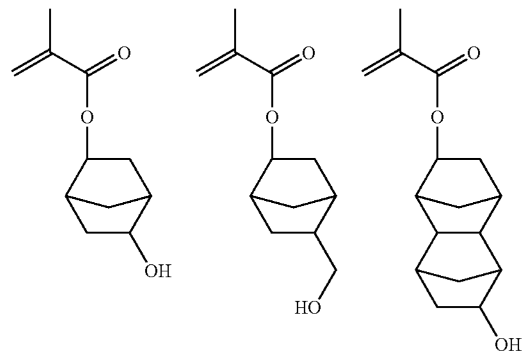
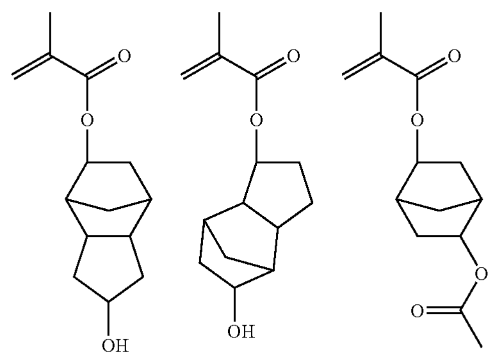
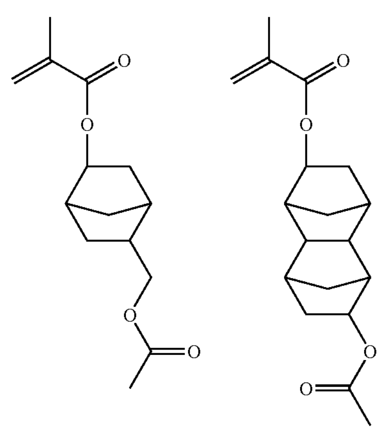

-continued
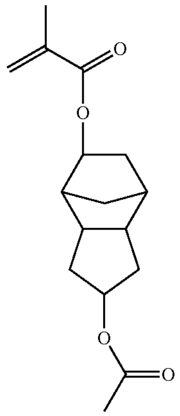
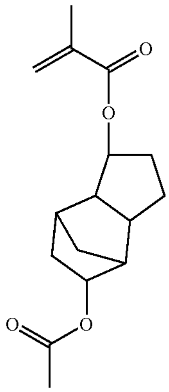
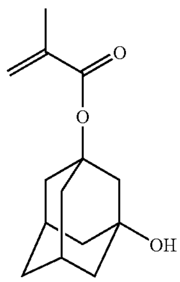
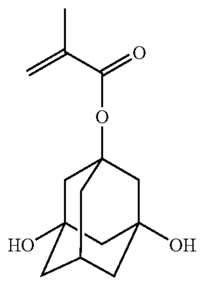
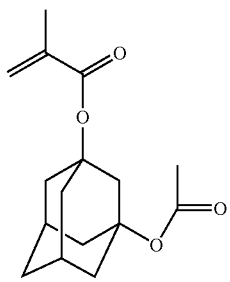
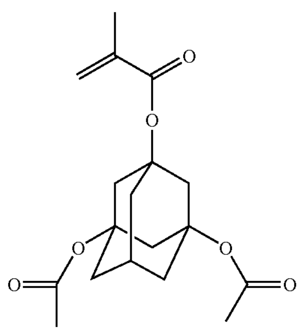
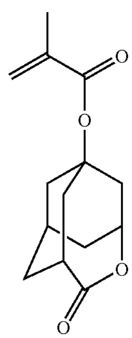
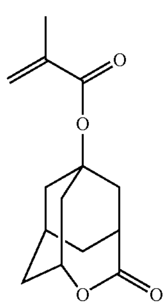
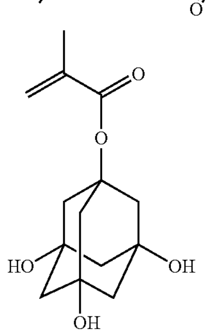
-continued
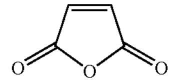
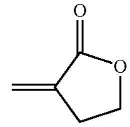
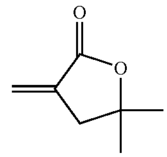
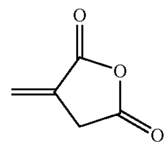
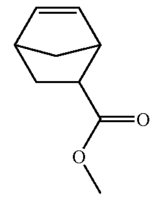
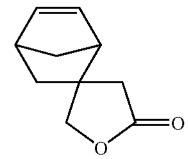
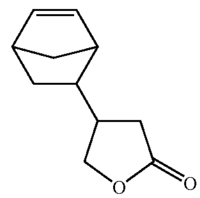
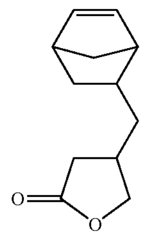
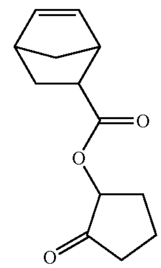
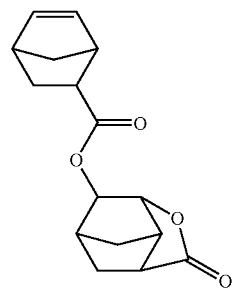
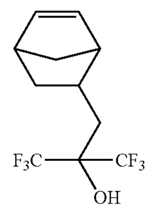
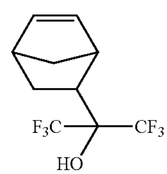
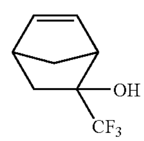
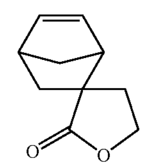
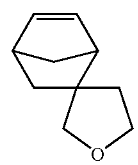
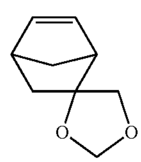
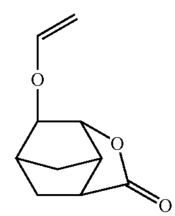
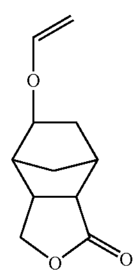
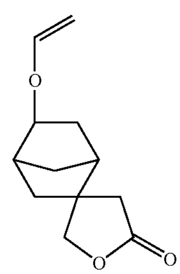
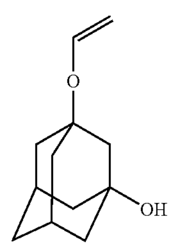
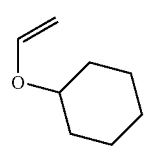
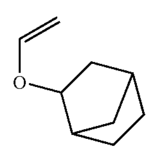
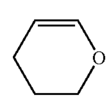
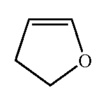

-continued
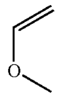
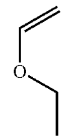
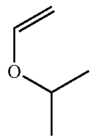
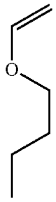
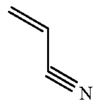
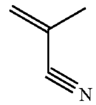
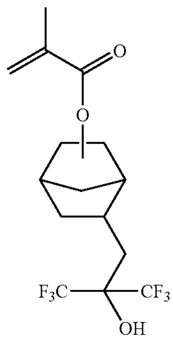
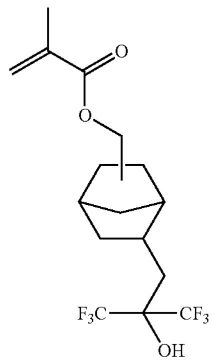
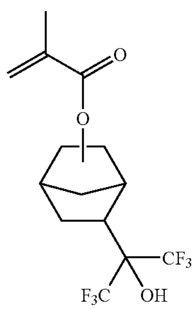
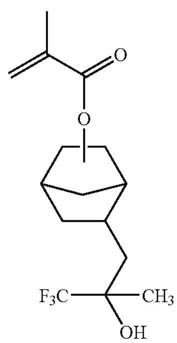
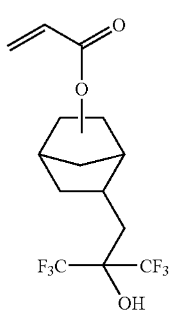
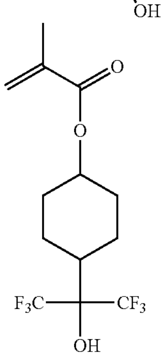
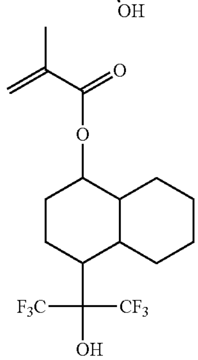
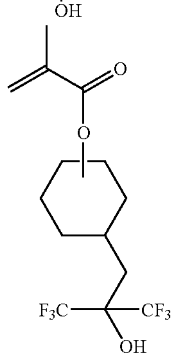
-continued
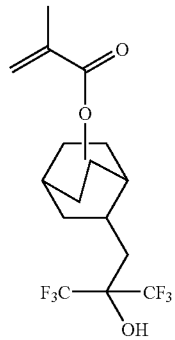
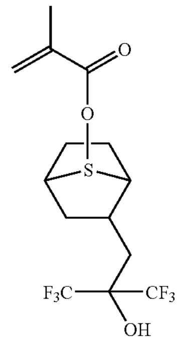
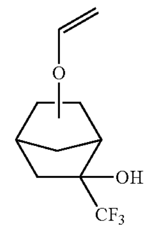
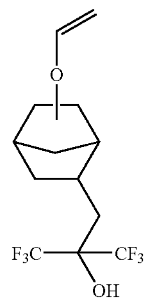
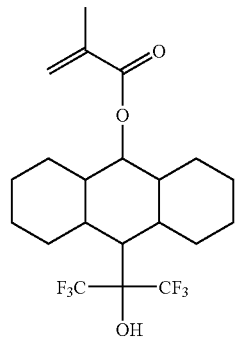
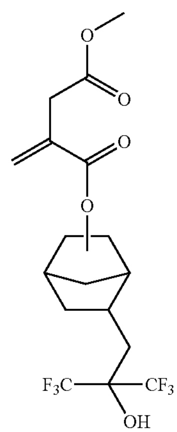
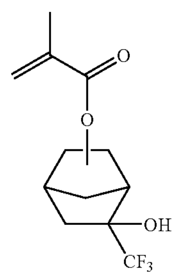
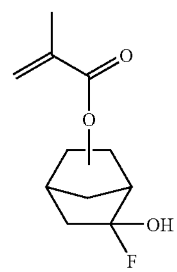
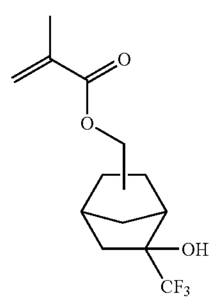
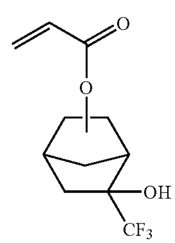
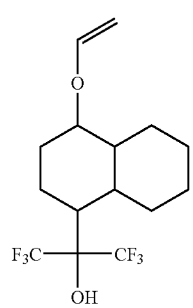
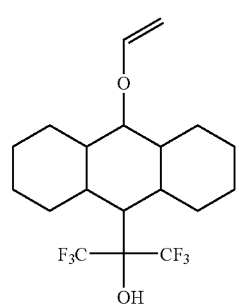

-continued
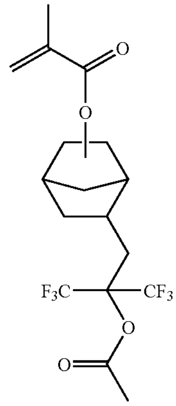
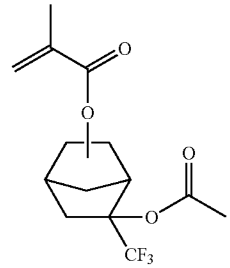
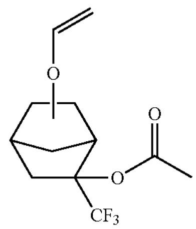
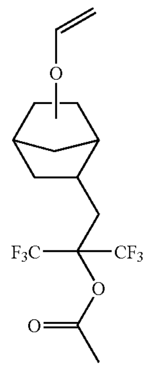
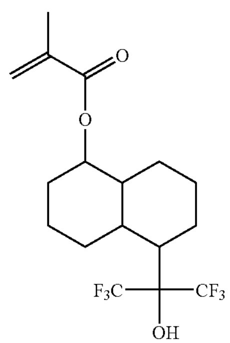
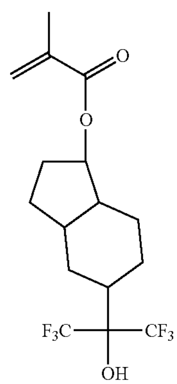
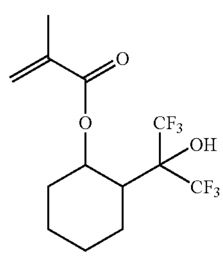
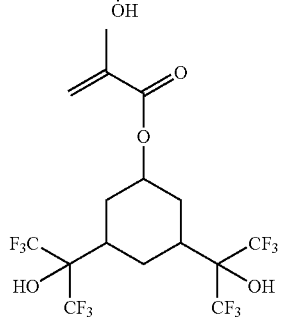
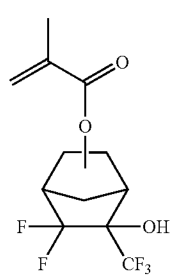
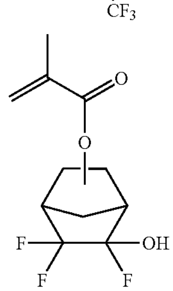
-continued
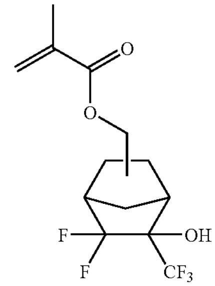
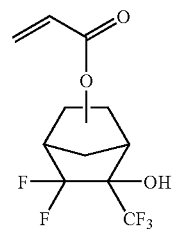
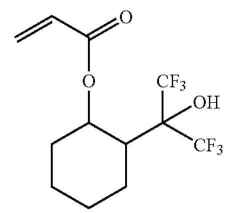
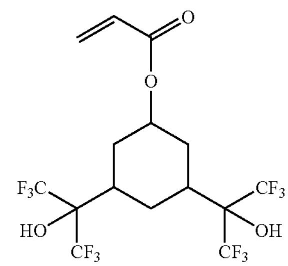
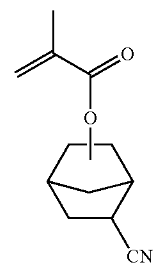
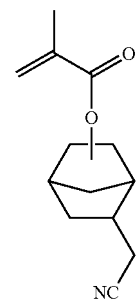
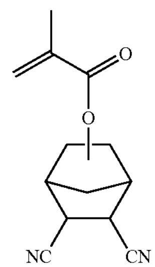
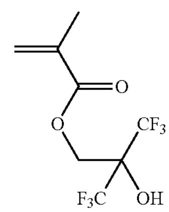
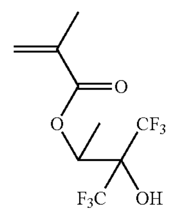
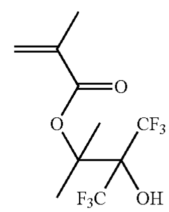
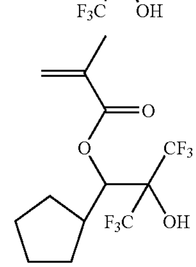
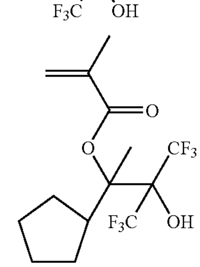
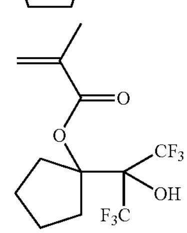
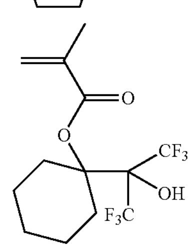

-continued
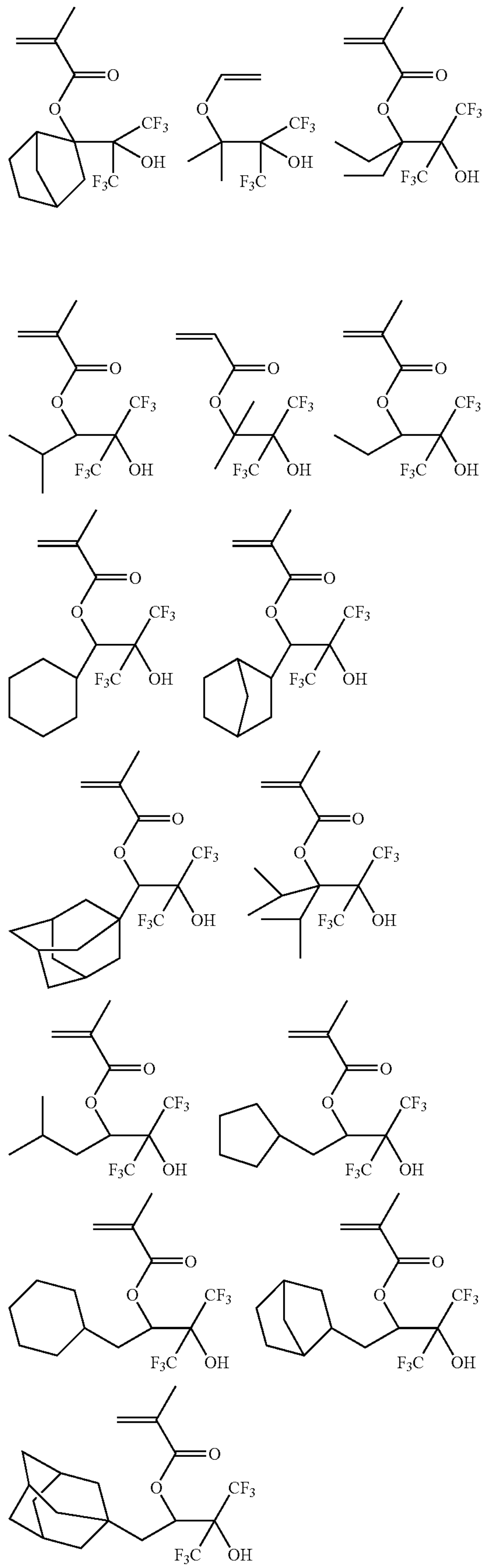
-continued
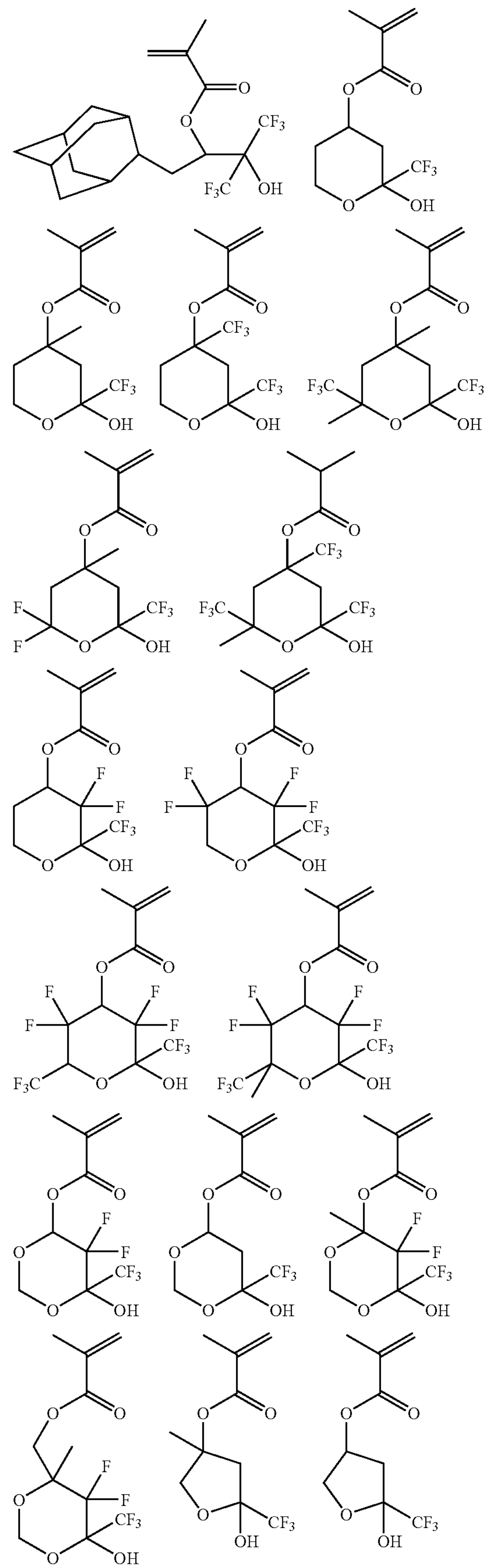

-continued
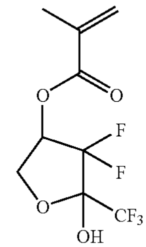
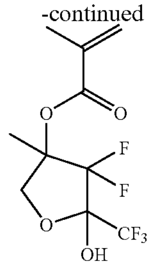
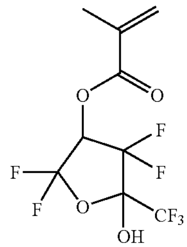
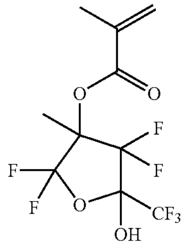
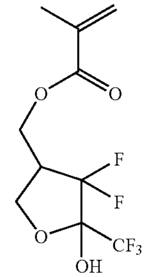
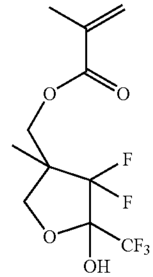
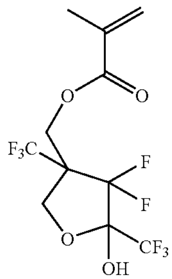
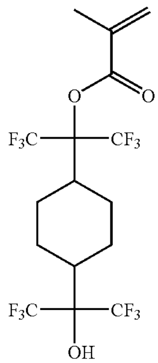
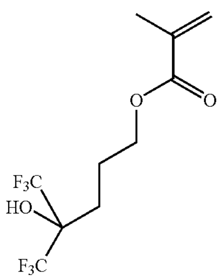
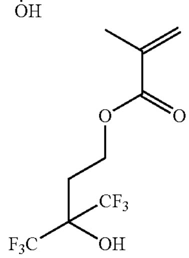
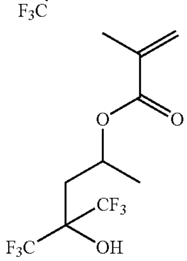
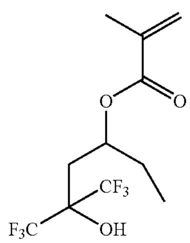
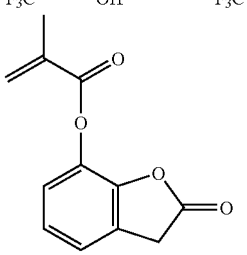
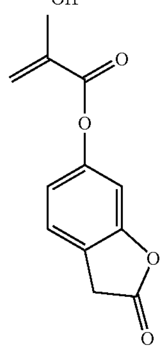
-continued
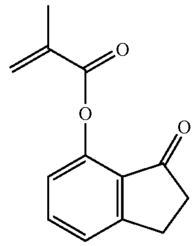
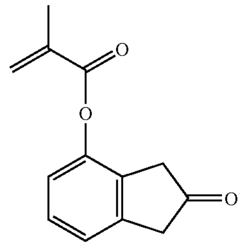
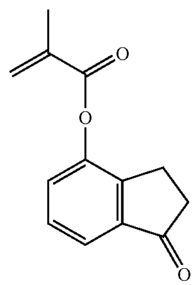
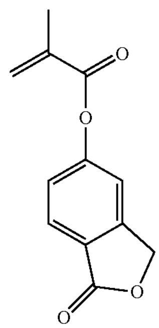
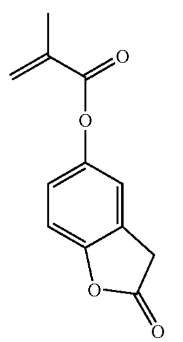
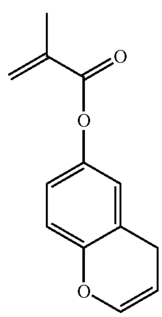
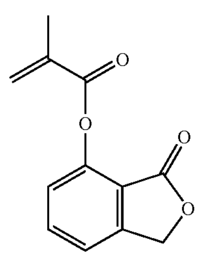
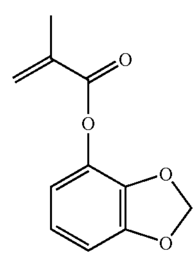
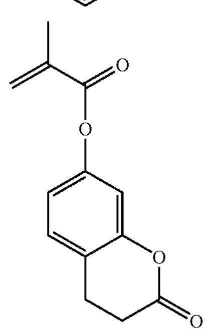
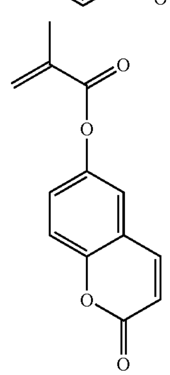

-continued
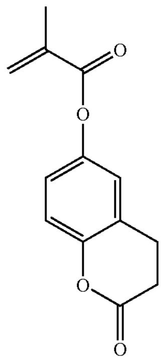
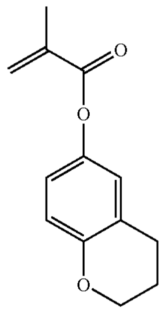
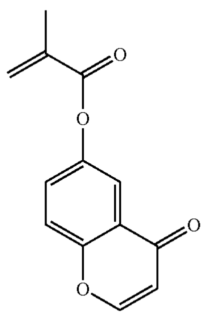
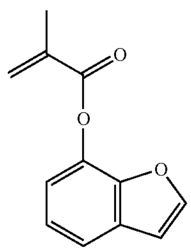
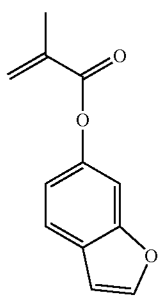
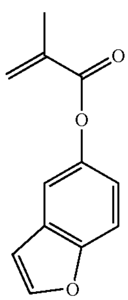
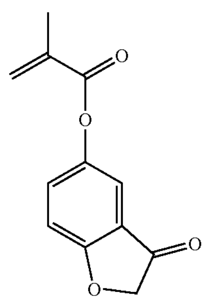
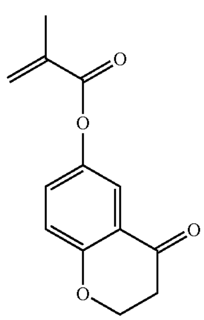
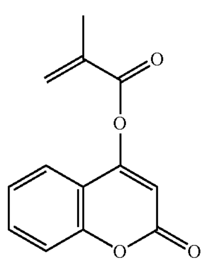
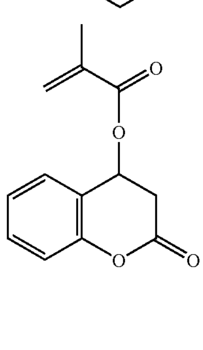
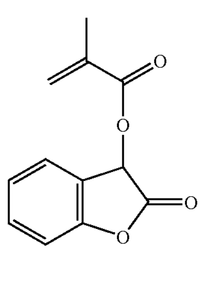
-continued
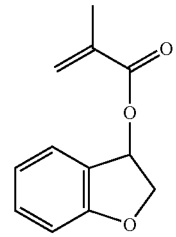
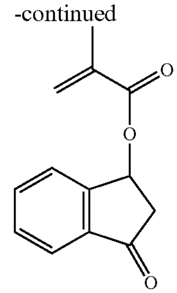
Among the repeating unit "c", a unit containing an α-trifluoromethyl alcohol group or a carboxyl group increases an alkali-dissolution rate after heating of a pattern after development, and thus, it is preferable to copolymrize the unit.
A repeating unit containing a carboxyl group may be exemplified as following.
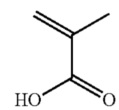
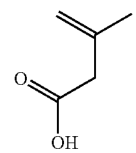
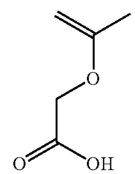
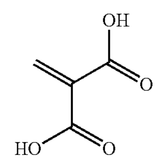
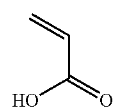
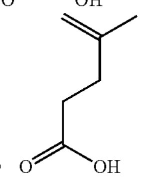
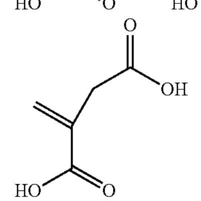
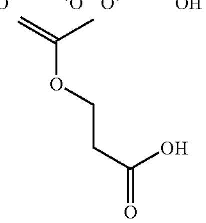
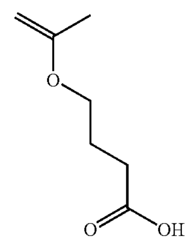
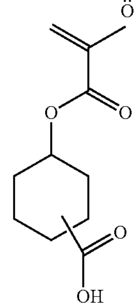
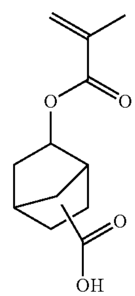
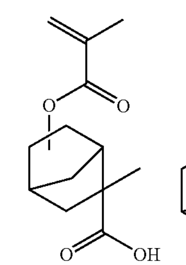
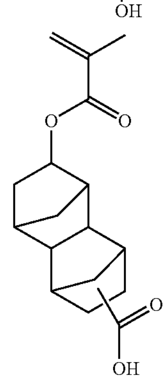
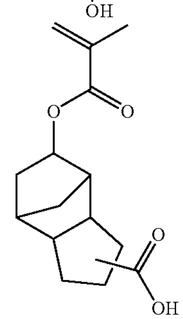

-continued

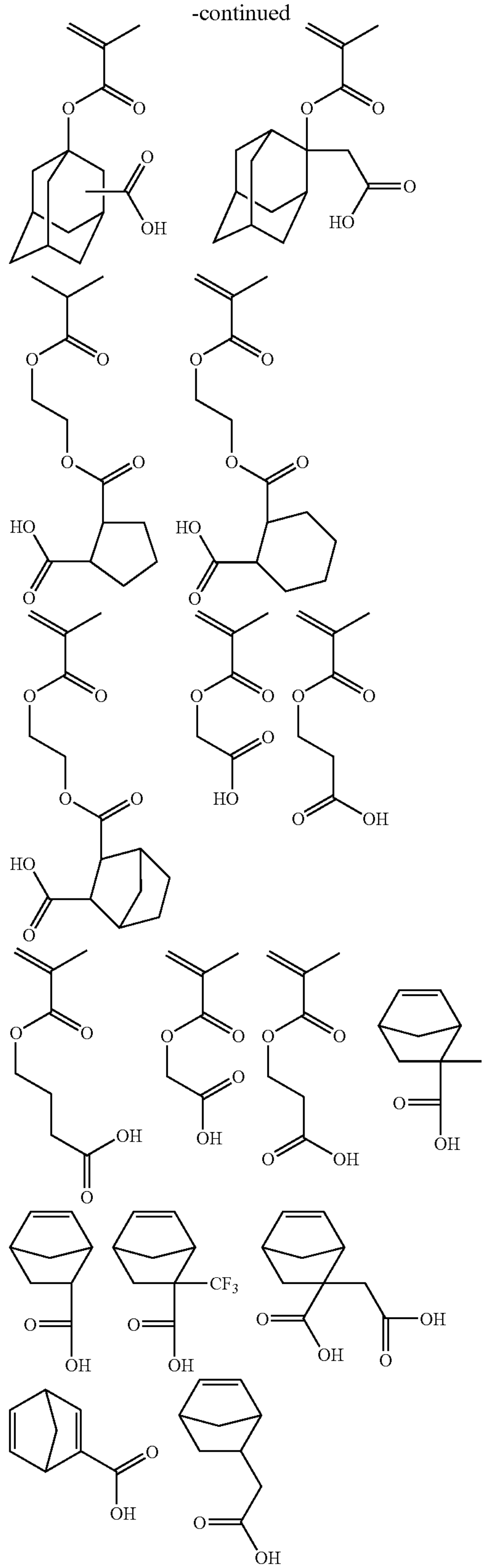

In the repeating units “a”, “b”, and “c”, the ratios of the repeating units are; $0 \leqq a < 1.0$, $0 < b \leqq 0.8$, $0.1 \leqq a+b \leqq 1.0$, $0 \leqq c < 1.0$, and preferably $0.1 \leqq a \leqq 0.9$, $0.1 \leqq b \leqq 0.7$, $0.2 \leqq a+b \leqq 1.0$, $0 \leqq c \leqq 0.9$, wherein $a+b+c=1$.

Here, for example, “a+b=1” means that, in a polymer containing the repeating units “a” and “b”, a sum of the repeating units “a” and “b” is 100 mole % relative to total repeating units, and “a+b<1” means that a sum of the repeating units “a” and “b” is less than 100 mole % relative to total repeating units, and that it contains the repeating unit “c” other than “a” and “b”.

A weight-average molecular weight, obtained according to a gel permeation chromatography (GPC, polystyrene equivalent), of a polymer used as the base resin of the resist in the patterning process of the embodiment is preferably 1,000 to 500,000, in particular 2,000 to 30,000. When the weight-average molecular weight is 1000 or more, a crosslinking efficiency during a thermal crosslinking after development of the resist composition is not decreased, and when 500,000 or less, there is no risk of a decrease in the solubility in an alkaline liquid nor of a footing profile after the pattern formation.

Further, in the polymer used as the base resin of the resist composition in the patterning process of the embodiment, when a molecular weight distribution (Mw/Mn) is wide, there is a risk of formation of foreign spots, deterioration of the pattern form, and so on, after the exposure, because polymers with low molecular weights and with high molecular weights are present. Accordingly, the effects of a molecular weight and a molecular weight distribution tend to become larger as miniaturization of the pattern rule progresses, and accordingly, the molecular weight distribution of a multi-components copolymer is preferably narrow, for example 1.0 to 2.0, in particular 1.0 to 1.5 to obtain a resist composition for fine pattern.

In addition, two or more polymers having different composition ratios, molecular weight distributions, or molecular weights may be blended.

One method for synthesizing these polymers is to carry out a thermal polymerization in which monomers containing unsaturated bonds to give the repeating units “a”, “b”, and “c” are reacted in an organic solvent with addition of a radical polymerization initiator, and thus, the polymer may be obtained. Examples of the organic solvent used in the polymerization include toluene, benzene, tetrahydrofurane, diethyl ether, and dioxane. The polymerization initiator may be exemplified by 2,2'-azobisisobutyronitrile (AIBN), 2,2'-azobis(2,4-dimethylvaleronitrile), dimethyl 2,2-azobis(2-methylpropionate), benzoyl peroxide, lauroyl peroxide, and the like. The polymerization reaction may be done preferably by heating at 50 to 80° C. The reaction time is 2 to 100 hours, and preferably 5 to 20 hours. The acid-labile group may be in a monomer as it is, or deprotected by an acid once, and thereafter, protected or partially protected.

As mentioned above, the positive resist composition is prepared as following; a resist film is formed on a substrate by coating, a high energy beam is irradiated on a necessary part for the exposure after heat-treatment, the exposed area of the resist film is dissolved and developed by using an alkaline developer after heat-treatment to form a positive resist pattern such as a dot pattern, and then an acid is generated to dissociate (to deprotect) an acid-labile group of a polymer in this resist pattern (non-exposed area by the high energy beam) and to crosslink this. A dissolution rate of the polymer into an alkaline developer is 2 nanometers/second or more, preferably 3 to 5,000 nanometers/second, and more preferably 4 to 4,000 nanometers/second in the state of dissociation of the acid-labile group and crosslinking. In this case, to achieve the object of the present invention, the rate is preferably faster by 2 to 250,000 folds, in particular by 5 to 10,000 folds than the dissolution rate of a reverse film will be mentioned later into the alkaline developer.

In order to make the polymer have this dissolution rate, an amount of the repeating unit "b" containing the acid-labile group represented by the general formula (3) is preferably 10 to 90 mole %, in particular 12 to 80 mole %, relative to total repeating units.

The material for the chemically amplified positive resist film used in the patterning process of the present invention may contain, in addition to the base polymer as mentioned above, an organic solvent, a compound generating an acid by response to a high energy beam (an acid-generator), and optionally a dissolution inhibitor, a basic compound, a surfactant, and other components.

As the organic solvent for the chemically amplified positive resist composition in the resist composition used in the patterning process of the present invention, any organic solvents may be used as far as it can dissolve a base resin, an acid-generator, other additives, and the like. Examples of such organic solvents include ketones such as cyclohexanone and methyl 2-n-amyl ketone; alcohols such as 3-methoxy butanol, 3-methyl-3-methoxy butanol, 1-methoxy-2-propanol, and 1-ethoxy-2-propanol; ethers such as propyleneglycol monomethyl ether, ethyleneglycol monomethyl ether, propyleneglycol monoethyl ether, ethyleneglycol monoethyl ether, propyleneglycol dimethyl ether, and diethyleneglycol dimethyl ether; esters such as propyleneglycol monomethyl ether acetate, propyleneglycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propyleneglycol mono-tert-butyl ether acetate; and lactones such as γ-butyrolactone. These organic solvents may be used singly or in a mixture of two or more kinds. However, the organic solvents are not limited thereto. In the present invention, among these organic solvents, in view of the highest solubility of the acid-generator contained in the resist components, diethyleneglycol dimethyl ether, 1-ethoxy-2-propanol, propyleneglycol monomethyl ether acetate, and a mixture thereof are preferably used.

The amount of the organic solvent to be used is preferably 200 to 3,000 parts (hereinafter "by weight" after "parts" is neglected in this document), and more preferably 400 to 2,000 parts, relative to 100 parts of the base resin.

The acid-generator blended in the chemically amplified positive resist composition used in the pattern formation method of the present invention may be exemplified by:

(i) an onium salt represented by the following general formula (P1a-1), (P1a-2), (P1a-3), or (P1b), (ii) a diazomethane derivative represented by the following general formula (P2), (iii) a glyoxime derivative represented by the following general formula (P3), (iv) a bissulfone derivative represented by the following general formula (P4), (v) a sulfonate ester of N-hydroxyimide compound represented by the following general formula (P5), (vi) a β-ketosulfonic acid derivative, (vii) a disulfone derivative, (viii) a nitrobenzyl sulfonate derivative, (ix) a sulfonate ester derivative, and the like.

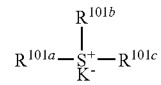

(P1a-1)

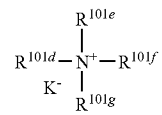

(P1a-2)

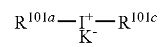

(P1a-3)

Wherein, each of $R^{101a}$, $R^{101b}$, and $R^{101c}$ represents a linear, a branched, or a cyclic alkyl group, an alkenyl group, an oxoalkyl group or an oxoalkenyl group having 1 to 12 carbon atoms, an aryl group having 6 to 20 carbon atoms, or an aralkyl group or an aryloxoalkyl group having 7 to 12 carbon atoms, wherein a part or all of hydrogen atoms in these groups may be substituted by an alkoxy group. $R^{101b}$ and $R^{101c}$ may form a ring with each other, together with a sulfur atom or an iodine atom to which these groups are bonded, and when a ring is formed, each of $R^{101b}$ and $R^{101c}$ represents an alkylene group having 1 to 6 carbon atoms; and $K^-$ represents sulfonic acid whose at least one α-position is fluorinated, or a perfluoroalkyl imidic acid or perfluoroalkyl methide acid. Each of $R^{101d}$, $R^{101e}$, $R^{101f}$, and $R^{101g}$ represents a hydrogen atom, a linear, a branched, or a cyclic alkyl group, an alkenyl group, an oxoalkyl group or an oxoalkenyl group having 1 to 12 carbon atoms, an aryl group having 6 to 20 carbon atoms, or an aralkyl group or an aryloxoalkyl group having 7 to 12 carbon atoms, wherein a part or all of hydrogen atoms in these groups may be substituted by an alkoxy group. $R^{101d}$ and $R^{101e}$, and, $R^{101d}$, $R^{101e}$, and $R^{101f}$ may form a ring with each other, together with a nitrogen atom to which they are bonded, and in that case, $R^{101d}$ and $R^{101e}$, and, $R^{101d}$, $R^{101e}$ and $R^{101f}$ represent an alkylene group having 3 to 10 carbon atoms, or form a hetroaromatic ring containing a nitrogen atom in the formula in the ring.

Among onium salts represented by the above formulae (P1a-1), (P1a-2), and (P1a-3), a compound represented by the formula (P1a-1) functions as a photo-inductive acid-generator, a compound represented by the formula (P1a-2) functions as a heat-inductive acid-generator, and a compound represented by the formula (P1a-3) functions as both a photo-inductive acid-generator and a heat-inductive acid-generator. If (P1a-1) and (P1a-2) are combined, the pattern formation may be done by an acid generated from (P1a-1) by a exposure, and crosslinking may be done efficiently by an acid generated from (P1a-2) by heating at high temperature after development.

Specific examples of $K^-$ include a perfluoroalkane sulfonic acid such as triflate and nonaflate; an imidic acid such as bis(trifluoromethylsulfonyl)imide, bis(perfluoroethylsulfonyl)imide, and bis(perfluorobutylsulfonyl)imide; a methide acid such as tris(trifluoromethylsulfonyl)methide and tris (perfluoroethylsulfonyl)methide; and further a sulfonate whose α-position is substituted by a fluorine atom as shown by the following general formula (K-1), and a sulfonate whose α-position is substituted by a fluorine atom as shown by the general formula (K-2).

(K-1)

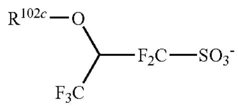

(K-2)

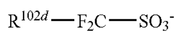

In the general formula (K-1), $R^{102c}$ represents a hydrogen atom, a linear, a branched, or a cyclic alkyl group or an acyl group having 1 to 20 carbon atoms, an alkenyl group having 2 to 20 carbon atoms, or an aryl group or an aryloxy group having 6 to 20 carbon atoms, optionally containing an ether group, an ester group, a carbonyl group, or a lactone ring, a part or all of whose hydrogen atoms are replaced by fluorine atoms. In the general formula (K-2), $R^{102d}$ represents a hydrogen atom, a linear, a branched, or a cyclic alkyl group having 1 to 20 carbon atoms, an alkenyl group having 2 to 20 carbon atoms, or an aryl group having 6 to 20 carbon atoms.

The above-mentioned $R^{101a}$, $R^{101b}$, and $R^{101c}$ may be the same or different, and specifically include, as the alkyl group, a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, an admantyl group, and the like. The alkenyl group may be exemplified by a vinyl group, an allyl group, a propenyl group, a butenyl group, a hexenyl group, a cyclohexenyl group, and the like. The oxoalkyl group may be exemplified by a 2-oxocyclopentyl group, 2-oxocyclohexyl group, and the like, and in addition by a 2-oxopropyl group, a 2-cyclopentyl-2-oxoethyl group, a 2-cyclohexyl-2-oxoethyl group, a 2-(4-methylcyclohexyl)-2-oxoethyl group, and the like. The oxoalkenyl group may be exemplified by 2-oxo-4-cyclohexenyl group, 2-oxo-4-propenyl group, and the like. The aryl group may be exemplified by a phenyl group, a naphthyl group, and the like; an alkoxyphenyl group such as a p-methoxyphenyl group, a m-methoxyphenyl group, an o-methoxyphenyl group, an ethoxyphenyl group, a p-tert-butoxyphenyl group, and a m-tert-butoxyphenyl group; an alkylphenyl group such as a 2-methylphenyl group, a 3-methylphenyl group, a 4-methylphenyl group, an ethylphenyl group, a 4-tert-butylphenyl group, a 4-butylphenyl group, and a dimethylphenyl group; an alkylnaphthyl group such as a methylnaphthyl group and an ethylnaphthyl group; an alkoxynaphthyl group such as a methoxynaphthyl group and an ethoxynaphtyl group; a dialkylnaphthyl group such as a dimethylnaphthyl group and a diethylnaphthyl group; a dialkoxynaphthyl group such as dimethoxynaphthyl group and a diethoxynaphthyl group; and others. The aralkyl group may be exemplified by a benzyl group, a phenetyl group, and the like. The aryloxoalkyl group may be exemplified by a 2-aryl-2-oxoethyl group such as a 2-phenyl-2-oxoethyl group, a 2-(1-naphthyl)-2-oxoethyl group, and a 2-(2-naphthyl)-2-oxoethyl group. The non-nucleophilic counter ion $K^-$ may be exemplified by a halide ion such as a chloride ion and a bromide ion; a fluoroalkyl sulfonate such as triflate, 1,1,1-trifluoroethane sulfonate, and nonafluorobutane sulfonate; an aryl sulfonate such as tosylate, benzene sulfonate, 4-fluorobenzene sulfonate, and 1,2,3,4,5-pentafluorobenzene sulfonate; and an alkyl sulfonate such as mesylate and butane sulfonate.

(P1b)

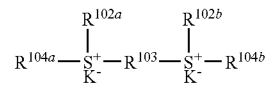

Wherein, each of $R^{102a}$ and $R^{102b}$ represents a linear, a branched, or a cyclic alkyl group having 1 to 8 carbon atoms; and $R^{103a}$ represents a linear, a branched, or a cyclic alkylene group having 1 to 10 carbon atoms. Each of $R^{104a}$ and $R^{104b}$ represents a 2-oxoalkyl group having 3 to 7 carbon atoms. $K^-$ represents a non-nucleophilic counter ion.

Specific examples of $R^{102a}$ and $R^{102b}$ include a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cyclopropylmethyl group, a 4-methylcyclohexyl group, and a cyclohexylmethyl group. Specific examples of $R^{103}$ include a methylene group, an ethylene group, a propylene group, a butylene group, a pentylene group, a hexylene group, a heptylene group, an octylene group, a nonylene group, a 1,4-cyclohexylene group, a 1,2-cyclohexylene group, a 1,3-cyclopentylene group, a 1,4-cyclooctylene group, and a 1,4-cyclohexanedimethylene group. Examples of $R^{104a}$ and $R^{104b}$ include a 2-oxopropyl group, a 2-oxocyclopentyl group, a 2-oxocyclohexyl group, and a 2-oxocycloheptyl group. $K^-$ may be exemplified by the same groups as those explained in the formulae (P1a-1) and (P1a-2).

(P2)

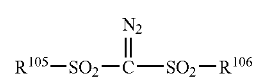

Wherein, each of $R^{105}$ and $R^{106}$ represents a linear, a branched, or a cyclic alkyl group or a halogenated alkyl group having 1 to 12 carbon atoms, an aryl group or a halogenated aryl group having 6 to 20 carbon atoms, or an aralkyl group having 7 to 12 carbon atoms.

Examples of the alkyl group in $R^{105}$ and $R^{106}$ include a methyl group, an ethyl group, a propyl group, an isopropyl group, a n-butyl group, a sec-butyl group, a tert-butyl group, a pentyl group, a hexyl group, a heptyl group, an octyl group, an amyl group, a cyclopentyl group, a cyclohexyl group, a cycloheptyl group, a norbornyl group, and an admantyl group. Examples of the halogenated alkyl group in $R^{105}$ and $R^{106}$ include a trifluoromethyl group, a 1,1,1-trifluoroethyl group, a 1,1,1-trichloroethyl group, and a nonafluorobutyl group. The aryl group in $R^{105}$ and $R^{106}$ may be exemplified by a phenyl group; an alkoxyphenyl group such as a p-methoxyphenyl group, a m-methoxyphenyl group, an o-methoxyphenyl group, an ethoxyphenyl group, a p-tert-butoxyphenyl group, and a m-tert-butoxyphenyl group; and an alkylphenyl group such as a 2-methylphenyl group, a 3-methylphenyl group, a 4-methylphenyl group, an ethylphenyl group, a 4-tert-butylphenyl group, a 4-butylphenyl group, a dimethylphenyl group; or others. The halogenated aryl group in $R^{105}$ and $R^{106}$ may be exemplified by a fluorophenyl group, a chlorophenyl group, a 1,2,3,4,5-pentafluorophenyl group, and the like. The aralkyl group in $R^{105}$ and $R^{106}$ may be exemplified by a benzyl group, a phenetyl group, and the like.

(P3)

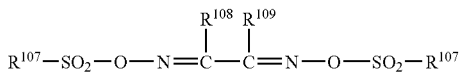

Wherein, each of $R^{107}$, $R^{108}$, and $R^{109}$ represents a linear, a branched, or a cyclic alkyl group or a halogenated alkyl group having 1 to 12 carbon atoms, an aryl group or a halogenated aryl group having 6 to 20 carbon atoms, or an aralkyl group having 7 to 12 carbon atoms. $R^{108}$ and $R^{109}$ may form a ring structure by bonding with each other, and when a ring structure is formed, each of $R^{108}$ and $R^{109}$ represents a linear or a branched alkylene group having 1 to 6 carbon atoms.

The alkyl group, the halogenated alkyl group, the aryl group, the halogenated aryl group, and the aralkyl group in $R^{107}$, $R^{108}$, and $R^{109}$ may be the same groups as those explained in $R^{105}$ and $R^{106}$. Here, the alkylene group in $R^{108}$ and $R^{109}$ may be exemplified by a methylene group, an ethylene group, a propylene group, a butylene group, a hexylene group, and the like.

(P4)

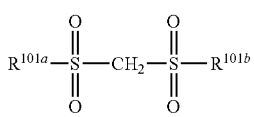

Wherein, $R^{101a}$ and $R^{101b}$ represent the same meanings as before.

(P5)

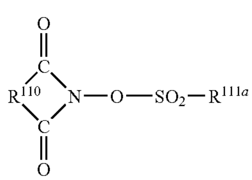

Wherein, $R^{110}$ represents an arylene group having 6 to 10 carbon atoms, an alkylene group having 1 to 6 carbon atoms, or an alkenylene group having 2 to 6 carbon atoms, wherein a part or all of hydrogen atoms in these groups may be further substituted by a linear or a branched alkyl group or an alkoxy group having 1 to 4 carbon atoms, a nitro group, an acetyl group, or a phenyl group. $R^{111a}$ represents an alkyl group, an alkenyl group, or an alkoxyalkyl group, with a linear, a branched, or a cyclic structure having 1 to 8 carbon atoms, a phenyl group, or a naphthyl group, wherein a part of or all of hydrogen atoms in these groups may be substituted further by an alkyl group or an alkoxy group having 1 to 4 carbon atoms; a phenyl group optionally substituted by an alkyl group having 1 to 4 carbon atoms, an alkoxy group, a nitro group, or an acetyl group; a heteroaromatic group having 3 to 5 carbon atoms; a chlorine atom; or a fluorine atom.

Here, the arylene group in $R^{110}$ may be exemplified by a 1,2-phenylene group, a 1,8-naphthylene group, and the like. The alkylene group may be exemplified by a methylene group, an ethylene group, a trimethylene group, a tetramethylene group, a phenylethylene group, a norbornane-2,3-diyl group, and the like. The alkenylene group may be exemplified by a 1,2-vinylene group, a 1-phenyl-1,2-vinylene group, a 5-norbornene-2,3-diyl group, and the like. The alkyl group in $R^{111a}$ represents the same meanings as $R^{101a}$ to $R^{101c}$. The alkenyl group may be exemplified by a vinyl group, a 1-propenyl group, an allyl group, a 1-butenyl group, a 3-butenyl group, an isoprenyl group, a 1-pentenyl group, a 3-pentenyl group, a 4-pentenyl group, a dimethylallyl group, a 1-hexenyl group, a 3-hexenyl group, a 5-hexenyl group, a 1-heptenyl group, a 3-heptenyl group, a 6-heptenyl group, a 7-octenyl group, and the like. The alkoxyalkyl group may be exemplified by a methoxymethyl group, an ethoxymethyl group, a propoxymethyl group, a butoxymethyl group, a pentyloxymethyl group, a hexyloxymethyl group, a heptyloxymethyl group, a methoxyethyl group, an ethoxyethyl group, a propoxyethyl group, a butoxyethyl group, a pentyloxyethyl group, a hexyloxyethyl group, a methoxypropyl group, an ethoxypropyl group, a propoxypropyl group, a butoxypropyl group, a methoxybutyl group, an ethoxybutyl group, a propoxybutyl group, a methoxypentyl group, an ethoxypentyl group, a methoxyhexyl group, a methoxyheptyl group, and the like.

Here, the alkyl group having 1 to 4 carbon atoms further optionally substituted for hydrogen atoms of the groups in $R^{111a}$ may be exemplified by a methyl group, an ethyl group, a propyl group, an isopropyl group, a n-butyl group, an isobutyl group, a tert-butyl group, and the like. The alkoxy group having 1 to 4 carbon atoms may be exemplified by a methoxy group, an ethoxy group, a propoxy group, an isopropoxy group, a n-butoxy group, an isobutoxy group, a tert-butoxy group, and the like. The phenyl group optionally substituted by an alkyl group having 1 to 4 carbon atoms, an alkoxy group, a nitro group, or an acetyl group may be exemplified by a phenyl group, a tollyl group, a p-tert-butoxyphenyl group, a p-acetylphenyl group, a p-nitrophenyl group, and the like. The heteroaromatic group having 3 to 5 carbon atoms may be exemplified by a pyridyl group, a furyl group, and the like.

Specific examples of the acid-generator may be as following.

The onium salt may be exemplified by diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluolobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, (2-norbonyl)methyl (2-oxocyclohexyl)sulfonium trifluoromethanesulfonate, ethylenebis[methyl(2-oxocyclopentyl)sulfonium trifluoromethanesulfonate], 1,2'-naphthylcarbonyl methyl tetrahydrothiophenium triflate, and the like.

The diazomethane derivative may be exemplified by bis (benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl) diazomethane, bis(n-butylsulfonyl)diazomethane, bis (isobutylsulfonyl)diazomethane, bis(sec-butylsulfonyl) diazomethane, bis(n-propylsulfonyl)diazomethane, bis (isopropylsulfonyl)diazomethane, bis(tert-butylsulfonyl) diazomethane, bis(n-amylsulfonyl)diazomethane, bis (isoamylsulfonyl)diazomethane, bis(sec-amylsulfonyl) diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, 1-tert-amylsulfonyl-1-(tert-butylsulfonyl)diazomethane, and the like.

The glyoxime derivative may be exemplified by bis-O-(p-toluenesulfonyl)-α-dimethyl glyoxime, bis-O-(p-toluenesulfonyl)-α-diphenyl glyoxime, bis-O-(p-toluenesulfonyl)-α-dicyclohexyl glyoxime, bis-O-(p-toluenesulfonyl)-2,3-pentanedione glyoxime, bis-O-(p-toluenesulfonyl)-2-methyl-3,4-pentanedione glyoxime, bis-O-(n-butanesulfonyl)-α-dimethyl glyoxime, bis-O-(n-butanesulfonyl)-α-diphenyl glyoxime, bis-O-(n-butanesulfonyl)-α-dicyclohexyl glyoxime, bis-O-(n-butanesulfonyl)-2,3-pentanedione glyoxime, bis-O-(n-butanesulfonyl)-2-methyl-3,4-pentanedione glyoxime, bis-O-(methanesulfonyl)-α-dimethyl glyoxime, bis-O-(trifluoromethanesulfonyl)-α-dimethyl glyoxime, bis-O-(1,1,1-trifluoroethanesulfonyl)-α-dimethyl glyoxime, bis-O-(tert-butanesulfonyl)-α-dimethyl glyoxime, bis-O-(perfluorooctanesulfonyl)-α-dimethyl glyoxime, bis-O-(cyclohexanesulfonyl)-α-dimethyl glyoxime, bis-O-(benzenesulfonyl)-α-dimethyl glyoxime, bis-O-(p-fluorobenzenesulfonyl)-α-dimethyl glyoxime, bis-O-(p-tert-butylbenzenesulfonyl)-α-dimethyl glyoxime, bis-O-(xylenesulfonyl)-α-dimethyl glyoxime, bis-O-(camphersulfonyl)-α-dimethyl glyoxime, and the like.

The bissulfone derivative may be exemplified by bisnaphthyl sulfonyl methane, bistrifluoromethyl sulfonyl methane, bismethyl sulfonyl methane, bisethyl sulfonyl methane, bispropyl sulfonyl methane, bisisopropyl sulfonyl methane, bis-p-toluene sulfonyl methane, bisbenzene sulfonyl methane, and the like.

The β-keto sulfonic acid derivative may be exemplified by 2-cyclohexylcarbonyl-2-(p-toluenesulfonyl)propane, 2-isopropylcarbonyl-2-(p-toluenesulfonyl)propane, and the like.

The disulfone derivative may be exemplified by a diphenyl disulfone, dicyclohexyl disulfone, and the like.

The nitrobenzyl sulfonate derivative may be exemplified by 2,6-dinitrobenzyl p-toluene sulfonate, 2,4-dinitrobenzyl p-toluene sulfonate, and the like.

The sulfonate ester derivative may be exemplified by 1,2,3-tris(methanesulfonyloxy)benzene, 1,2,3-tris(trifluoromethanesulfonyloxy)benzene, 1,2,3-tris(p-toluenesulfonyloxy)benzene, and the like.

The sulfonate ester derivative of an N-hydroxyimide compound may be exemplified by N-hydroxysuccinimide methanesulfonate ester, N-hydroxysuccinimide trifluoromethanesulfonate ester, N-hydroxysuccinimide ethanesulfonate ester, N-hydroxysuccinimide 1-propanesulfonate ester, N-hydroxysuccinimide 2-propanesulfonate ester, N-hydroxysuccinimide 1-pentanesulfonate ester, N-hydroxysuccinimide 1-octanesulfonate ester, N-hydroxysuccinimide p-toluenesulfonate ester, N-hydroxysuccinimide p-methoxybenzenesulfonate ester, N-hydroxysuccinimide 2-chloroethanesulfonate ester, N-hydroxysuccinimide benzenesulfonate ester, N-hydroxysuccinimide 2,4,6-trimethylbenzenesulfonate ester, N-hydroxysuccinimide 1-naphthalenesulfonate ester, N-hydroxysuccinimide 2-naphthalenesulfonate ester, N-hydroxy-2-phenylsuccinimide methanesulfonate ester, N-hydroxymaleimide methanesulfonate ester, N-hydroxymaleimide ethanesulfonate ester, N-hydroxy-2-phenylmaleimide methanesulfonate ester, N-hydroxyglutarimide methanesulfonate ester, N-hydroxyglutarimide benzenesulfonate ester, N-hydroxyphthalimide methanesulfonate ester, N-hydroxyphthalimide benzenesulfonate ester, N-hydroxyphthalimide trifluoromethanesulfonate ester, N-hydroxyphthalimide p-toluenesulfonate ester, N-hydroxynaphthalimide methanesulfonate ester, N-hydroxynaphthalimide benzenesulfonate ester, N-hydroxy-5-norbornene-2,3-dicarboxyimide methanesulfonate ester, N-hydroxy-5-norbornene-2,3-dicarboxyimide trifluoromethanesulfonate ester, N-hydroxy-5-norbornene-2,3-dicarboxyimide p-toluenesulfonate ester, and the like.

Especially, the onium salt such as triphenylsulfonium trifluoromethanesulfonate, (p-tert-butoxyphenyl)diphenylsulfonium trifluoromethanesulfonate, tris(p-tert-butoxyphenyl) sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl) sulfonium trifluoromethanesulfonate, (2-norbonyl)methyl(2-oxocyclohexyl)sulfonium trifluoromethanesulfonate, and 1,2'-naphthylcarbonylmethyltetrahydrothiophenium triflate; the diazomethane derivative such as bis(benzenesulfonyl) diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl) diazomethane, bis(isopropylsulfonyl)diazomethane, and bis (tert-butylsulfonyl)diazomethane; the glyoxime derivative such as bis-O-(p-toluenesulfonyl)-α-dimethyl glyoxime and bis-o-(n-butanesulfonyl)-α-dimethyl glyoxime; the bissulfone derivative such as bisnaphthyl sulfonyl methane; the sulfonate ester derivatives of a N-hydroxyimide compound such as N-hydroxysuccinimide methanesulfonate ester, N-hydroxysuccinimide trifluoromethanesulfonate ester, N-hydroxysuccinimide 1-propanesulfonate ester, N-hydroxysuccinimide 2-propanesulfonate ester, N-hydroxysuccinimide 1-pentanesulfonate ester, N-hydroxysuccinimide p-toluenesulfonate ester, N-hydroxynaphthalimide methanesulfonate ester, and N-hydroxynaphthalimide benzenesulfonate ester are preferably used.

Further, an acid-generator of the oxime type as shown in WO2004/074242 may also be added.

Here, the acid-generators as mentioned above may be used singly or in a combination of two or more kinds. The onium salt is effective for improving a rectangular shape, and the diazomethane derivative and the glyoxime derivative are effective for reducing a standing wave, and thus a fine tuning of a profile may be possible by properly combining two of them.

The amount of the acid-generating material to be added is preferably 0.1 to 50 parts and more preferably 0.5 to 40 parts relative to 100 parts of the base resin. When the amount is 0.1 part or less, there is a risk of low sensitivity and resolution because the amount of the acid generated by an exposure is small, while when 50 parts or more, there is a risk of deterioration of the resolution, because transmittance of a resist is decreased. When both of the formula (P1a-1) and the formula (P1a-2) are used, the ratio of the formula (P1a-2) is preferably 0.001 to 1 part relative to 1 part of the formula (P1a-1).

As the dissolution inhibitor to be added to the chemically amplified positive resist composition in the present invention, a compound whose weight-average molecular weight is 100 to 1,000, preferably 150 to 800, and in addition, whose phenolic hydrogen atoms of two or more phenolic hydroxyl groups contained in the molecule are substituted by 0 to 100 mole % of the acid-labile group in average as a whole or whose hydrogen atoms of carboxyl group contained in the molecule is substituted by 50 to 100 mole % of the acid-labile group in average as a whole is preferable.

Here, the substitution rate of the hydrogen atom of the phenolic hydroxyl group by the acid-labile group is 0 mole % or more and preferably 30 mole % or more in average relative to total phenolic hydroxide groups, while the upper limit is 100 mole % and preferably 80 mole %. The substitution rate of the hydrogen atom of the carboxylic group by the acid-labile group is 50 mole % or more and preferably 70 mole % or more in average relative to total carboxylic groups, while the upper limit may be 100 mole %.

Here, the compound having two or more of the phenolic hydroxide group or the compound having the carboxylic group is preferably a compound represented by the following formulae (D1) to (D14)

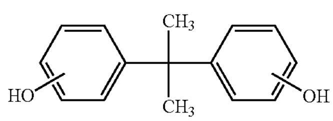

(D1)

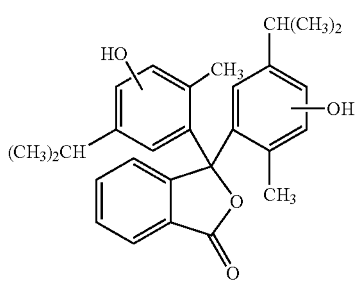

(D2)

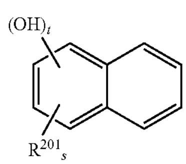

(D3)

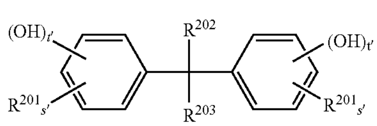

(D4)

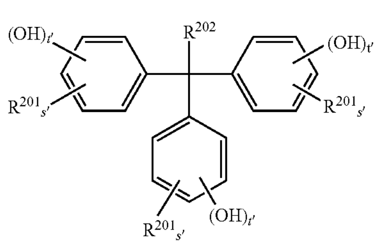

(D5)

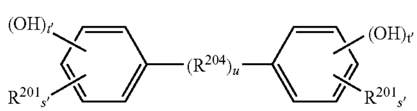

(D6)

-continued

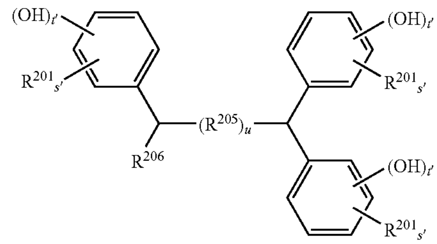

(D7)

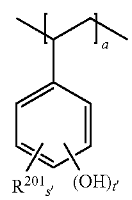

(D8)

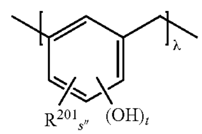

(D9)

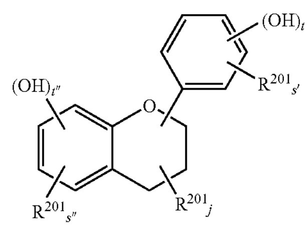

(D10)

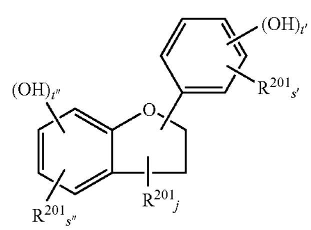

(D11)

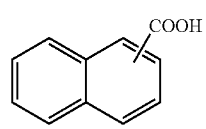

(D12)

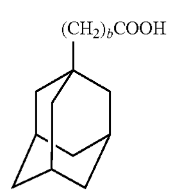

(D13)

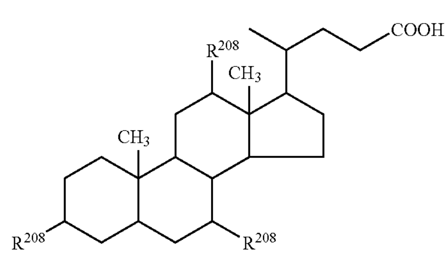

(D14)

Here, each of $R^{201}$ and $R^{202}$ in the above formula represents a hydrogen atom, an alkyl group or an alkenyl group, linear or branched, having 1 to 8 carbon atoms; $R^{203}$ represents a hydrogen atom, an alkyl group or an alkenyl group, linear or branched, having 1 to 8 carbon atoms, or —$(R^{207})_h$COOH; $R^{204}$ represents —$(CH_2)_i$— (i represents 2 to 10), an arylene group having 6 to 10 carbon atoms, a carbonyl group, a sulfonyl group, an oxygen atom, or a sulfur atom; $R^{205}$ represents an alkylene group having 1 to 10 carbon atoms, an arylene group having 6 to 10 carbon atoms, a carbonyl group, a sulfonyl group, an oxygen atom, or a sulfur atom; $R^{206}$ represents a hydrogen atom, a linear or a branched alkyl group having 1 to 8 carbon atoms, an alkenyl group, or a phenyl group or a naphthyl group each substituted by a hydroxyl group; $R^{207}$ represents a linear or a branched alkylene group having 1 to 10 carbon atoms; and $R^{208}$ represents a hydrogen atom or a hydroxyl group. Here, j represents an integer of 0 to 5; each of u and h represents 0 or 1; each of s, t, s', t', s", and t" satisfies the equations, s+t=8, s'+t'=5, s"+t"=4, and are the numbers giving at least one hydroxyl group to each phenyl skeleton; and $\alpha$ represents a number giving the molecular weight of 100 to 1,000 to a compound represented by the formulae (D8) and (D9).

The amount of the dissolution inhibitor to be blended is 0 to 50 parts, preferably 5 to 50 parts, and further preferably 10 to 30 parts, relative to 100 parts of the base resin. It may be used singly or in a mixture of two or more kinds. When the amount is too small, there is a risk of a low resolution, and when the amount is too much, there is a risk of reduction in film loss of the pattern, which may lead to a lower resolution.

Further, the chemically amplified positive resist composition in the present invention may contain a basic compound.

The basic compound is preferably the one, which can suppress a diffusion rate of the acid generated from the acid generator into a resist film. By blending the basic compound, the diffusion rate of the acid in the resist film may be suppressed, thereby leading to improving the resolution, to suppressing a sensitivity change after exposure, to reducing a dependency on a substrate and an environment, and to improving an exposure allowance, a pattern profile, and the like.

The basic compound may be exemplified by a primary, a secondary, and a tertiary aliphatic amine, a mixed amine, an aromatic amine, a heterocyclic amine, a compound containing nitrogen which has a carboxy group, a compound containing nitrogen which has a sulfonyl group, a compound containing nitrogen which has a hydroxyl group, a compound containing nitrogen which has a hydroxyphenyl group, an alcoholic compound containing nitrogen, an amide derivative, an imide derivative, and the like.

Specific examples of the primary aliphatic amine include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Specific examples of the secondary aliphatic amine include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylene diamine, N,N-dimethylethylene diamine, and N,N-dimethyltetraethylene pentamine. Specific examples of the tertiary aliphatic amine include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylene diamine, N,N,N',N'-tetramethylethylene diamine, and N,N,N',N'-tetramethyltetraethylene pentamine.

The mixed amine may be exemplified by dimethylethylamine, methylethylpropylamine, benzylamine, phenethylamine, benzyldimethylamine, and the like.

Specific examples of the aromatic amine and the heterocyclic amine include an aniline derivative (such as aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, a pyrrole derivative (such as pyrrole, 2H-pyrrole, 1-methylpyrrole, 2,4-dimethylpyrrole, 2,5-dimethylpyrrole, and N-methylpyrrole), a oxazole derivative (such as oxazole and isooxazole), a thiazole derivative (such as thiazole and isothiazole), an imidazole derivative (such as imidazole, 4-methylimidazole, and 4-methyl-2-phenylimidazole), a pyrazole derivative, a furazan derivative, a pyrroline derivative (such as pyrroline and 2-methyl-1-pyrroline), a pyrrolidine derivative (such as pyrrolidine, N-methylpyrrolidine, pyrrolidinone, and N-methylpyrrolidone), an imidazoline derivative, an imidazolidine derivative, a pyridine derivative (such as pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(l-ethylpropyl)pyridine, aminopyridine, and dimethylaminopyridine), a pyridazine derivative, a pyrimidine derivative, a pyrazine derivative, a pirazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (such as quinoline and 3-quinolinecarbonitrile), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, a 1,10-phenanthroline derivative, an adenine derivative, an adenosine derivative, a guanine derivative, a guanosine derivative, an uracil derivative, and an uridine derivative.

Further, examples of the compound containing nitrogen which has a carboxy group include amino benzoic acid, indole carboxylic acid, and an amino acid derivative (such as nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, and methoxy alanine). Examples of the compound containing nitrogen which has a sulfonyl group include 3-pyridinesulfonic acid and pyridinium p-toluenesulfonate. Examples of the compound containing nitrogen which has a hydroxyl group, the compound containing nitrogen which has a hydroxyphenyl group, and the alcoholic compound containing nitrogen include 2-hydroxy pyridine, amino cresol, 2,4-quinoline diol, 3-indole methanol hydrate, monoethanol amine, diethanol amine, triethanol amine, N-ethyl diethanol amine, N,N-diethyl ethanol amine, triisopropanol amine, 2,2'-imino diethanol, 2-amino ethanol, 3-amino-1-propanol, 4-amino-1-butanol, 4-(2-hydroxyethyl) morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propane diol, 3-pyrrolidino-1,2-propane diol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotine amide.

Examples of the amide derivative include formamide, N-methyl formamide, N,N-dimethyl formamide, acetamide, N-methyl acetamide, N,N-dimethyl acetamide, propione amide, and benzamide.

Examples of the imide derivative include phthalimide, succine imide, and maleimide.

Further, a compound selected from the basic compounds represented by the following general formula (B)-1 may be added singly, or in a combination of two or more kinds:

$$N(X)_n(Y)_{3-n} \qquad (B)\text{-}1$$

Wherein, n represents 1, 2, or 3. The side-chain X may be the same or different, and represented by the following general formulae (X1) to (X3). The side chain Y may be the same or different, representing a hydrogen atom, a linear, a branched, or a cyclic alkyl group having 1 to 20 carbon atoms, and optionally containing an ether group or a hydroxyl group. Further, X may form a ring by connecting with each other, together with a nitrogen atom to which these groups are bonded.

$$-\!\!\left[R^{300}-O-R^{301}\right] \qquad (X1)$$

$$-\!\!\left[R^{302}-O-R^{303}-\overset{\overset{\displaystyle O}{\|}}{C}-R^{304}\right] \qquad (X2)$$

$$-\!\!\left[R^{305}-\overset{\overset{\displaystyle O}{\|}}{C}-O-R^{306}\right] \qquad (X3)$$

Here, each of $R^{300}$, $R^{302}$, and $R^{305}$ represents a linear or a branched alkylene group having 1 to 4 carbon atoms; each of $R^{301}$ and $R^{304}$ represents a hydrogen atom, a linear, a branched, or a cyclic alkyl group having 1 to 20 carbon atoms, and optionally containing one or plural kinds selected from a hydroxyl group, an ether group, an ester group, and a lactone ring.

$R^{303}$ represents a single bond, a linear or a branched alkylene group having 1 to 4 carbon atoms; and $R^{306}$ represents a linear, a branched, or a cyclic alkyl group having 1 to 20 carbon atoms, and optionally containing one or plural kinds selected from a hydroxyl group, an ether group, an ester group, and a lactone ring.

Specific examples of the compound represented by the general formula (B)-1 include tris(2-methoxymethoxyethyl) amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris{2-[2-(2-hydroxyethoxy)ethoxy]ethyl}amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl) amine, tris(2-valeryloxyethyl)amine, tris(2-pivaloyloxyethyl)amine, N,N-bis(2-acetoxyethyl) 2-(acetoxyacetoxy) ethyl amine, tris(2-methoxycarbonyloxyethyl)amine, tris(2-tert-butoxycarbonyloxyethyl)amine, tris[2-(2-oxopropoxy) ethyl]amine, tris[2-(methoxycarbonylmethyl)oxyethyl] amine, tris[2-(tert-butoxycarbonylmethyloxy)ethyl]amine, tris[2-(cyclohexyloxycarbonylmethyloxy)ethyl]amine, tris (2-methoxycarbonylethyl)amine, tris(2-ethoxycarbonylethyl)amine, N,N-bis(2-hydroxyethyl) 2-(methoxycarbonyl) ethyl amine, N,N-bis(2-acetoxyethyl) 2-(methoxycarbonyl) ethyl amine, N,N-bis(2-hydroxyethyl) 2-(ethoxycarbonyl) ethyl amine, N,N-bis(2-acetoxyethyl) 2-(ethoxycarbonyl) ethyl amine, N,N-bis(2-hydroxyethyl) 2-(2-methoxyethoxycarbonyl)ethyl amine, N,N-bis(2-acetoxyethyl) 2-(2-methoxyethoxycarbonyl)ethyl amine, N,N-bis(2-hydroxyethyl) 2-(2-hydroxyethoxycarbonyl) ethyl amine, N,N-bis(2-acetoxyethyl) 2-(2-acetoxyethoxycarbonyl)ethyl amine, N,N-bis(2-hydroxyethyl) 2-[(methoxycarbonyl)methoxycarbonyl]ethyl amine, N,N-bis(2-acetoxyethyl) 2-[(methoxycarbonyl)methoxycarbonyl]ethyl amine, N,N-bis(2-hydroxyethyl) 2-(2-oxopropoxycarbonyl) ethyl amine, N,N-bis(2-acetoxyethyl) 2-(2-oxopropoxycarbonyl)ethyl amine, N,N-bis(2-hydroxyethyl) 2-(tetrahydrofurfuryloxycarbonyl)ethyl amine, N,N-bis(2-acetoxyethyl) 2-(tetrahydrofurfuryloxycarbonyl)ethyl amine, N,N-bis(2-hydroxyethyl) 2-[(2-oxotetrahydrofurane-3-yl)oxycarbonyl] ethyl amine, N,N-bis(2-acetoxyethyl) 2-[(2-oxotetrahydrofurane-3-yl)oxycarbonyl]ethyl amine, N,N-bis(2-hydroxyethyl) 2-(4-hydroxybutoxycarbonyl)ethyl amine, N,N-bis(2-formyloxyethyl) 2-(4-formyloxybutoxycarbonyl) ethyl amine, N,N-bis(2-formyloxyethyl) 2-(2-formyloxyethoxycarbonyl)ethyl amine, N,N-bis(2-methoxyethyl) 2-(methoxycarbonyl)ethyl amine, N-(2-hydroxyethyl) bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis [2-(methoxycarbonyl)ethyl]amine, N-(3-acetoxy-1-propyl) bis[2-(methoxycarbonyl)ethyl]amine, N-(2-methoxyethyl) bis[2-(methoxycarbonyl)ethyl]amine, N-butyl bis[2-(methoxycarbonyl)ethyl]amine, N-butyl bis[2-(2-methoxyethoxycarbonyl)ethyl]amine, N-methyl bis(2-acetoxyethyl)amine, N-ethyl bis(2-acetoxyethyl)amine, N-methyl bis(2-pivaloyloxyethyl)amine, N-ethyl bis[2-(methoxycarbonyloxy)ethyl]amine, N-ethyl bis[2-(tert-butoxycarbonyloxy)ethyl]amine, tris(methoxycarbonylmethyl) amine, tris(ethoxycarbonylmethyl)amine, N-butyl bis (methoxycarbonylmethyl)amine, N-hexyl bis (methoxycarbonylmethyl)amine, and β-(diethylamino)-δ-valerolactone, but the compound is not restricted to them.

Further, a basic compound having a ring structure represented by the following general formula (B)-2 may also be added singly or in a combination of two or more kinds:

(B)-2

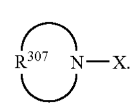

Wherein, X represents the same meanings as before; and $R^{307}$ represents a linear or a branched alkylene group having 2 to 20 carbon atoms, and optionally containing one or plural kinds selected from a carbonyl group, an ether group, an ester group, and a sulfide group.

Specific examples of the general formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-{2-[(2-methoxyethoxy)methoxy]ethyl}pyrrolidine, 1-{2-[(2-methoxyethoxy)methoxy]ethyl}piperidine, 4-{2-[(2-methoxyethoxy)methoxy]ethyl}morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofurane-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Further, a basic compound containing a cyano group represented by the following general formulae (B)-3 to (B)-6 may be added:

(B)-3

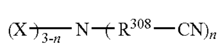

(B)-4

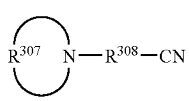

(B)-5

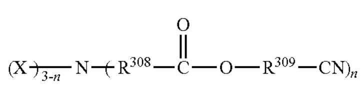

(B)-6

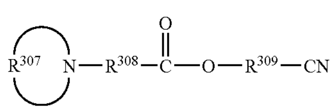

Wherein, X, $R^{307}$, and n represent the same meanings as before; and each of $R^{308}$ and $R^{309}$ represents the same or different linear or branched alkylene group having 1 to 4 carbon atoms.

Specific examples of the basic compound containing a cyano group include 3-(diethylamino)propiononitrile, N,N-bis(2-hydroxyethyl)-3-amino propiononitrile, N,N-bis(2-acetoxyethyl)-3-amino propiononitrile, N,N-bis(2-formyloxyethyl)-3-amino propiononitrile, N,N-bis(2-methoxyethyl)-3-amino propiononitrile, N,N-bis[2-(methoxymethoxy)ethyl]-3-amino propiononitrile, methyl N-(2-cyanoethyl)-N-(2-methoxyethyl)-3-amino propionate, methyl N-(2-cyanoethyl)-N-(2-hydroxyethyl)-3-amino propionate, methyl N-(2-acetoxyethyl)-N-(2-cyanoethyl)-3-amino propionate, N-(2-cyanoethyl)-N-ethyl-3-amino propiononitrile, N-(2-cyanoethyl)-N-(2-hydroxyethyl)-3-amino propiononitrile, N-(2-acetoxyethyl)-N-(2-cyanoethyl)-3-amino propiononitrile, N-(2-cyanoethyl)-N-(2-formyloxyethyl)-3-amino propiononitrile, N-(2-cyanoethyl)-N-(2-methoxyethyl)-3-amino propiononitrile, N-(2-cyanoethyl)-N-[2-(methoxymethoxy)ethyl]-3-amino propiononitrile, N-(2-cyanoethyl)-N-(3-hydroxy-1-propyl)-3-amino propiononitrile, N-(3-acetoxy-1-propyl)-N-(2-cyanoethyl)-3-amino propiononitrile, N-(2-cyanoethyl)-N-(3-formyloxy-1-propyl)-3-amino propiononitrile, N-(2-cyanoethyl)-N-tetrahydrofurfuryl-3-amino propiononitrile, N,N-bis(2-cyanoethyl)-3-amino propiononitrile, diethylamino acetonitrile, N,N-bis(2-hydroxyethyl)amino acetonitrile, N,N-bis(2-acetoxyethyl)amino acetonitrile, N,N-bis(2-formyloxyethyl)amino acetonitrile, N,N-bis(2-methoxyethyl)amino acetonitrile, N,N-bis[2-(methoxymethoxy)ethyl]amino acetonitrile, methyl N-cyanomethyl-N-(2-methoxyethyl)-3-amino propionate, methyl N-cyanomethyl-N-(2-hydroxyethyl)-3-amino propionate, methyl N-(2-acetoxyethyl)-N-cyanomethyl-3-amino propionate, N-cyanomethyl-N-(2-hydroxyethyl)amino acetonitrile, N-(2-acetoxyethyl)-N-(cyanomethyl)amino acetonitrile, N-cyanomethyl-N-(2-formyloxyethyl)amino acetonitrile, N-cyanomethyl-N-(2-methoxyethyl)amino acetonitrile, N-cyanomethyl-N-[2-(methoxymethoxy)ethyl]amino acetonitrile, N-(cyanomethyl)-N-(3-hydroxy-1-propyl)amino acetonitrile, N-(3-acetoxy-1-propyl)-N-(cyanomethyl)amino acetonitrile, N-cyanomethyl-N-(3-formyloxy-1-propyl)amino acetonitrile, N,N-bis(cyanomethyl)aminoacetonitrile, 1-pyrrolidine propiononitrile, 1-piperidine propiononitrile, 4-morpholine propiononitrile, 1-pyrrolidine acetonitrile, 1-piperidine acetonitrile, 4-morpholine acetonitrile, cyanomethyl 3-diethylamino propionate, cyanomethyl N,N-bis(2-hydroxyethyl)-3-amino propionate, cyanomethyl N,N-bis(2-acetoxyethyl)-3-amino propionate, cyanomethyl N,N-bis(2-formyloxyethyl)-3-amino propionate, cyanomethyl N,N-bis(2-methoxyethyl)-3-amino propionate, cyanomethyl N,N-bis[2-(methoxymethoxy)ethyl)]-3-amino propionate, 2-cyanoethyl 3-diethylamino propionate, 2-cyanoethyl N,N-bis(2-hydroxyethyl)-3-amino propionate, 2-cyanoethyl N,N-bis(2-acetoxyethyl)-3-amino propionate, 2-cyanoethyl N,N-bis(2-formyloxyethyl)-3-amino propionate, 2-cyanoethyl N,N-bis(2-methoxyethyl)-3-amino propionate, 2-cyanoethyl N,N-bis[2-(methoxymethoxy)ethyl)]-3-amino propionate, cyanomethyl 1-pyrrolidine propionate, cyanomethyl 1-piperidine propionate, cyanomethyl 4-morpholine propionate, 2-cyanoethyl 1-pyrrolidine propionate, 2-cyanoethyl 1-piperidine propionate, and 2-cyanoethyl 4-morpholine propionate.

It may also be allowed to add a polymer having an amino group and a fluoroalkyl group as a repeating unit.

This polymer is orientated on a resist surface after coating, thereby inhibiting the film loss of the resist pattern after development and rendering higher rectangularity properties. If the film loss takes place in a dot pattern after development, there is a problem of poor image reversal in some cases. Addition of the following polymers is effective to inhibit the pattern film loss:

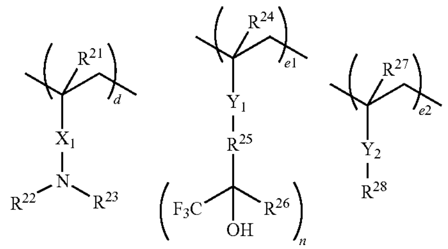

Wherein, each of $R^{21}$, $R^{24}$, and $R^{27}$ independently represents a hydrogen atom or a methyl group. Each of $X_1$, $Y_1$, and $Y_2$, independently represents a single bond, —O—$R^{29}$—, —C(+O)—O—$R^{29}$—, or —C(═O)—NH—$R^{29}$—, a linear or a branched alkylene group having 1 to 4 carbon atoms, or a phenylene group; and $R^{29}$ represents a linear, a branched, or a cyclic alkylene group having 1 to 10 carbon atoms optionally containing an ester group or an ether group. Here, n represents 1 or 2, and when n=1, $Y_1$ represents a single bond, —O—$R^{29}$—, —C(═O)—O—$R^{29}$—, —C(═O)—NH—$R^{29}$—, a linear or a branched alkylene group having 1 to 4 carbon atoms, or a phenylene group; and $R^{29}$ represents the same meaning as above. When n=2, $Y_1$ represents —O—$R^{31}$═, —C(═O)—O—$R^{31}$═, —C(═O)—NH—$R^{31}$═, a linear or a branched alkylene group having 1 to 4 carbon atoms from which one hydrogen atom is removed, or a phenylene group from which one hydrogen atom is removed; $R^{31}$ represents a linear, a branched, or a cyclic alkylene group, from which one hydrogen atom is removed, having 1 to 10 carbon atoms, optionally containing an ester group or an ether group; and $R^{22}$ and $R^{23}$ may be the same or different and represent a hydrogen atom, a linear, a branched, or a cyclic alkyl group having 1 to 20 carbon atoms, or an alkenyl group having 2 to 20 carbon atoms, optionally containing a hydroxyl group, an ether group, an ester group, a cyano group, an amino group, a double bond, or a halogen atom, or an aryl group having 6 to 10 carbon atoms, wherein $R^{22}$ and $R^{23}$ may form a ring having 3 to 20 carbon atoms together with a nitrogen atom to which these groups are bonded. $R^{25}$ represents a linear, a branched, or a cyclic alkylene group having 1 to 12 carbon atoms; and $R^{26}$ represents a hydrogen atom, a fluorine atom, a methyl group, a trifluoromethyl group, or a difluoromethyl group, and may form an aliphatic ring having 2 to 12 carbon atoms with $R^{25}$ and carbons to which $R^{25}$ and $R^{26}$ are bonded, wherein the ring may contain an ether group, a fluorine-substituted alkylene group, or a trifluoromethyl group. $R^{28}$ represents a linear, a branched, or a cyclic alkyl group having 1 to 20 carbon atoms, which is substituted by at least one fluorine atom, and may contain an ether group, an ester group, or a sulfonamide group. Here, $0<d<1.0$, $0\leqq e1<1.0$, $0\leqq e2<1.0$, $0<e1+e2<1.0$, and $0.5\leqq d+e1+e2\leqq 1.0$.

Here, the amount of the basic compound to be blended is preferably 0.001 to 2 parts, in particular 0.01 to 1 part, relative to 100 parts of the base resin. When the amount is 0.001 part or less, the blending effect is poor, and when the amount is 2 parts or more, there is a risk of lowering the resolution.

As a compound having a ≡C—COOH group in its molecule which may be added to the chemically amplified positive resist composition used in the patterning process of the present invention, there may be mentioned one kind or two or more kinds of the compounds selected from the following Group I and Group II, but it is not limited to them. By blending this component, the PED (Post Exposure Delay) stability of the resist is increased, thus an edge roughness on a substrate nitride film is improved.

[Group I]

Compounds represented by the following general formulae (A1) to (A10) a part of or all of whose hydrogen atom of a phenolic hydroxyl group is substituted by —$R^{401}$—COOH ($R^{401}$ represents a linear or a branched alkylene group having 1 to 10 carbon atoms), and the mole ratio of whose phenolic hydroxyl group (C) and ≡C—COOH (D), namely C/(C+D) is 0.1 to 1.0.

(A1)

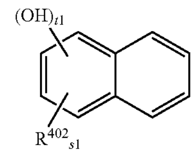

(A2)

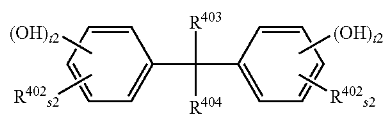

(A3)

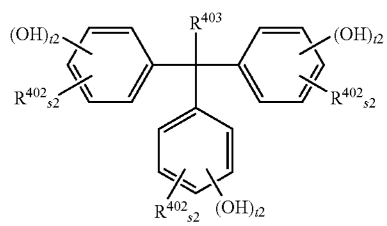

(A4)

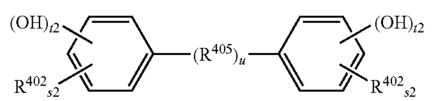

(A5)

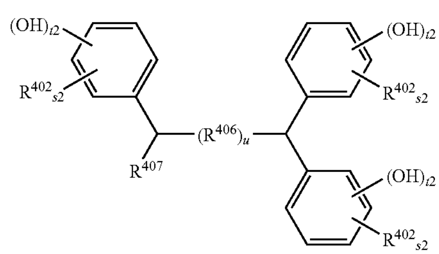

(A6)

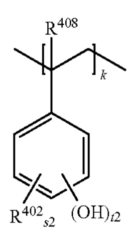

(A7)

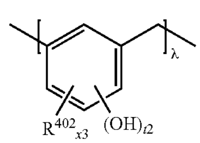

-continued (A8)

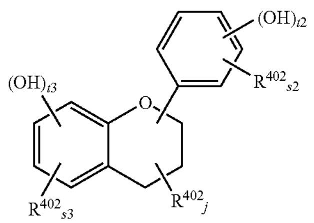

(A9)

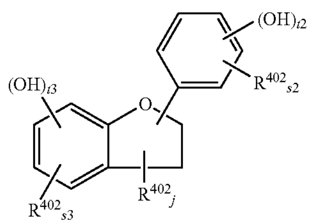

(A10)

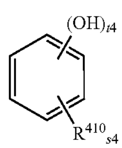

Wherein, $R^{408}$ represents a hydrogen atom or a methyl group. Each of $R^{402}$ and $R^{403}$ represents a hydrogen atom, a linear or a branched alkyl group or alkenyl group having 1 to 8 carbon atoms; $R^{404}$ represents a hydrogen atom, a linear or a branched alkyl group or alkenyl group having 1 to 8 carbon atoms, or —$(R^{409})_h$—COOR' (R' represents a hydrogen atom or —$R^{409}$—COOH); $R^{405}$ represents —$(CH_2)_i$— (i represents 2 to 10), an arylene group having 6 to 10 carbon atoms, a carbonyl group, a sulfonyl group, an oxygen atom, or a sulfur atom; $R^{406}$ represents an alkylene group having 1 to 10 carbon atoms, an arylene group having 6 to 10 carbon atoms, a carbonyl group, a sulfonyl group, an oxygen atom, or a sulfur atom; $R^{407}$ represents a hydrogen atom, a linear or a branched alkyl group having 1 to 8 carbon atoms, an alkenyl group, or a phenyl group or a naphthyl group each substituted by a hydroxyl group; $R^{409}$ represents an alkyl group or an alkenyl group, linear or branched, having 1 to 10 carbon atoms, or —$R^{411}$—COOH; $R^{410}$ represents a hydrogen atom, an alkyl group or an alkenyl group, linear or branched, having 1 to 8 carbon atoms, or —$R^{411}$—COOH; and $R^{411}$ represents a linear or a branched alkylene group having 1 to 10 carbon atoms. Here, h represents an integer of 1 to 4; j represents 0 to 3; each of s1 to s4 and t1 to t4 satisfies the equations s1+t1=8, s2+t2=5, s3+t3=4, s4+t4=6, and are the numbers giving at least one hydroxyl group in each phenyl skeletons; u represents an integer of 1 to 4; K represents a number giving the weight-average molecular weight of 1,000 to 5,000 to a compound represented by the formula (A6); λ represents a number giving the weight-average molecular weight of 1,000 to 10,000 to a compound represented by the formula (A7).

[Group II]

Compounds represented by the following general formulae (A11) to (A15).

(A11)

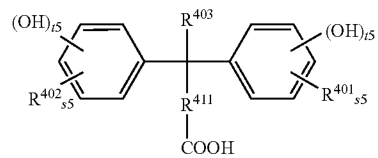

(A12)

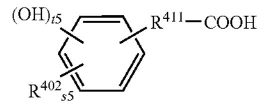

(A13)

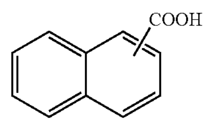

(A14)

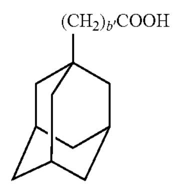

(A15)

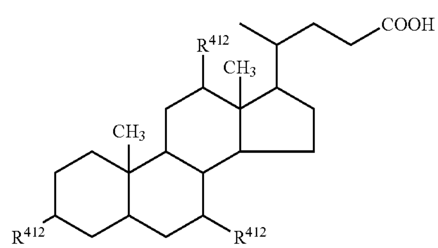

Wherein, $R^{402}$, $R^{403}$ and $R^{411}$ represent the same meanings as before; and $R^{412}$ represents a hydrogen atom or a hydroxyl group. Here, s5 and t5 are the numbers satisfying equations $s5 \geqq 0$, $t5 \geqq 0$, and s5+t5=5, and h' represents 0 or 1.

Specific examples of this component include the compounds represented by the following general formulae (AI-1) to (AI-14) and (AII-1) to (AII-10), but the components are not restricted to them.

(AI-1)

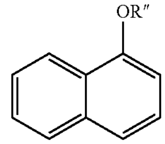

(AI-2)

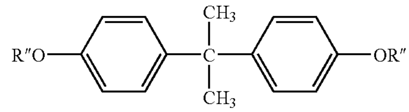

-continued
(AI-3)
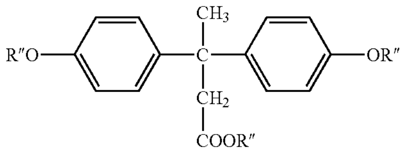
(AI-4)
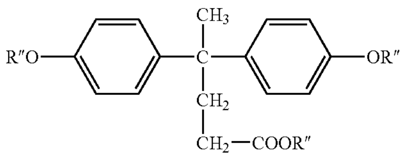
(AI-5)
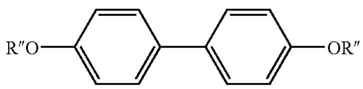
(AI-6)
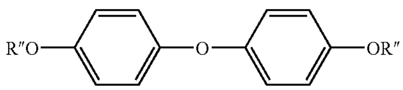
(AI-7)
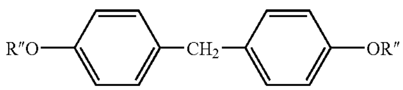
(AI-8)
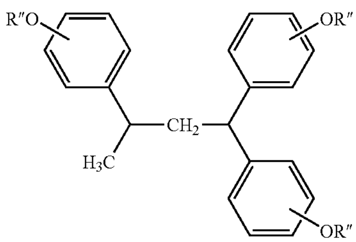
(AI-9)
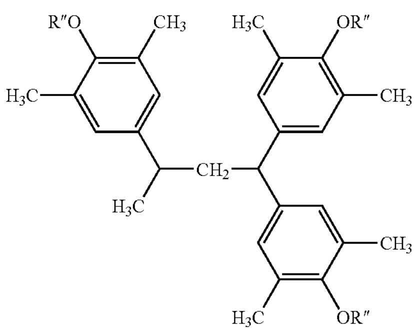
(AI-10)
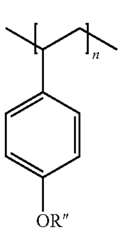
(AI-11)
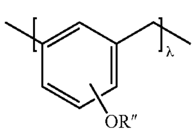
-continued
(AI-12)
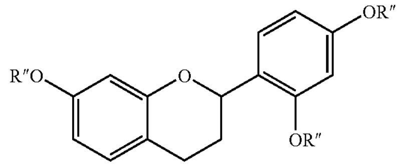
(AI-13)
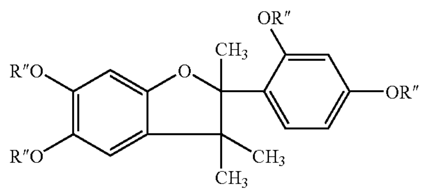
(AI-14)
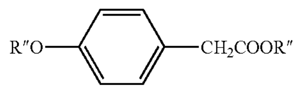
Wherein, R" represents a hydrogen atom or —$CH_2COOH$, wherein 10 to 100 mole % of R" in each compound is —$CH_2COOH$. Here, κ and λ represent the same meanings as before.
(AII-1)
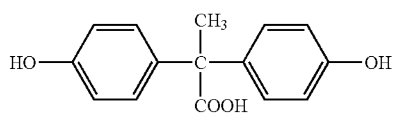
(AII-2)
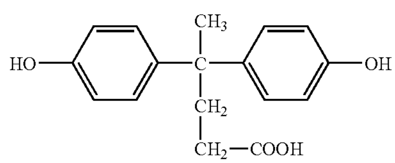
(AII-3)
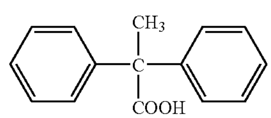
(AII-4)
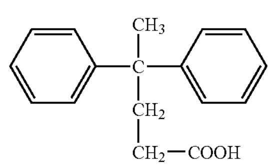
(AII-5)
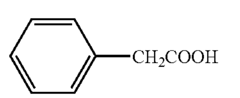
(AII-6)
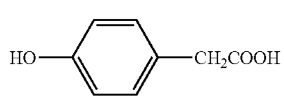
(AII-7)
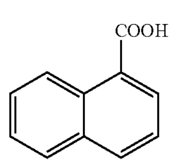

-continued (AI-8)

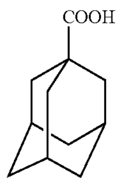

(AII-9)

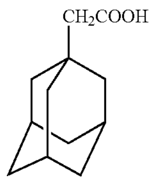

(AII-10)

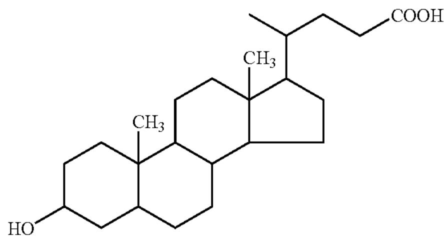

The amount of the compound having ≡C—COOH in its molecule to be added is 0 to 5 parts, preferably 0.1 to 5 parts, further preferably 0.1 to 3 parts, and further more preferably 0.1 to 2 parts, relative to 100 parts of the base resin. When the amount is more than 5 parts, there is a risk of deterioration of the resolution of the resist composition.

The chemically amplified positive resist composition used in the patterning process of the present invention may further contain a surfactant to increase the coating properties.

The surfactant to be added in the present invention is not particularly restricted, but may be exemplified by a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenyl ether and polyoxyethylene nonylphenyl ether; a polyoxyethylene polyoxypropylene block copolymer; a sorbitane aliphatic acid ester such as sorbitane monolaurate, sorbitane monovalmitate, and sorbitane monostearate; a nonionic surfactant of a polyoxyethylene sorbitane aliphatic acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Tochem Products Co., Ltd.), Megafac F171, F172, and F173 (manufactured by Dainippon Ink & Chemicals, Inc.), Flolade FC-430, FC-431, and FC-4430 (manufactured by Sumitomo 3M Ltd.), Asahi Guard AG710, Surflon S-381, S-382, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Yushikagaku Kogyo K. K.). Among them, FC-430, FC-4430, Surflon S-381, Surfinol E1004, KH-20, and KH-30 are preferable. These may be used singly or in a combination of two or more kinds.

The amount of the surfactant in the chemically amplified positive resist composition used in the patterning process of the present invention is 2 parts or less, and preferably 1 part or less, relative to 100 parts of the base resin in the resist composition.

On the other hand, as a reverse film, a composition for formation of a reverse film containing an organic silicon compound having a siloxane bond is used. This composition for formation of a reverse film may contain an oxide of an element belonging to Group III, Group IV, and Group V other than a silicon atom. A reverse film with the dissolution rate into an alkaline wet-etching liquid (alkaline developer) used in the reverse step of the embodiment being 0.02 to 2 nanometers/second, preferably 0.05 to 1 nanometer/second is used. When the dissolution rate is slower than 0.02 nanometer/second, a reverse film is not dissolved till the head of the first positive resist pattern, thereby requiring longer time, which might result in poor pattern reversal and formation of head projections on a reversed pattern surface. When the rate is faster than 2 nanometers/second, there are possibilities of giving disadvantages such as that a remaining reverse film is reduced and hole sizes in the reversed pattern is increased.

Accordingly, in order to form a trench pattern by arbitrarily dissolving the film surface during alkaline development in particular, the alkali-dissolution rate is made preferably in the range of 0.05 nanometer/second or faster and 1 nanometer/second or slower. When the rate is faster than this, a film loss at a time of development is too large, and when the rate is slower than this, the surface film is not dissolved, which might result in not opening the trench pattern. To control the dissolution rate arbitrarily, a material with an optimum dissolution rate may be made by copolymerizing a unit having the alkali-dissolution rate of 1 nanometer/second or faster and a unit having the alkali-dissolution rate of 0.05 nanometer/second or slower in an optimum copolymerization ratio.

A reverse film used in the patterning process of the embodiment with the dissolution rate into an alkaline developer being 0.02 nanometers/second or faster to 2 nanometers/second or slower may be formed by using a composition for formation of a reverse film containing an organic silicon compound having at least a siloxane bond and optionally an oxide of an element belonging to Group III, Group IV, and Group V other than a silicon atom.

The organic silicon compound having a siloxane bond used in the composition may be obtained by a hydrolysis-condensation reaction of a monomer. A preferable preparation method of it will be shown below, but not restricted to them.

The monomer of the organic silicon-containing compound may be represented by the following general formula (11):

$$R^{41}_{m1}R^{42}_{m2}R^{43}_{m3}Si(OR^{40})_{(4-m1-m2-m3)} \quad (11)$$

Wherein, $R^{40}$ represents a hydrogen atom, and an alkyl group having. 1 to 6, in particular 1 to 3, carbon atoms. Each of $R^{41}$, $R^{42}$, and $R^{43}$ represents a hydrogen atom and a monovalent organic group having 1 to 30 carbon atoms, wherein each of m1, m2, and m3 is 0 or 1, m1+m2+m3 is an integer of 0 to 3, preferably 0 or 1 in particular.

By "organic group" is meant that a group contains a carbon, and in addition, a hydrogen, and optionally, a nitrogen, an oxygen, a sulfur, a silicon, a fluorine, and the like. Examples of the organic group in $R^{41}$, $R^{42}$, and $R^{43}$ include a hydrogen atom, an unsubstituted monovalent hydrocarbon group such as a linear, a branched, or a cyclic alkyl group, an alkenyl group, an alkynyl group, an aryl group, and an aralkyl group, and one or more of whose hydrogen atom may be substituted by an epoxy group, an alkoxy group, a hydroxyl group, and the like, and intervened by —O—, —CO—, —OCO—, —COO—, and —OCOO—. In addition, an organic group containing a hexafluoro isopropanol group, a carboxyl group, a phenolic hydroxyl group, a silicon-silicon bond, and the like may be cited.

Examples of preferable $R^{41}$, $R^{42}$, and $R^{43}$ in monomers shown by the general formula (11) include a hydrogen atom; an alkyl group such as a methyl group, an ethyl group, a n-propyl group, an iso-propyl group, a n-butyl group, an iso-butyl group, a sec-butyl group, a tert-butyl group, a n-pentyl group, a 2-ehtylbutyl group, a 3-ethylbutyl group, a 2,2-diethyl propyl group, a cyclopentyl group, a n-hexyl group, and a cyclohexyl group; an alkenyl group such as a vinyl group and an allyl group; an alkynyl group such as an ethynyl group; an aryl group such as a phenyl group and a tolyl group; and an aralkyl group such as a benzyl group and a phenethyl group.

For example, a tetraalkoxy silane, where m1=0, m2=0, and m3=0, may be exemplified by tetramethoxysilane, tetraethoxysilane, tetra-n-propoxysilane, and tetra-iso-propoxysilane, while tetramethoxysilane and tetraethoxysilane are preferable.

For example, a trialkoxy silane, where m1=1, m2=0, and m3=0, may be exemplified by trimethoxysilane, triethoxysilane, tri-n-propoxysilane, tri-iso-propoxysilane, methyl trimethoxysilane, methyl triethoxysilane, methyl tri-n-propoxysilane, methyl tri-iso-propoxysilane, ethyl trimethoxysilane, ethyl triethoxysilane, ethyl tri-n-propoxysilane, ethyl tri-iso-propoxysilane, vinyl trimethoxysilane, vinyl triethoxysilane, vinyl tri-n-propoxysilane, vinyl tri-iso-propoxysilane, n-propyl trimethoxysilane, n-propyl triethoxysilane, n-propyl tri-n-propoxysilane, n-propyl tri-iso-propoxysilane, iso-propyl trimethoxysilane, iso-propyl triethoxysilane, iso-propyl tri-n-propoxysilane, iso-propyl tri-iso-propoxysilane, n-butyl trimethoxysilane, n-butyl triethoxysilane, n-butyl tri-n-propoxysilane, n-butyl tri-iso-propoxysilane, sec-butyl trimethoxysilane, sec-butyl triethoxysilane, sec-butyl tri-n-propoxysilane, sec-butyl tri-iso-propoxysilane, t-butyl trimethoxysilane, t-butyl triethoxysilane, t-butyl tri-n-propoxysilane, t-butyl tri-iso-propoxysilane, cyclopropyl trimethoxysilane, cyclopropyl triethoxysilane, cyclopropyl tri-n-propoxysilane, cyclopropyl tri-iso-propoxysilane, cyclobutyl trimethoxysilane, cyclobutyl triethoxysilane, cyclobutyl tri-n-propoxysilane, cyclobutyl tri-iso-propoxysilane, cyclopentyl trimethoxysilane, cyclopentyl triethoxysilane, cyclopentyl tri-n-propoxysilane, cyclopentyl tri-iso-propoxysilane, cyclohexyl trimethoxysilane, cyclohexyl triethoxysilane, cyclohexyl tri-n-propoxysilane, cyclohexyl tri-iso-propoxysilane, cyclohexenyl trimethoxysilane, cyclohexenyl triethoxysilane, cyclohexenyl tri-n-propoxysilane, cyclohexenyl tri-iso-propoxysilane, cyclohexenylethyl trimethoxysilane, cyclohexenylethyl triethoxysilane, cyclohexenyl ethyl tri-n-propoxysilane, cyclohexenylethyl tri-iso-propoxysilane, cyclooctanyl trimethoxysilane, cyclooctanyl triethoxysilane, cyclooctanyl tri-n-propoxysilane, cyclooctanyl tri-iso-propoxysilane, cyclopentadienyl propyl trimethoxysilane, cyclopentadienyl propyl triethoxysilane, cyclopentadienyl propyl tri-n-propoxysilane, cyclopentadienyl propyl tri-iso-propoxysilane, bicycloheptenyl trimethoxysilane, bicycloheptenyl triethoxysilane, bicycloheptenyl tri-n-propoxysilane, bicycloheptenyl tri-iso-propoxysilane, bicycloheptyl trimethoxysilane, bicycloheptyl triethoxysilane, bicycloheptyl tri-n-propoxysilane, bicycloheptyl tri-iso-propoxysilane, adamantyl trimethoxysilane, adamantyl triethoxysilane, adamantyl tri-n-propoxysilane, adamantyl tri-iso-propoxysilane, and the like. A monomer containing an aromatic group may be exemplified by phenyl trimethoxysilane, phenyl triethoxysilane, phenyl tri-n-propoxysilane, phenyl tri-iso-propoxysilane, benzyl trimethoxysilane, benzyl triethoxysilane, benzyl tri-n-propoxysilane, benzyl tri-iso-propoxysilane, tolyl trimethoxysilane, tolyl triethoxysilane, tolyl tri-n-propoxysilane, tolyl tri-iso-propoxysilane, phenetyl trimethoxysilane, phenetyl triethoxysilane, phenetyl tri-n-propoxysilane, phenetyl tri-iso-propoxysilane, naphtyl trimethoxysilane, naphtyl triethoxysilane, naphtyl tri-n-propoxysilane, naphtyl tri-iso-propoxysilane, and the like.

For example, dialkoxy silane, where m1=1, m2=1, and m3=0, may be exemplified by dimethyl dimethoxysilane, dimethyl diethoxysilane, methylethyl dimethoxysilane, methylethyl diethoxysilane, dimethyl di-n-propoxysilane, dimethyl di-isopropoxysilane, diethyl dimethoxysilane, diethyl diethoxysilane, diethyl di-n-propoxysilane, diethyl di-isopropoxysilane, di-n-propyl dimethoxysilane, di-n-propyl diethoxysilane, di-n-propyl di-n-propoxysilane, di-n-propyl di-isopropoxysilane, di-isopropyl dimethoxysilane, di-isopropyl diethoxysilane, di-isopropyl di-n-propoxysilane, di-isopropyl di-isopropoxysilane, di-n-butyl dimethoxysilane, di-n-butyl diethoxysilane, di-n-butyl di-n-propoxysilane, di-n-butyl di-isopropoxysilane, di-sec-butyl dimethoxysilane, di-sec-butyl diethoxysilane, di-sec-butyl di-n-propoxysilane, di-sec-butyl di-isopropoxysilane, di-t-butyl dimethoxysilane, di-t-butyl diethoxysilane, di-t-butyl di-n-propoxysilane, di-t-butyl di-isopropoxysilane, dicyclopropyl dimethoxysilane, dicyclopropyl diethoxysilane, dicyclopropyl di-n-propoxysilane, dicyclopropyl di-isopropoxysilane, dicyclobutyl dimethoxysilane, dicyclobutyl diethoxysilane, dicyclobutyl di-n-propoxysilane, dicyclobutyl di-isopropoxysilane, dicyclopentyl dimethoxysilane, dicyclopentyl diethoxysilane, dicyclopentyl di-n-propoxysilane, dicyclopentyl di-isopropoxysilane, dicyclohexyl dimethoxysilane, dicyclohexyl diethoxysilane, dicyclohexyl di-n-propoxysilane, dicyclohexyl di-isopropoxysilane, dicyclohexenyl dimethoxysilane, dicyclohexenyl diethoxysilane, dicyclohexenyl di-n-propoxysilane, dicyclohexenyl di-isopropoxysilane, dicyclohexenylethyl dimethoxysilane, dicyclohexenylethyl diethoxysilane, dicyclohexenylethyl di-n-propoxysilane, dicyclohexenylethyl di-isopropoxysilane, dicyclooctanyl dimethoxysilane, dicyclooctanyl diethoxysilane, dicyclooctanyl di-n-propoxysilane, dicyclooctanyl di-isopropoxysilane, dicyclopentadienylpropyl dimethoxysilane, dicyclopentadienylpropyl diethoxysilane, dicyclopentadienylpropyl di-n-propoxysilane, dicyclopentadienylpropyl di-isopropoxysilane, bis-bicycloheptenyl dimethoxysilane, bis-bicycloheptenyl diethoxysilane, bis-bicycloheptenyl di-n-propoxysilane, bis-bicycloheptenyl di-isopropoxysilane, bis-bicycloheptyl dimethoxysilane, bis-bicycloheptyl diethoxysilane, bis-bicycloheptyl di-n-propoxysilane, bis-bicycloheptyl di-isopropoxysilane, bis-adamantyl dimethoxysilane, bis-adamantyl diethoxysilane, bis-adamantyl di-n-propoxysilane, bis-adamantyl di-isopropoxysilane, and the like. A monomer containing an aromatic group may be exemplified by diphenyl dimethoxysilane, diphenyl diethoxysilane, methylphenyl dimethoxysilane, methylphenyl diethoxysilane, diphenyl di-n-propoxysilane, diphenyl di-isopropoxysilane, and the like.

For example, monoalkoxy silane, where m1=1, m2=1, and m3=1, may be exemplified by trimethyl methoxysilane, trimethyl ethoxysilane, dimethylethyl methoxysilane, dimethylethyl ethoxysilane, and the like. A monomer containing an aromatic group may be exemplified by dimethylphenyl methoxysilane, dimethylphenyl ethoxysilane, dimethylbenzyl methoxysilane, dimethylbenzyl ethoxysilane, dimethylphenethyl methoxysilane, dimethylphenethyl ethoxysilane, and the like.

A reverse Si-containing film needs to have a slight solubility into a developer. To control an alkaline solubility, a hydrophilic group such as a silanol group, a carboxyl group, a hydroxyl group, a phenolic hydroxyl group, an α-trifluoromethylhydroxyl group, and a lactone ring is necessary. A silanol group may be formed with releasing a hydrogen gas, when a compound, any or all of whose $R^{41}$, $R^{42}$, and $R^{43}$ in the formula (11) is a hydrogen atom, is contacted with an alkaline water. A silanol group may also be formed by a partial hydrolysis-condensation reaction of a monomer, thereby leading to partial formation of a siloxane bond in the resulting polymer.

A repeating unit containing a carboxyl group, an α-trifluoromethylhydroxyl group, and a phenolic hydroxyl group may be represented by the following general formula (12).

(12)

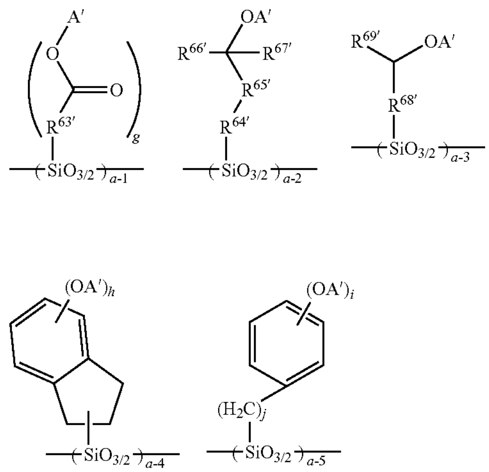

Wherein, each of $R^{63'}$, $R^{64'}$, and $R^{68'}$ represents a linear, a branched, or a cyclic alkylene group having 1 to 20 carbon atoms, an arylene group having 6 to 20 carbon atoms, and optionally substituted by a fluorine atom or a trifluoromethyl group; $R^{65'}$ represents a single bond, or, a linear, a branched alkyl group having 1 to 6 carbon atoms; each of $R^{66'}$ and $R^{67'}$ represents a hydrogen atom, a fluorine atom, or, a linear, or a branched alkyl group having 1 to 4 carbon atoms, and a fluorinated alkyl group, wherein at least either one of $R^{66'}$ and $R^{67'}$ contains one or more fluorine atom; $R^{69'}$ represents a fluorine atom or a trifluoromethyl group; and A' represents a hydrogen atom, or, a linear, a branched, or a cyclic alkyl group having 1 to 10 carbon atoms, and an acyl group, an alkoxycarbonyl group, or an acid-labile group. Here, each of g, h, and i represents 1 or 2, and j represents an integer of 0 to 4.

A repeating unit a-1 may be exemplified by the followings.

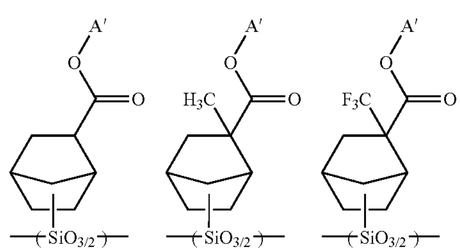

-continued

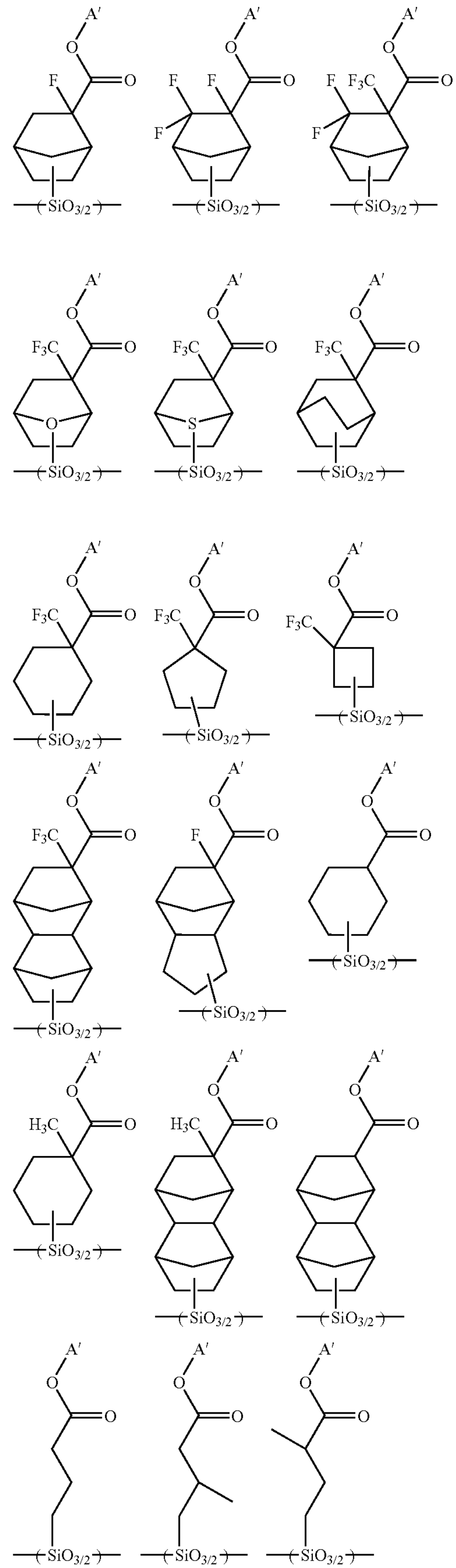

-continued
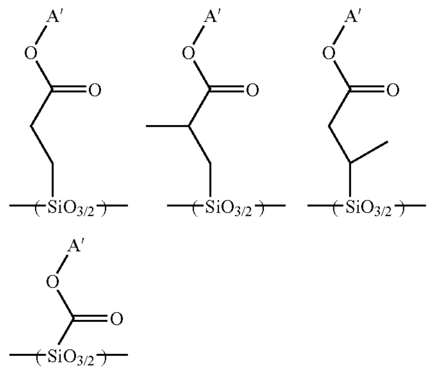
A repeating unit a-2 may be exemplified by the followings.
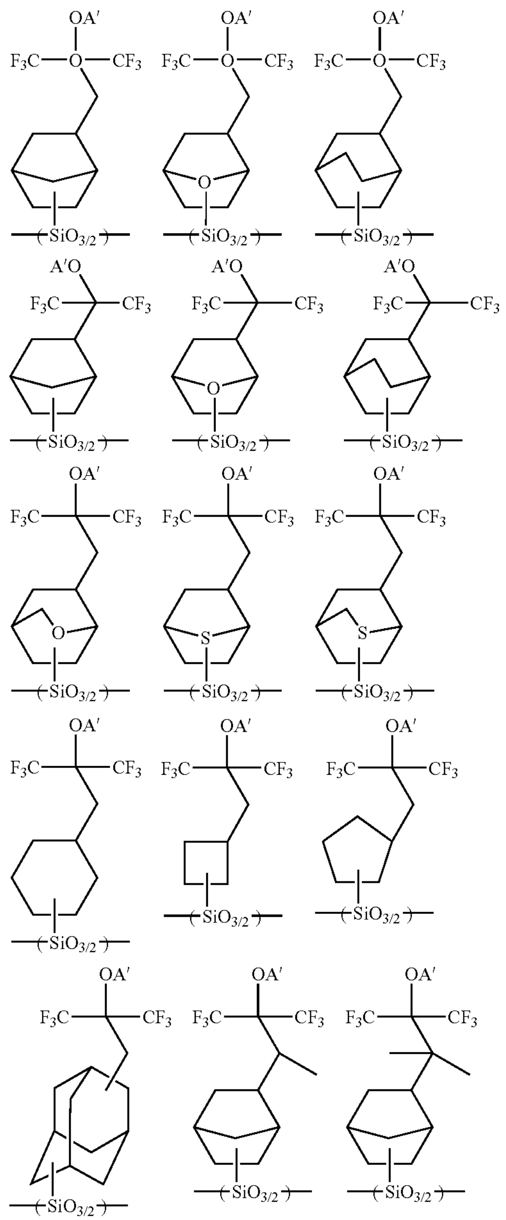
-continued
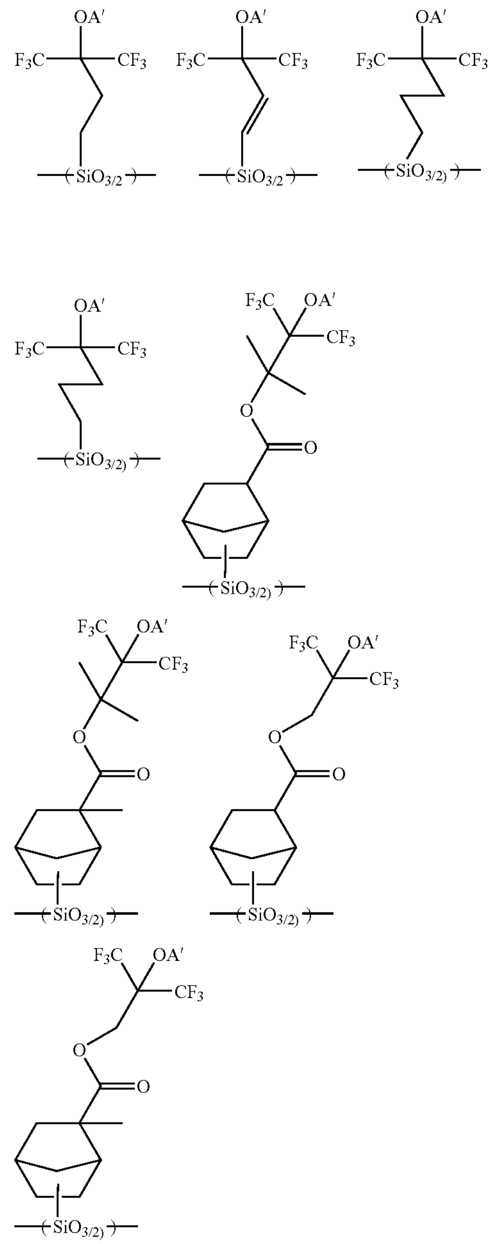
A repeating unit a-3 may be exemplified by the followings.
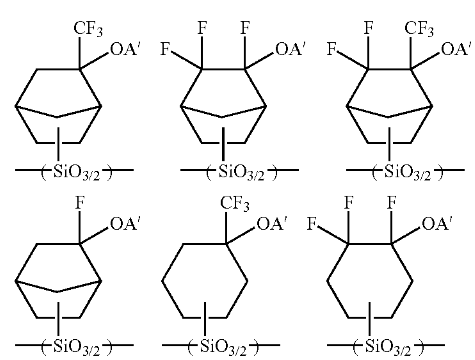

-continued

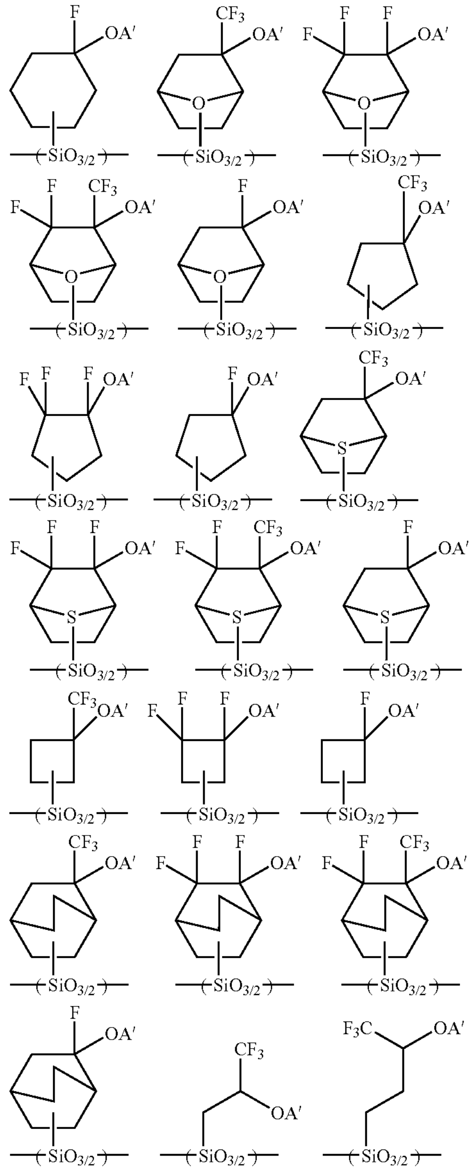

Repeating units a-4 and a-5 may be exemplified by the followings.

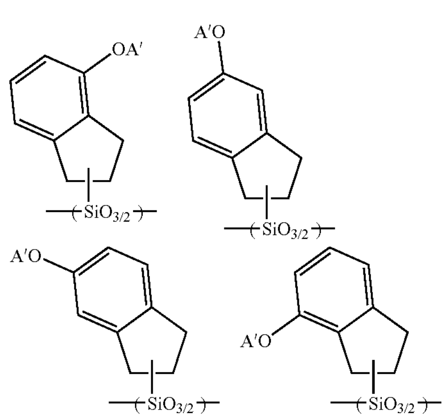

-continued

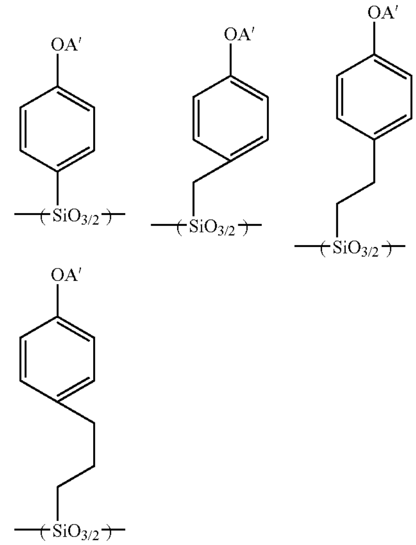

Polysilsesquioxane for a reverse film in the present invention may be copolymerized with, in addition to a repeating unit, rendering an improved alkaline solubility by an acid, represented by the general formula (11), other repeating unit having a hydrophilic group that renders adhesion property. An adhesive group is mainly composed of an oxygen atom such as an alcohol group, a carboxyl group, an ether group, an ester group, an acetyl group, a formyl group, a carbonate group, a lactone ring, a sulfonamide group, a cyano group, and a carboxylic acid anhydride group.

Specific examples may be as followings.

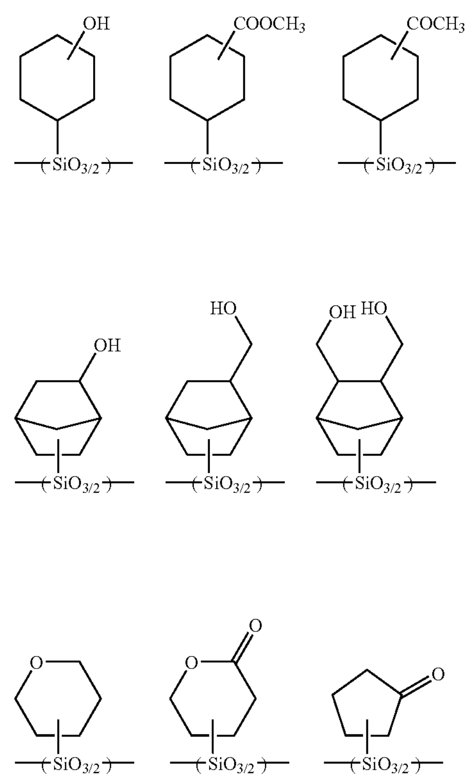

-continued
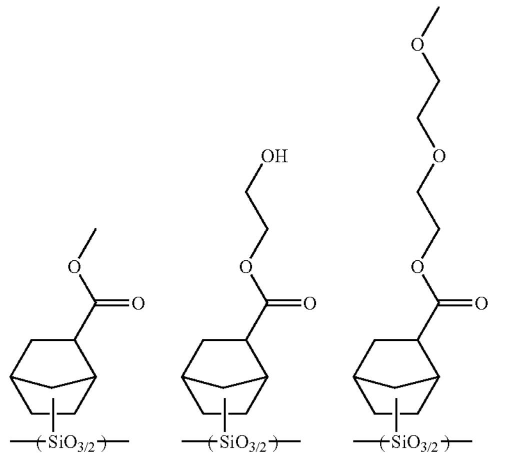
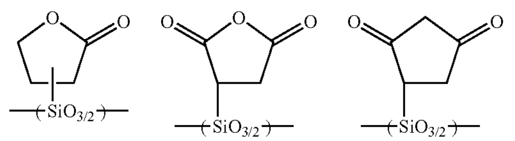
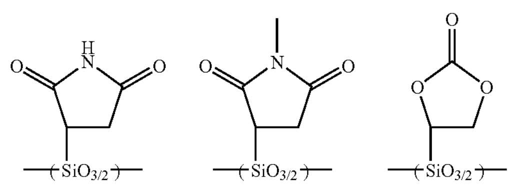
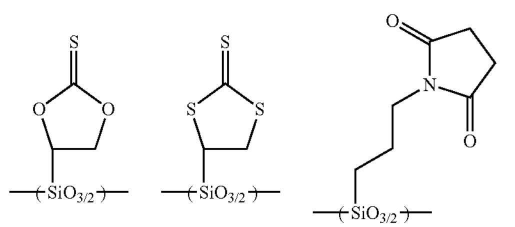
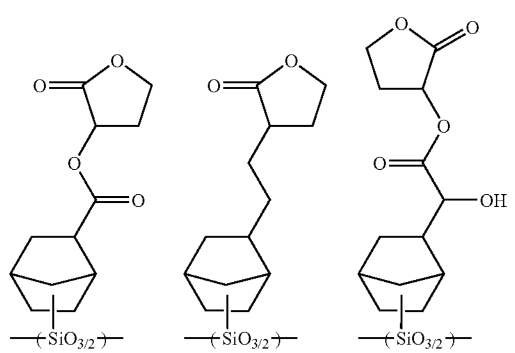
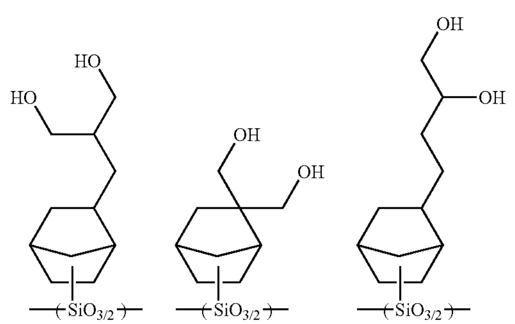
-continued
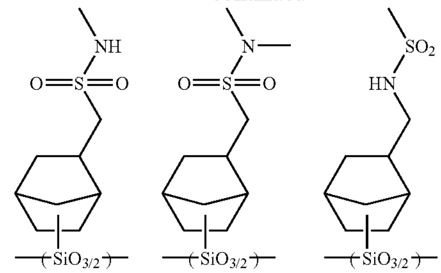
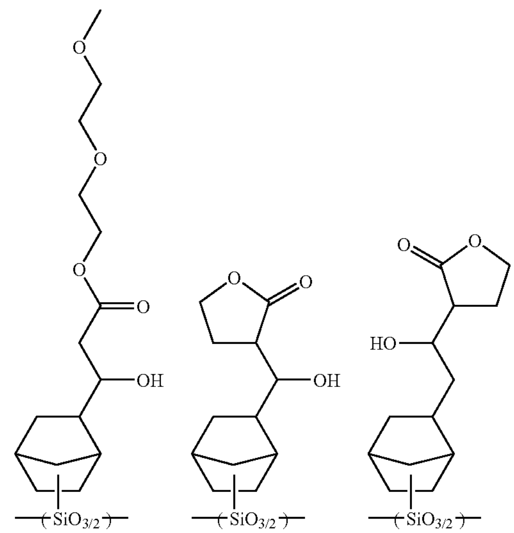
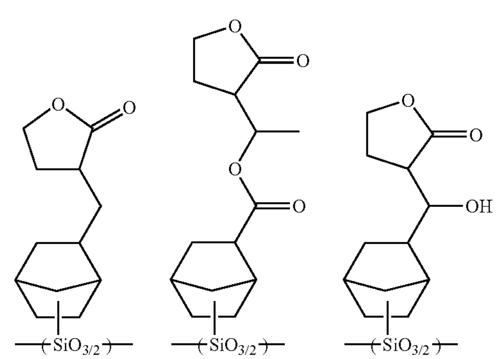
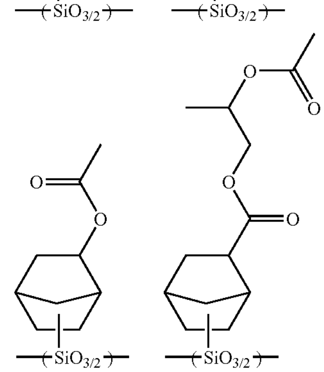

-continued
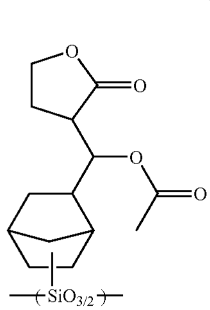
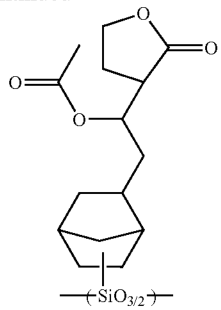
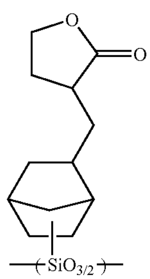
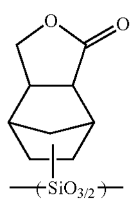
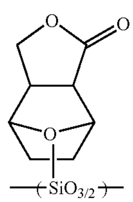
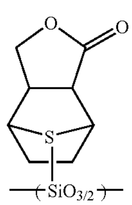
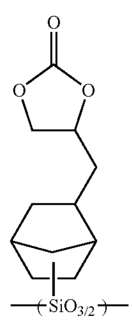
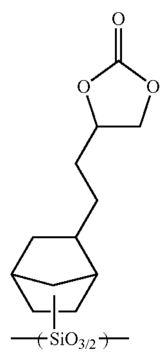
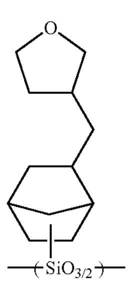
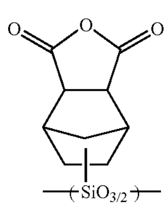
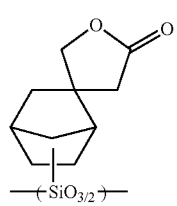
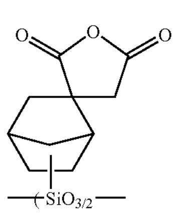
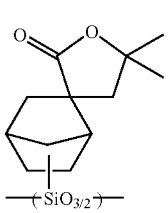
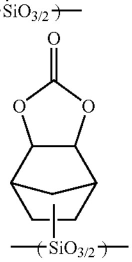
-continued
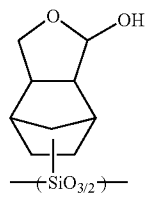
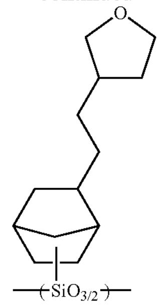
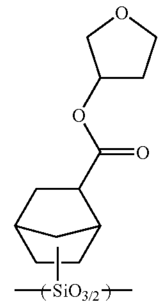
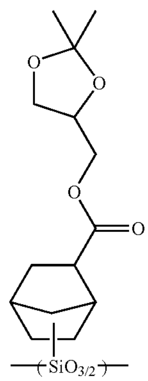
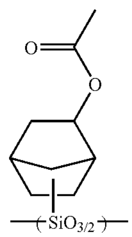
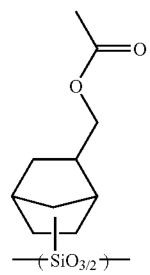
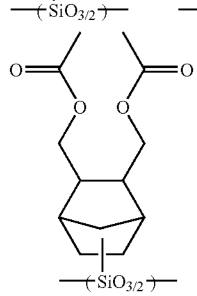
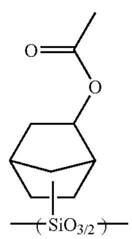
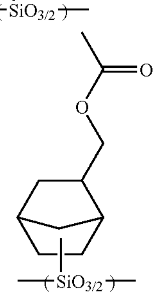
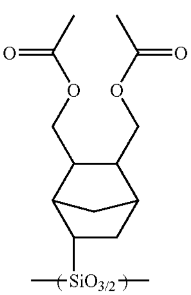
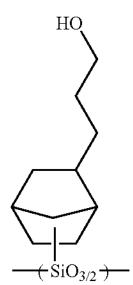
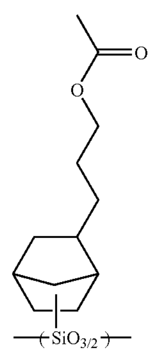
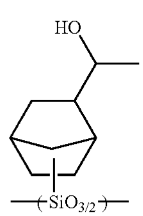
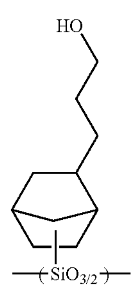
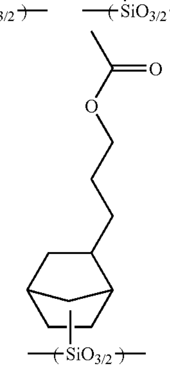

-continued
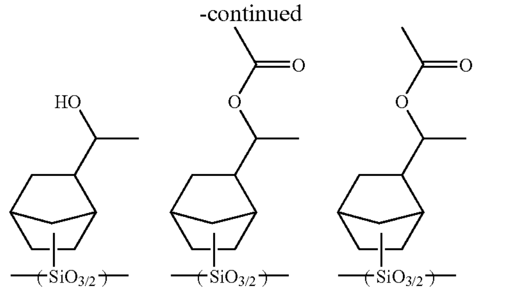
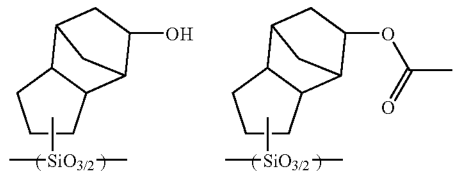
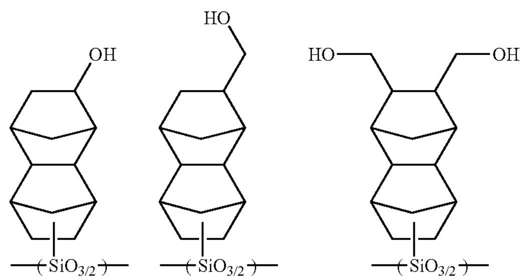
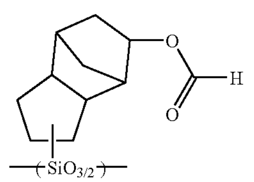
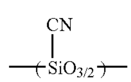
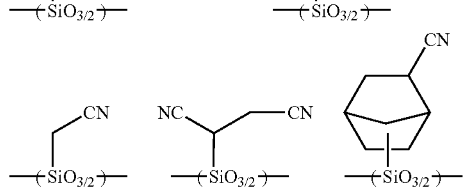
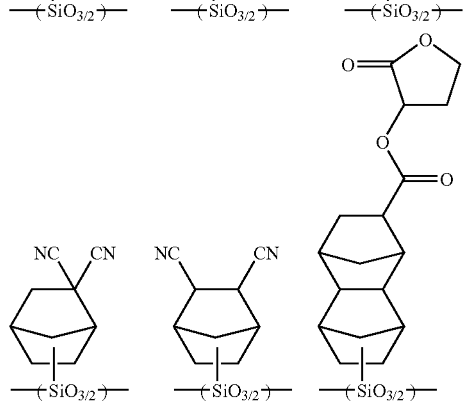
-continued
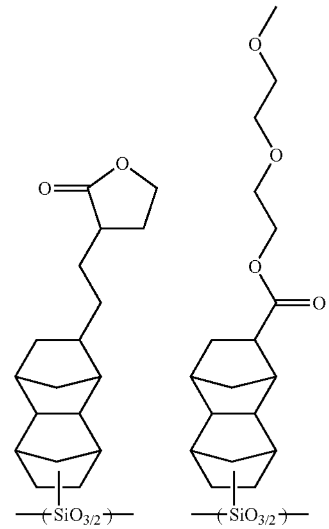
As examples of organic groups $R^{41}$, $R^{42}$, and $R^{43}$, an organic group containing a silicon-silicon bond may also be used. Specifically, the following repeating units may be exemplified.
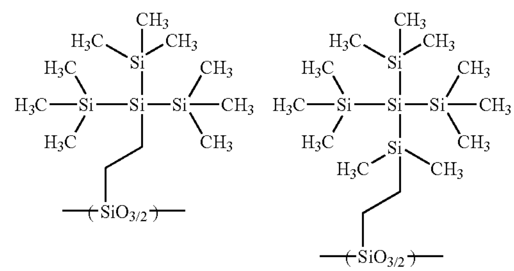
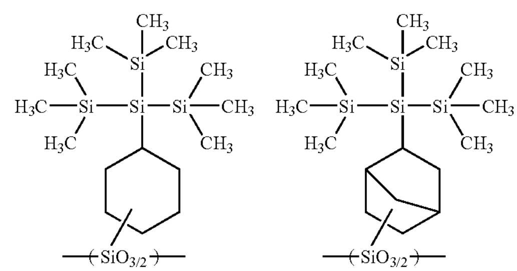
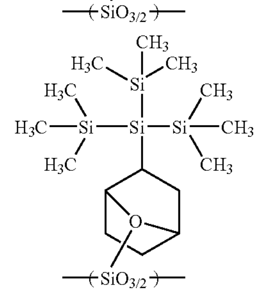

-continued

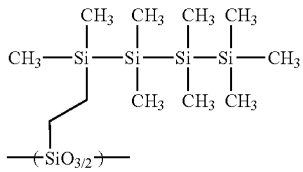

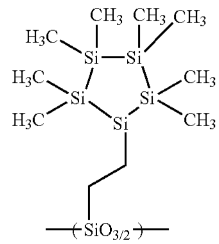

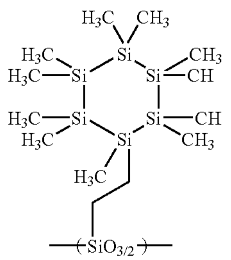

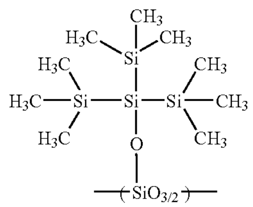

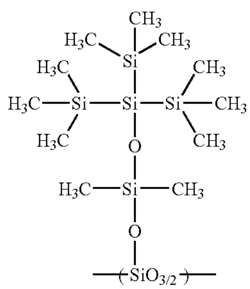

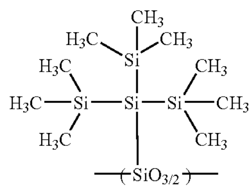

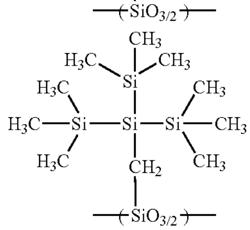

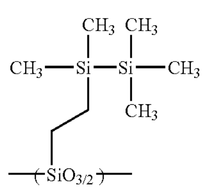

A starting compound for a composition for formation of a reverse film containing an organic silicon compound, except for the above-mentioned silicon compound, and an oxide of an element belonging to Group III, Group IV, and Group V other than a silicon atom, may be represented by the following general formula (12):

$$U(OR^{44})_{m4}(OR^{45})_{m5} \quad (12)$$

Wherein, each of $R^{44}$ and $R^{45}$ represents an organic group having 1 to 30 carbon atoms, m4+m5 is a valency determined by U; each of m4 and m5 represents an integer of 0 or more; and U represents an element belonging to Group III, Group IV, and Group V in a periodic table except for a silicon atom.

Here, by "organic group" is meant that it contains a carbon, and in addition, a hydrogen, and optionally, a nitrogen, an oxygen, a sulfur, a silicon, and the like. Examples of $R^{44}$ and $R^{45}$ include an unsubstituted monovalent hydrocarbon group such as a linear, a branched, or a cyclic alkyl group, an alkenyl group, an alkynyl group, an aryl group, and an aralkyl group, or, one or more of hydrogen atom in these groups are substituted with an epoxy group, an alkoxy group, a hydroxyl group, and the like, or intervened by —O—, —CO—, —COO—, or —OCOO—.

In case U is a boron, the monomer represented by the formula (12) may be exemplified by boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, and the like.

In case U is an aluminum, the monomer represented by the formula (12) may be exemplified by aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethyl acetoacetate, aluminum dibutoxyethyl acetoacetate, aluminum propoxy bisethyl acetoacetate, aluminum butoxy bisethyl acetoacetate, aluminum 2,4-pentanedionate, aluminum 2,2,6,6-tetramethyl-3,5-heptanedionate, and the like.

In case U is a gallium, the monomer represented by the formula (12) may be exemplified by gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxyethyl acetoacetate, gallium dibutoxyethyl acetoacetate, gallium propoxy bisethyl acetoacetate, gallium butoxy bisethyl acetoacetate, gallium 2,4-pentanedionate, gallium 2,2,6,6-tetramethyl-3,5-heptanedionate, and the like.

In the case U is yttrium, the monomer represented by the formula (12) may be exemplified by yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethyl acetoacetate, yttrium dibutoxyethyl acetoacetate, yttrium propoxy bisethyl acetoacetate, yttrium butoxy bisethyl acetoacetate, yttrium 2,4-pentanedionate, yttrium 2,2,6,6-tetramethyl-3,5-heptanedionate, and the like.

In the case U is germanium, the monomer represented by the formula (12) may be exemplified by germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, germanium ethoxyethoxide, and the like.

In the case U is titanium, the monomer represented by the formula (12) may be exemplified by titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy bisethyl acetoacetate, titanium dibutoxy bisethyl acetoacetate, titanium dipropoxy bis-2,4-pentanedionate, titanium dibutoxy bis-2,4-pentanedionate, and the like.

In the case U is hafnium, the monomer represented by the formula (12) may be exemplified by hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy bisethyl acetbacetate, hafnium dibutoxy bisethyl acetoacetate, hafnium dipropoxy bis-2,4-pentanedionate, hafnium dibutoxy bis-2,4-pentanedionate, and the like.

In the case U is tin, the monomer represented by the formula (12) may be exemplified by methoxy tin, ethoxy tin, propoxy tin, butoxy tin, phenoxy tin, methoxyethoxy tin, ethoxyethoxy tin, tin 2,4-pentanedionate, tin 2,2,6,6-tetramethyl-3,5-heptanedionate, and the like.

In the case U is arsenic, the monomer represented by the formula (12) may be exemplified by methoxy arsenic, ethoxy arsenic, propoxy arsenic, butoxy arsenic, phenoxy arsenic, and the like.

In the case U is antimony, the monomer represented by the formula (12) may be exemplified by methoxy antimony, ethoxy antimony, propoxy antimony, butoxy antimony, phenoxy antimony, antimony acetate, antimony propionate, and the like.

In the case U is niobium, the monomer represented by the formula (12) may be exemplified by methoxy niobium, ethoxy niobium, propoxy niobium, butoxy niobium, phenoxy niobium, and the like.

In the case U is tantalum, the monomer represented by the formula (12) may be exemplified by methoxy tantalum, ethoxy tantalum, propoxy tantalum, butoxy tantalum, phenoxy tantalum, and the like.

In the case U is bismuth, the monomer represented by the formula (12) may be exemplified by methoxy bismuth, ethoxy bismuth, propoxy bismuth, butoxy bismuth, phenoxy bismuth, and the like.

In the case U is phosphorus, the monomer represented by the formula (12) may be exemplified by trimethyl phosphite, triethyl phosphite, tripropyl phosphite, trimethyl phosphate, triethyl phosphate, tripropyl phosphate, and the like.

In the case U is vanadium, the monomer represented by the formula (12) may be exemplified by vanadium oxide bis(2,4-pentanedionate), vanadium 2,4-pentanedionate, vanadium tributoxide oxide, vanadium tripropoxide oxide, and the like.

In the case U is zirconium, the monomer represented by the formula (12) may be exemplified by methoxy zirconium, ethoxy zirconium, propoxy zirconium, butoxy zirconium, phenoxy zirconium, zirconium dibutoxide bis(2,4-pentanedionate), zirconium dipropoxide bis(2,2,6,6-tetramethyl-3,5-heptanedionate), and the like.

In the case U is lead, the monomer represented by the formula (12) may be exemplified by dimethoxy lead, diethoxy lead, dipropoxy lead, dibutoxy lead, diphenoxy lead, methoxyphenoxy lead, and the like.

In the case U is scandium, the monomer represented by the formula (12) may be exemplified by trimethoxy scandium, triethoxy scandium, tripropoxy scandium, tributoxy scandium, triphenoxy scandium, methoxydiphenoxy scandium, and the like.

In the case U is indium, the monomer represented by the formula (12) may be exemplified by trimethoxy indium, triethoxy indium, tripropoxy indium, tributoxy indium, triphenoxy indium, methoxydiphenoxy indium, and the like.

In the case U is thallium, the monomer represented by the formula (12) may be exemplified by tetramethoxy thallium, tetraethoxy thallium, tetrapropoxy thallium, tetrabutoxy thallium, tetraphenoxy thallium, and the like.

These monomers represented by the general formula (11), or general formula (12) may be selected singly, or two or more, and mixed before or during a reaction to make a raw material for preparation of a composition for formation of a reverse film containing an organic silicon compound having a siloxane bond, or additionally containing an oxide of an element belonging to Group III, Group IV, and Group V other than a silicon atom.

A silicon-containing organic compound and a compound containing a metal oxide other than silicon for a compound for formation of a reverse film may be prepared by a hydrolysis-condensation reaction of a monomer represented by the formula (11) and the formula (12), preferably by using one or more acid catalyst selected from an inorganic acid, an aliphatic sulfonic acid, and an aromatic sulfonic acid, or a base catalyst. The acid catalyst used in the reaction may be hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. The base catalyst may be ammonia, trimethylamine, triethylamine, triethanol amine, tetramethyl ammonium hydroxide, tetraethyl ammonium hydroxide, cholin hydroxide, 1,8-diazabicyclo[5.4.0]-7-undecene (DBU), 1,5-diazabicyclo[4.3.0]-5-nonene (DBN), sodium hydroxide, potassium hydroxide, barium hydroxide, and calcium hydroxide. The use amount of the catalyst is $10^{-6}$ to 10 mole, preferably $10^{-5}$ to 5 mole, and more preferably $10^{-4}$ to 1 mole, relative to 1 mole of a silicon monomer.

The amount of water added to obtain a silicon-containing organic compound and a metal oxide-containing compound from these monomers by a hydrolysis-condensation reaction is preferably 0.01 to 100 mole, more preferably 0.05 to 50 mole, and further more preferably 0.1 to 30 mole, relative to 1 mole of a hydrolyzable substituent bonding to a monomer. Addition of more than 100 mole merely increases equipment used in the reaction, and thus it is uneconomical.

In operation, a hydrolysis-condensation reaction is initiated by adding a monomer into an aqueous catalyst solution. For it, it may be allowed to add an organic solvent into an aqueous catalyst solution, or to dilute a monomer with an organic solvent, or to use the both. The reaction temperature may be 0 to 100° C., and preferably 5 to 80° C. A method to add a monomer at 5 to 80° C., with an aging temperature thereafter at 20 to 80° C., is preferably employed.

Examples of an organic solvent which may be added into an aqueous catalyst solution or may dilute a monomer include methanol, ethanol, 1-propanol, 2-propanol, 1-butanol, 2-butanol, 2-methyl-1-propanol, acetone, acetonitrile, tetrahydrofurane, toluene, hexane, ethyl acetate, cyclohexanone, methyl 2-n-amyl ketone, butanediol monomethyl ether, propyleneglycol monomethyl ether, ethyleneglycol monomethyl ether, butanediol monoethyl ether, propyleneglycol monoethyl ether, propyleneglycol dimethyl ether, diethyleneglycol dimethyl ether, propyleneglycol monomethyl ether acetate, propyleneglycol monoethyl ether acetate, ethyl pilvate, butyl acetate, methyl 3-methoxypropionate, ethyl 3-ethoxypropionate, tert-butyl acetate, tert-butyl propionate, propyleneglycol mono-tert-butyl ether acetate, γ-butyrolactone, and a mixture thereof.

Among these solvents, a water-soluble solvent is preferable. They may be exemplified by alcohols such as methanol, ethanol, 1-propanol, and 2-propanol; polyols such as ethyleneglycol and propyleneglycol; polyol condensation derivatives such as butanediol monomethyl ether, propyleneglycol monomethyl ether, ethyleneglycol monomethyl ether, butanediol monoethyl ether, propyleneglycol monoethyl ether, ethyleneglycol monoethyl ether, butanediol monopropyl ether, propyleneglycol monopropyl ether, and ethyleneglycol monopropyl ether; acetone, acetonitrile, tetrahydrofurane, and the like. Among them, a solvent with a boiling point of 100° C. or lower is particularly preferable.

The use amount of an organic solvent is preferably 0 to 1,000 milliliters, and 0 to 500 milliliters in particular, relative 1 mole of a monomer. Excessive use of a solvent makes a reactor large, which is uneconomical.

Thereafter, a catalyst is neutralized if necessary, and then an alcohol produced in a hydrolysis-condensation reaction is removed under a reduced pressure to obtain an aqueous reaction mixture solution. The amount of an acid or an alkaline material for neutralization is preferably 0.1 to 2 equivalents relative to an acid or a base used as a catalyst. Any material may be used as these acid or alkaline materials as far as it shows properties of an acid or an alkaline in water.

Subsequently, it is preferable to remove, from the reaction mixture, by-products such as an alcohol produced in the hydrolysis-condensation reaction. Temperature to heat the reaction mixture in this operation is preferably 0 to 100° C., more preferably 10 to 90° C., and further more preferably 15 to 80° C., though it depends on the kinds of a used organic solvent and a produced alcohol. A degree of vacuum in this operation is preferably below an atmospheric pressure, more preferably 80 kPa or lower in absolute pressure, and further more preferably 50 kPa or lower in absolute pressure, though it depends on the kinds of a used organic solvent and a produced alcohol, exhausting equipment, condensation equipment, and heating temperature. Although an amount of the alcohol to be removed is not exactly known, about 80% or more by weight of a produced alcohol is preferably removed.

An acid or a base catalyst used in the hydrolysis-condensation reaction may be removed from the reaction mixture. An acid or a base catalyst may be removed by mixing water with a silicon-containing organic compound and a compound containing a metal oxide other than a silicon, and then the silicon-containing organic compound and the compound containing a metal oxide other than a silicon are extracted by an organic solvent. An organic solvent which can dissolve the silicon-containing organic compound and the compound containing a metal oxide other than a silicon and can be separated into two films when mixed with water is preferably used. It may be exemplified by methanol, ethanol, 1-propanol, 2-propanol, 1-butanol, 2-butanol, 2-methyl-1-propanol, acetone, tetrahydrofurane, toluene, hexane, ethyl acetate, cyclohexanone, methyl 2-n-amyl ketone, butanediol monomethyl ether, propyleneglycol monomethyl ether, ethyleneglycol monomethyl ether, butanediol monoethyl ether propyleneglycol monoethyl ether, ethyleneglycol monoethyl ether, butanediol monopropyl ether, propyleneglycol monopropyl ether, ethyleneglycol monopropyl ether, propyleneglycol dimethyl ether, diethyleneglycol dimethyl ether, propyleneglycol monomethyl ether acetate, propyleneglycol monoethyl ether acetate, ethyl pilvate, butyl acetate, methyl 3-methoxypropionate, ethyl 3-ethoxypropionate, tert-butyl acetate, tert-butyl propionate, propyleneglycol mono-tert-butyl ether acetate, γ-butyrolactone, methyl isobutyl ketone, cyclopentyl methyl ether, and the like, or a mixture thereof.

In addition, a mixture of a water-soluble organic solvent and a water-insoluble organic solvent may also be used. Examples of the preferable mixture include methanol/ethyl acetate, ethanol/ethyl acetate, 1-propanol/ethyl acetate, 2-propanol/ethyl acetate, butanediol monomethyl ether/ethyl acetate, propyleneglycol monomethyl ether/ethyl acetate, ethyleneglycol monomethyl ether/ethyl acetate, butanediol monoethyl ether/ethyl acetate, propyleneglycol monoethyl ether/ethyl acetate, ethyleneglycol monoethyl ether/ethyl acetate, butanediol monopropyl ether/ethyl acetate, propyleneglycol monopropyl ether/ethyl acetate, ethyleneglycol monopropyl ether/ethyl acetate, methanol/methyl isobutyl ketone, ethanol/methyl isobutyl ketone, 1-propanol/methyl isobutyl ketone, 2-propanol/methyl isobutyl ketone, propyleneglycol monomethyl ether/methyl isobutyl ketone, ethyleneglycol monomethyl ether/methyl isobutyl ketone, propyleneglycol monoethyl ether/methyl isobutyl ketone, ethyleneglycol monoethyl ether/methyl isobutyl ketone, propyleneglycol monopropyl ether/methyl isobutyl ketone, ethyleneglycol monopropyl ether/methyl isobutyl ketone, methanol/cyclopentyl methyl ether, ethanol/cyclopentyl methyl ether, 1-propanol/cyclopentyl methyl ether, 2-propanol/cyclopentyl methyl ether, propyleneglycol monomethyl ether/cyclopentyl methyl ether, ethyleneglycol monomethyl ether/cyclopentyl methyl ether, propyleneglycol monoethyl ether/cyclopentyl methyl ether, ethyleneglycol monoethyl ether/cyclopentyl methyl ether, propyleneglycol monopropyl ether/cyclopentyl methyl ether, ethyleneglycol monopropyl ether/cyclopentyl methyl ether, methanol/propyleneglycol methyl ether acetate, ethanol/propyleneglycol methyl ether acetate, 1-propanol/propyleneglycol methyl ether acetate, 2-propanol/propyleneglycol methyl ether acetate, propyleneglycol monomethyl ether/propyleneglycol methyl ether acetate, ethyleneglycol monomethyl ether/propyleneglycol methyl ether acetate, propyleneglycol monoethyl ether/propyleneglycol methyl ether acetate, ethyleneglycol monoethyl ether/propyleneglycol methyl ether acetate, propyleneglycol monopropyl ether/propyleneglycol methyl ether acetate, and ethyleneglycol monopropyl ether/propyleneglycol methyl ether acetate, though the combination is not limited to the above.

Mixing ratio of a water-soluble organic solvent to a water-insoluble organic solvent is arbitrarily selected, but the amount of a water-soluble organic solvent is 0.1 to 1,000 parts by weight, preferably 1 to 500 parts by weight, and more preferably 2 to 100 parts by weight, relative to 100 parts by weight of a water-insoluble organic solvent.

Then, washing by neutral water is done. So-called deionized water or ultrapure water may be used. Amount of this water is 0.01 to 100 liters, preferably 0.05 to 50 liters, more preferably 0.1 to 5 liters relative to 1 liter of a solution containing a silicon-containing organic compound and a compound containing a metal oxide other than a silicon. The operation may be done in such a way that the both solutions are mixed in a vessel with agitation, and then settled to separate a water layer. A number of washing is 1 or more, and preferably 1 to 5, because washing of 10 times or more is not worth to have full effects.

Alternatively, the acid catalyst may be removed by use of an ion-exchange resin, or in such a way that it is neutralized by an epoxide such as ethylene oxide and propylene oxide, and then removed. These methods may be selected arbitrarily according to the acid catalyst used.

In operation of removing the catalyst as mentioned above, one may say that the catalyst is substantially removed when the amount of remaining catalyst is 10% or less by weight, or preferably 5% or less by weight, as a tolerable level, relative to the initial amount used in the reaction of a silicon-containing organic compound and a compound containing a metal oxide other than a silicon.

In this operation of water-washing, the number of washing and the amount of water may be determined arbitrarily in view of effects of catalyst removal and fractionation because there is a case that a part of a silicon-containing organic compound and a compound containing a metal oxide other than a silicon escapes into a water film, thereby substantially the same effect as a fractionation operation is obtained.

Any of solutions containing an organic silicon compound and a compound containing a metal oxide other than a silicon with or without a remaining catalyst is added by a final solvent, and then solvents are exchanged under reduced pressure to obtain a solution containing an organic silicon compound and a compound containing a metal oxide other than a silicon. Temperature of the solvent exchange is preferably 0 to 100° C., more preferably 10 to 90° C., and further more preferably 15 to 80° C., though it is different depending on a reaction solvent and an extraction solvent. A degree of vacuum in this operation is preferably below an atmospheric pressure, more preferably 80 kPa or lower, and further more preferably 50 kPa or lower in absolute pressure, though it depends on the kind of an extraction solvent to be removed, exhausting equipment, condensation equipment, and heating temperature.

In this operation, there is a case that a silicon-containing organic compound and a compound containing a metal oxide other than a silicon become unstable by the solvent exchange. Although this, occurs depending on compatibility of a final solvent with a silicon-containing organic compound and a compound containing a metal oxide other than a silicon, in order to prevent this from occurring, a component as will be mentioned later may be added as a stabilizer. The adding amount of it is 0 to 25 parts by weight, preferably 0 to 15 parts by weight, more preferably 0 to 5 parts by weight, and 0.5 parts or more by weight when it is added, relative to 100 parts by weight of a silicon-containing organic compound and a compound containing a metal oxide other than a silicon contained in a solution before the solvent exchange. The solvent exchange may be done with an addition of the stabilizer into the solution, if necessary, before the solvent exchange.

In order to stabilize a silicon-containing compound used in a composition for formation of a reverse film containing an organic silicon compound having a siloxane bond used in the patterning process of the present invention, an organic acid with a valency of one or more having 1 to 30 carbon atoms may be added as the stabilizer. A preferable stabilizer to be added may be formic acid, acetic acid, propionic acid, butanoic acid, pentanoic acid, hexanoic acid, heptanoic acid, octanoic acid, nonanoic acid, decanoic acid, oleic acid, stearic acid, linolic acid, linoleic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, and the like. Among them, oxalic acid, maleic acid, formic acid, acetic acid, proionic acid, citric acid and the like are preferable. They may be used in a mixture of two or more kinds in order to keep the stability. The added amount is 0.001 to 25 parts by weight, preferably 0.01 to 15 parts by weight, and more preferably 0.1 to 5 parts by weight, relative to 100 parts by weight of total silicon-containing organic compounds. Alternatively, an organic acid as mentioned above is added so as to adjust pH in the composition in the range of preferably $0 \leqq pH \leqq 7$, more preferably $0.3 \leqq pH \leqq 6.5$, and further more preferably $0.5 \leqq pH \leqq 6$.

Further, an alcohol with a velency of one or two or more containing a cyclic ether as a substituent group, especially an ether compound shown by the following formulae may be added as a stabilizer to improve the stability of a composition for formation of a reverse film containing an organic silicon compound having a siloxane bond. Following compounds may be cited as the above compounds.

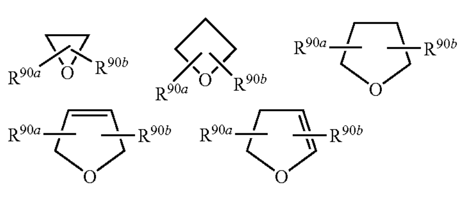

-continued

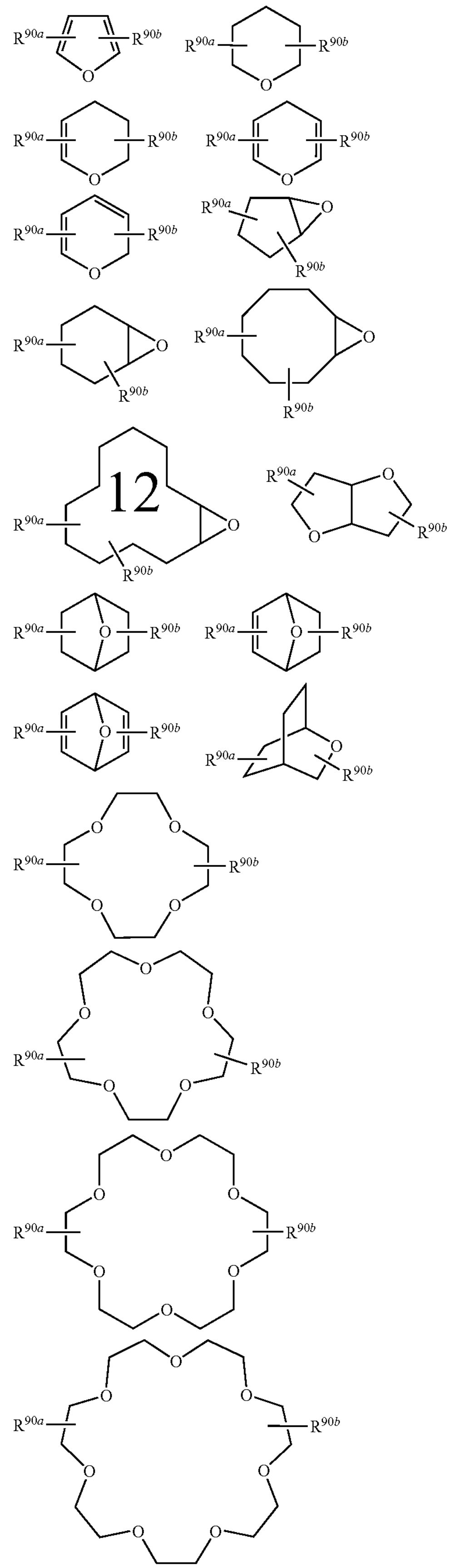

-continued

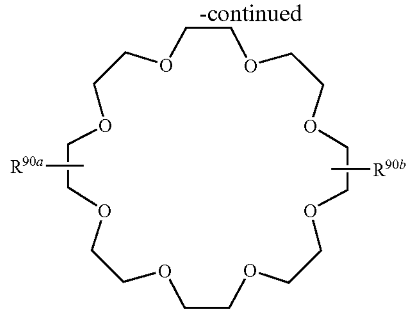

Here, $R^{90a}$ represents a hydrogen atom, a linear, a branched, or a cyclic monovalent hydrocarbon group having 1 to 10 carbon atoms, $R^{91}O—(CH_2CH_2O)_{n1}—(CH_2)_{n2}—$ (here, $0 \leqq n1 \leqq 5$ and $0 \leqq n2 \leqq 3$; $R^{91}$ represents a hydrogen atom or a methyl group), or $R^{92}O—[CH(CH_3)CH_2O]]_{n3}—(CH_2)_{n4}—$ (here, $0 \leqq n3 \leqq 5$ and $0 \leqq n4 \leqq 3$, and $R^{92}$ represents a hydrogen atom or a methyl group); and $R^{90b}$ represents a hydroxyl group, a linear, a branched, or a cyclic monovalent hydrocarbon group having 1 to 10 carbon atoms and containing one or more hydroxyl group, $HO—(CH_2CH_2O)_{n5}—(CH_2)_{n6}—$ (here, $1 \leqq n5 \leqq 5$ and $1 \leqq n6 \leqq 3$), and $HO—[CH(CH_3)CH_2O)]_{n7}—(CH_2)_{n8}—$ (here, $1 \leqq n7 \leqq 5$ and $1 \leqq n8 \leqq 3$).

The stabilizer may be used singly or in a combination of two or more kinds. The amount of the stabilizer to be added is preferably 0.001 to 50 parts by weight, and more preferably 0.01 to 40 parts by weight, relative to 100 parts by weight of a base polymer (a silicon-containing compound obtained in the above method). These stabilizers may be used singly or in a mixture of two or more kinds. Among them, a compound having a substituent with a structure of a crown ether derivative or of a bicyclic ring having an oxygen atom at the bridge head position is preferable.

With this stabilizer, an electric charge of an acid is more stabilized, thereby contributing to stabilization of an organic silicon compound in the composition.

In a composition for formation of a reverse film containing a silicon-containing organic compound in the present invention, a similar organic solvent to the one used in the production of the silicon-containing compound as mentioned above, preferably a water-soluble organic solvent, in particular, a monoalkyl ether of an alkylene glycol such as ethyleneglycol, diethyleneglycol, triethyleneglycol, propylene glycol, dipropyleneglycol, butanediol, pentanediol, and the like, may be used. Specifically an organic solvent selected from butanediol monomethyl ether, propyleneglycol monomethyl ether, ethyleneglycol monomethyl ether, butanediol monoethyl ether, propyleneglycol monoethyl ether, ethyleneglycol monoethyl ether, butanediol monopropyl ether, propyleneglycol monopropyl ether, ethyleneglycol monopropyl ether, and the like, may be used.

In the present invention, water may be added to a composition for formation of a reverse film. Addition of water makes a silicon-containing compound hydrated, thereby improving its stability. The amount of water in the solvent component in the composition is 0 to 50% by weight, preferably 0.3 to 30% by weight, and more preferably 0.5 to 20% by weight. Excessive addition of each component may make a coated film uneven, thereby risking to generate repellent in the worst case.

Total amount of solvents including water is preferably 500 to 100,000 parts by weight, in particular 400 to 50,000, relative to 100 parts by weight of a base polymer.

A molecular weight of a organic compound for formation of a reverse film containing an organic silicon compound having a siloxane bond may be controlled not only by selection of a monomer but also by choosing reaction conditions of polymerization. When its weight-average molecular weight is 100,000 or more, formation of foreign spots or a mottled film may happen in a certain case. Accordingly, it is preferably 100,000 or less, more preferably 200 to 50,000, and further more preferably 300 to 30,000. The data of the weight-average molecular weights are obtained by a gel permeation chromatography using a RI as a detector and polystyrene as a standard material, by referring to which the molecular weights are expressed.

Improvement of the alkaline-solubility of only a surface of a reverse pattern film of the embodiment makes dissolution of a reverse pattern film, which covers heads of an alkaline-solubilized positive resist pattern, easy, thereby effectively improving a dimensional controllability of a trench pattern or a hole pattern having a reversed pattern from a positive pattern. In order to improve an alkaline-solubility of the reverse film surface, an alkaline-soluble surfactant, especially a fluorinated surfactant may be added. The fluorinated surfactant may contain at least a repeating unit s-1 and/or s-2, represented by the following general formula (13).

(13)

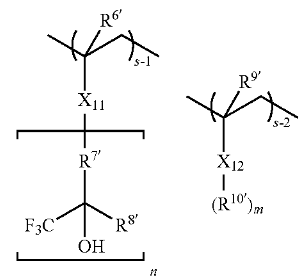

Wherein, each of $R^{6'}$ and $R^{9'}$ independently represents a hydrogen atom or a methyl group, wherein n represents 1 or 2. When, n=1, $X_{11}$ represents a phenylene group, —O—, $—C(=O)—O—R^{12'}—$, or $—C(=O)—NH—R^{12'}—$; and $R^{12'}$ represents a single bond, or a linear or a branched alkylene group having 1 to 4 carbon atoms optionally containing an ester group or an ether group. When n=2, $X_{11}$ represents a phenylene group, $—C(=O)—O—R^{81'}=$, or $—C(=O)—NH—R^{81'}=$, wherein $R^{81'}$ is a linear, a branched, or a cyclic alkylene group, from which one hydrogen atom is removed, having 1 to 10 carbon atoms and optionally containing an ester group or an ether group; $R^{7'}$ represents a single bond, a linear, a branched, or a cyclic alkylene group having 1 to 12 carbon atoms; $R^{8'}$ represents a hydrogen atom, a fluorine atom, a methyl group, a trifluoromethyl group, or a difluoromethyl group, or may form a ring (except for an aromatic ring) having 3 to 10 carbon atoms with $R^{7'}$ and carbons to which these groups are bonded, wherein the ring may contain an ether group, a fluorine-substituted alkylene group, or a trifluoromethyl group; $X_{12}$ represents a phenylene group, —O—, $—C(=O)—O—R^{11'}—$, or $—C(=O)—NH—R^{11'}—$, and $R^{11'}$ represents a single bond, or a linear or a branched alkylene group having 1 to 4 carbon atoms optionally containing an ester group or an ether group; and $R^{10'}$ represents a fluorine atom, a linear, a branched, or a cyclic alkyl group having 1 to 20 carbon atoms, which is substituted by at least one fluorine atom and may contain an ether group, an ester group, or a sulfonamide group. When $X_{12}$ is a phenylene group, m represents an integer of 1 to 5, and when $X_{12}$ is other group, m represents 1.
Monomers giving s-1 may be specifically exemplified by the followings.
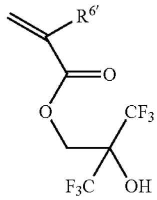
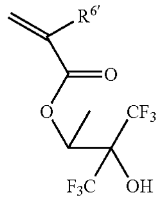
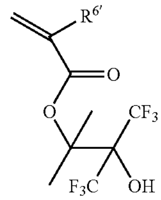
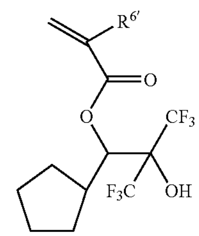
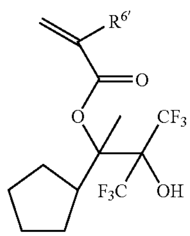
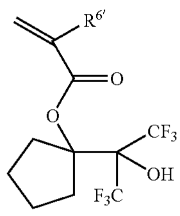
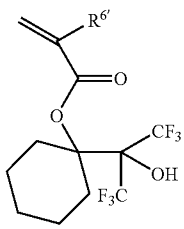
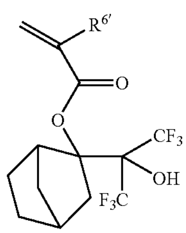
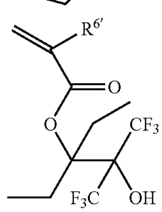
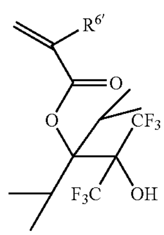
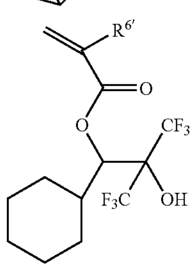
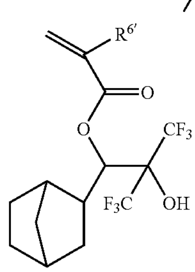
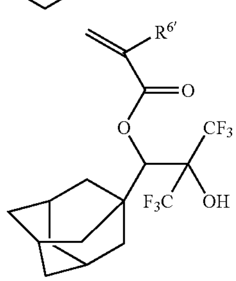
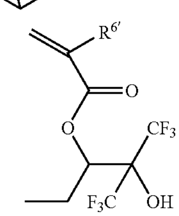
-continued
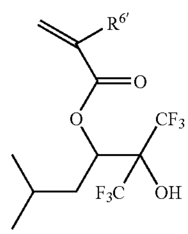
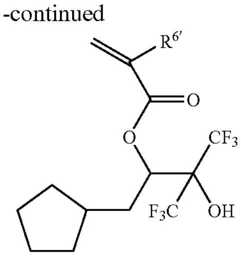
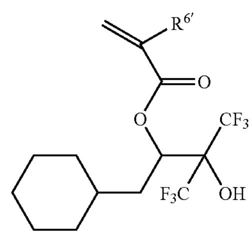
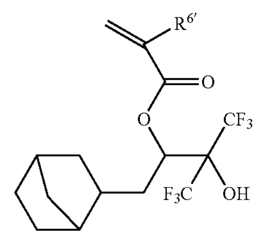
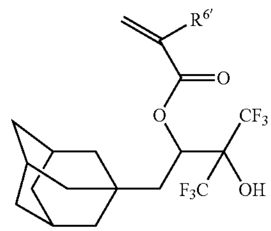
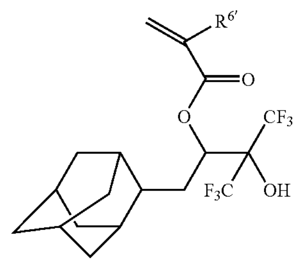
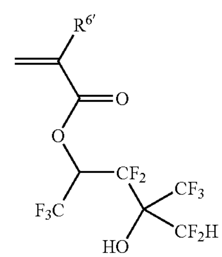
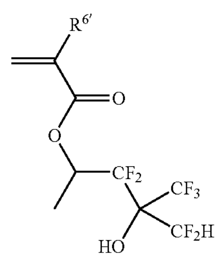
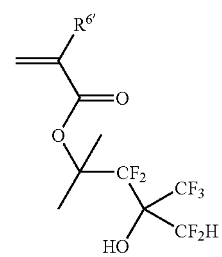
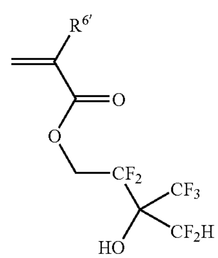
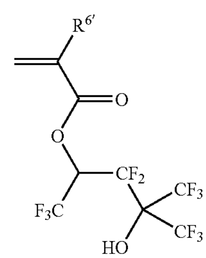
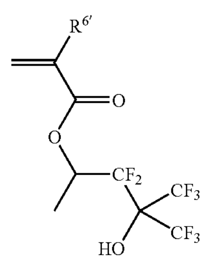
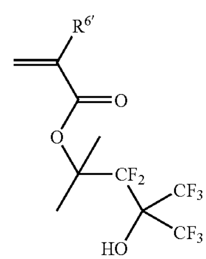

-continued
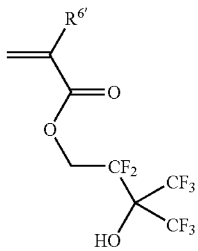
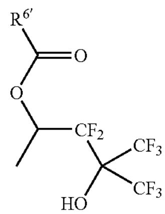
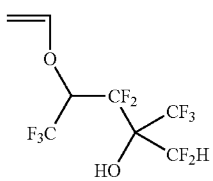
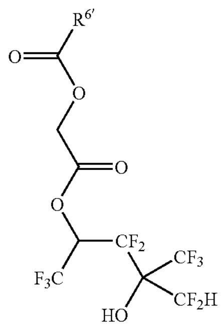
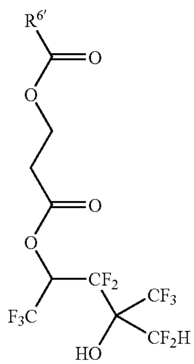
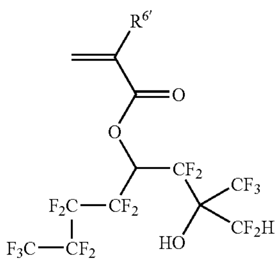
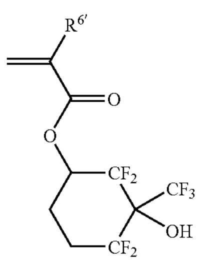
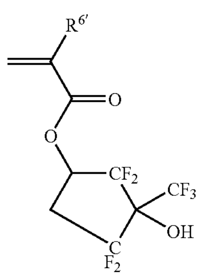
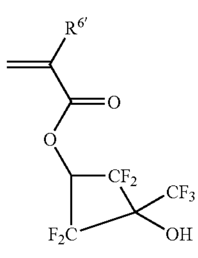
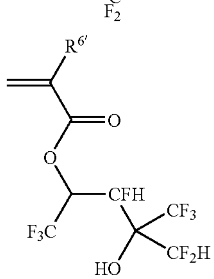
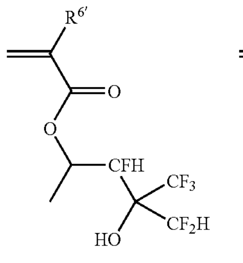
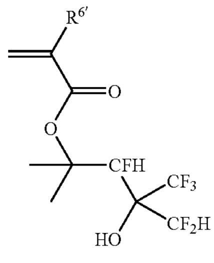
-continued
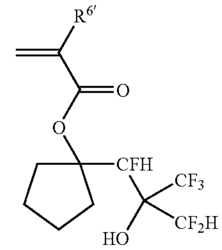
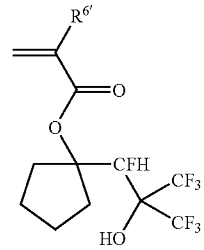
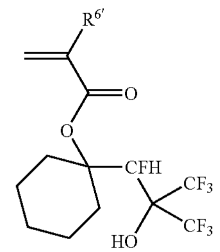
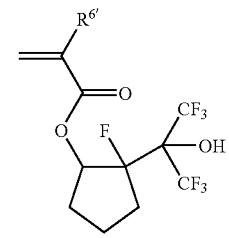
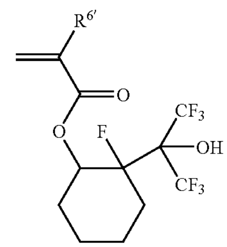
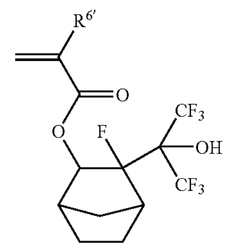
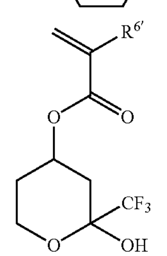
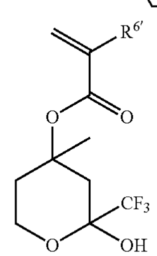
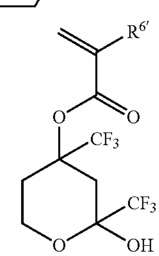
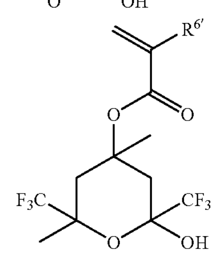
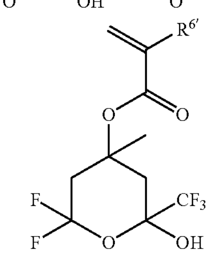
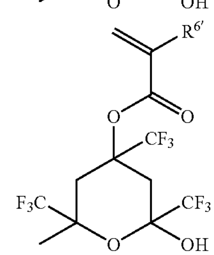
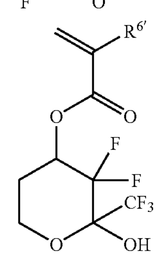
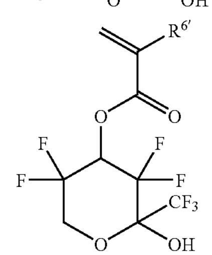
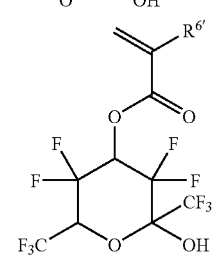

-continued
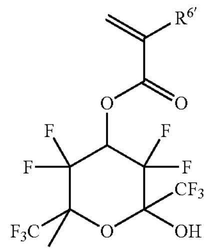
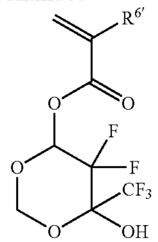
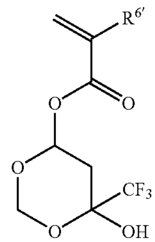
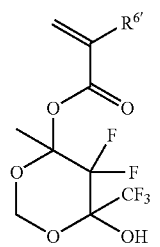
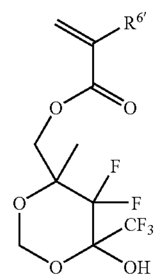
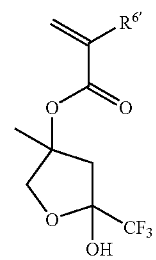
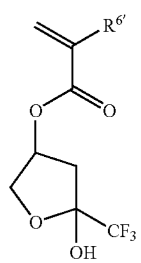
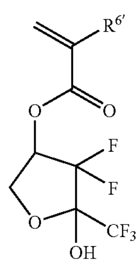
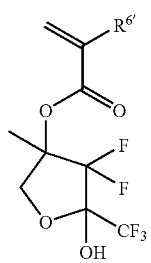
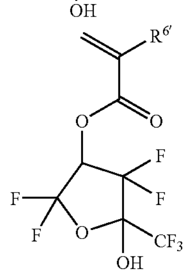
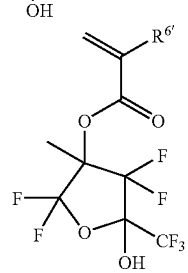
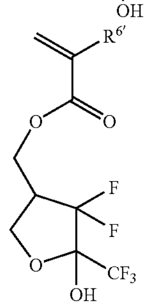
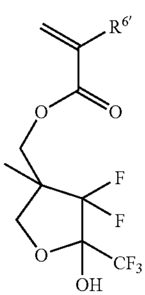
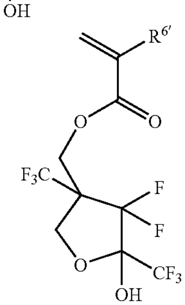
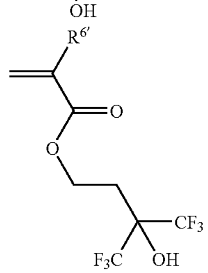
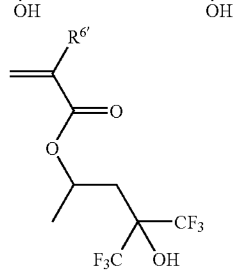
-continued
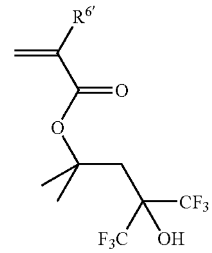
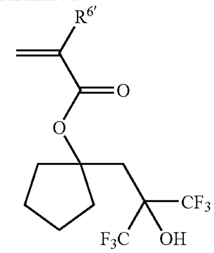
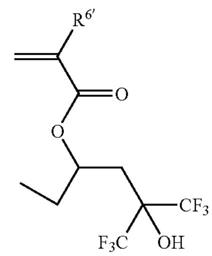
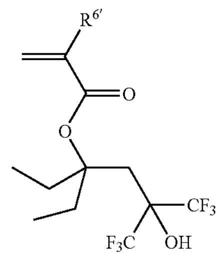
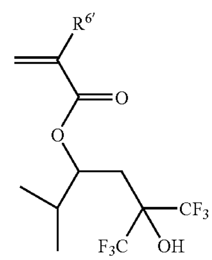
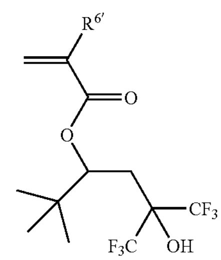
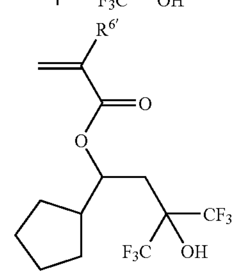
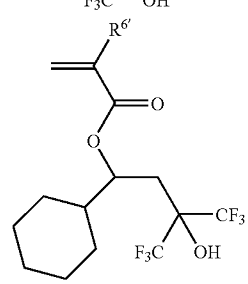
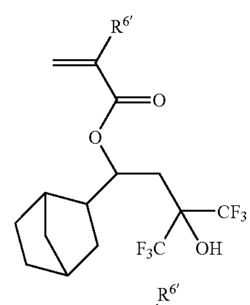
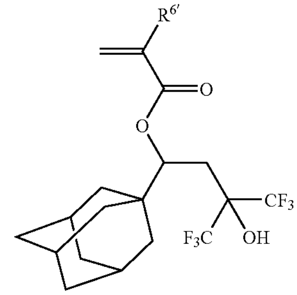

-continued
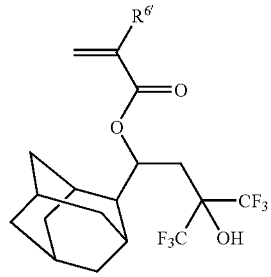
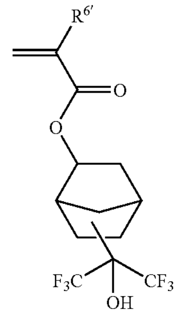
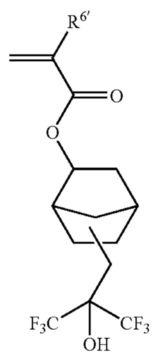
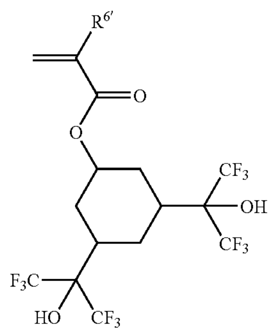
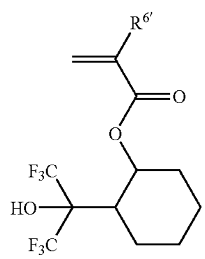
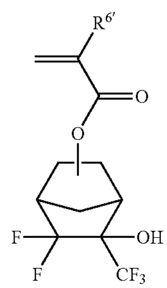
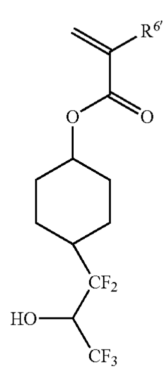
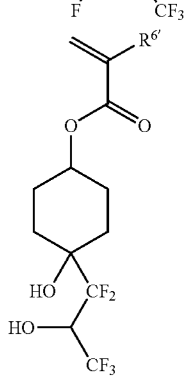
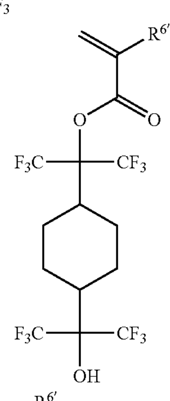
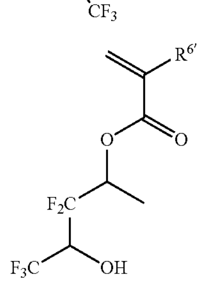
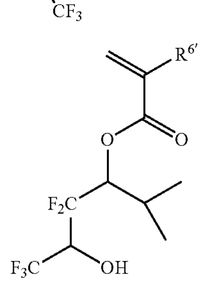
-continued
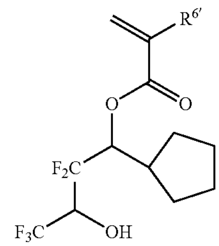
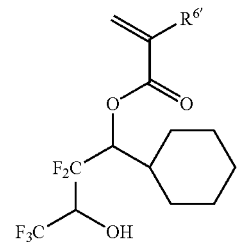
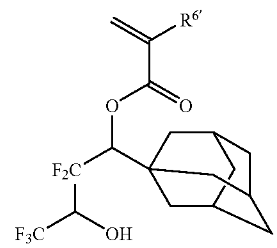
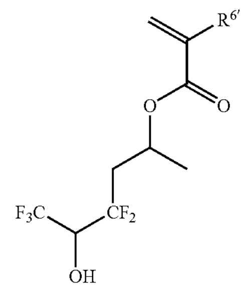
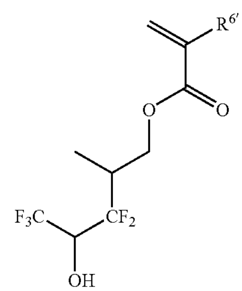
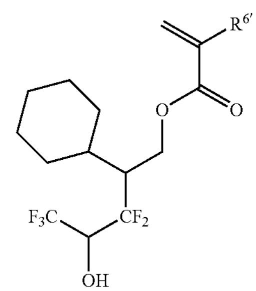
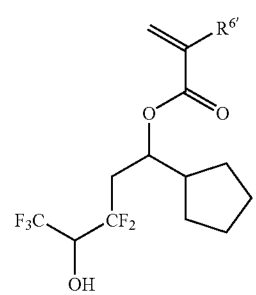
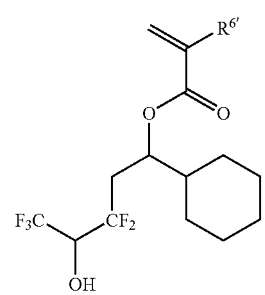
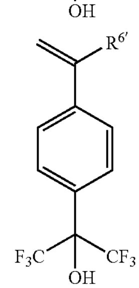
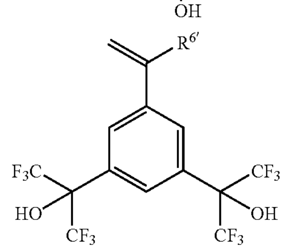
Wherein, $R^{6'}$ represents the same meanings as before.
Monomers giving a repeating unit s-2 shown by the above general formula (13) having an alkyl group substituted by a fluorine atom may be specifically exemplified by the followings.

-continued
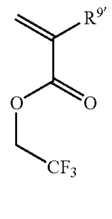
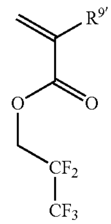
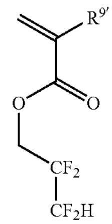
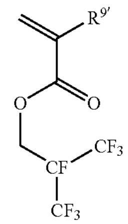
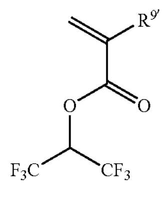
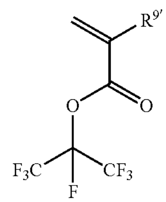
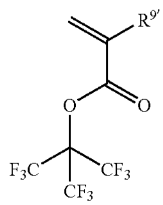
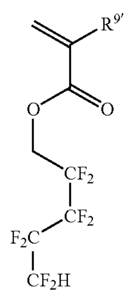
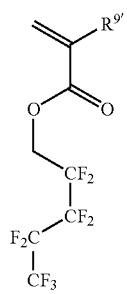
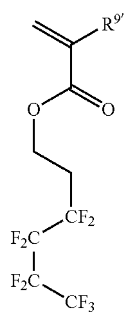
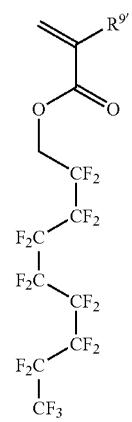
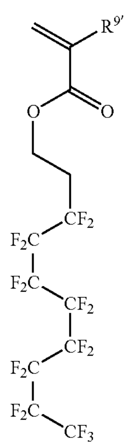
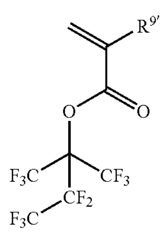
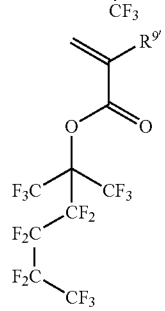
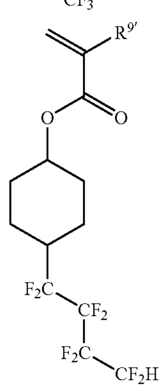
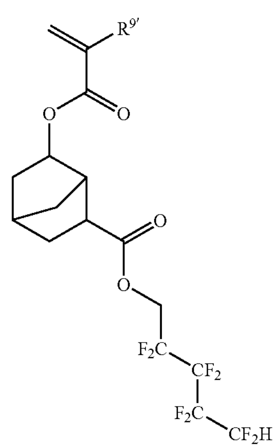
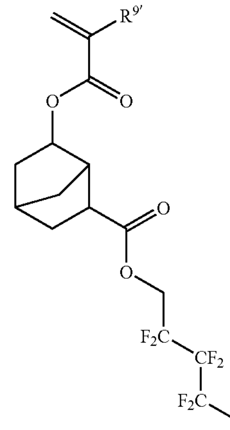
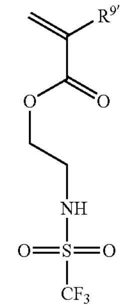
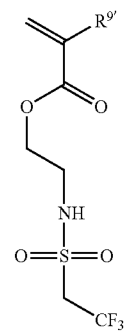
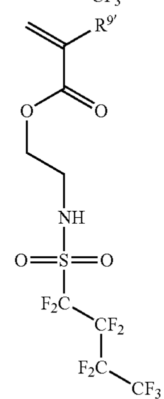
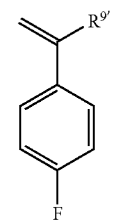
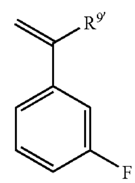
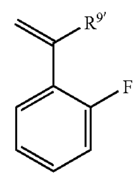
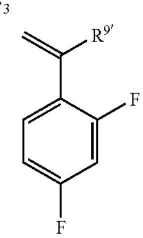
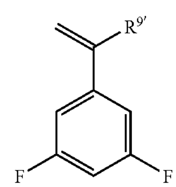
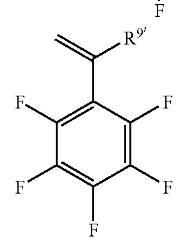
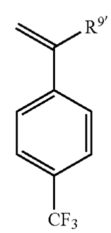
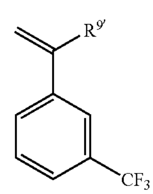
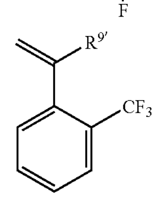
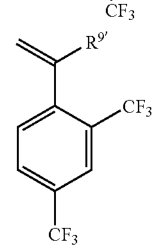
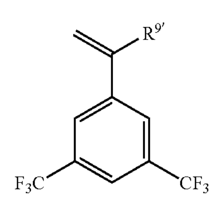
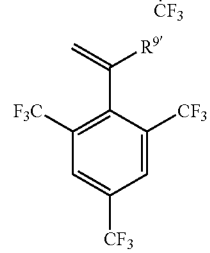

-continued
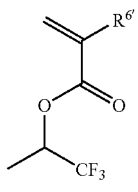
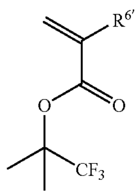
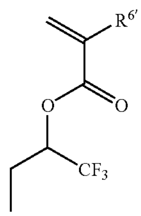
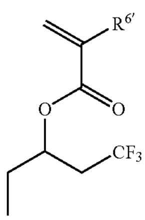
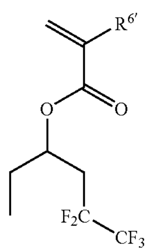
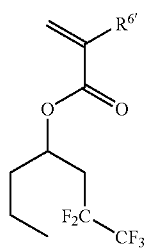
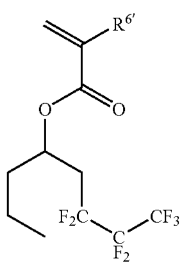
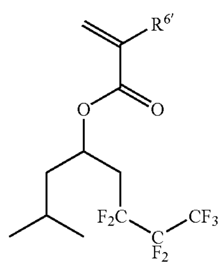
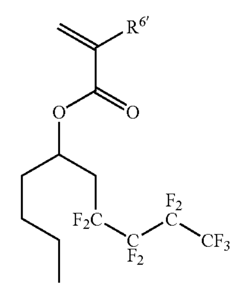
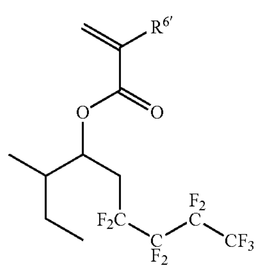
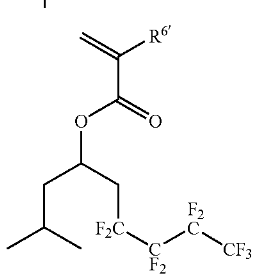
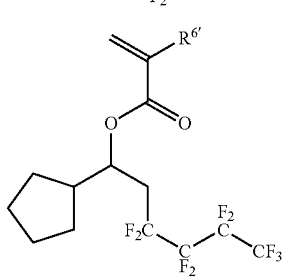
-continued
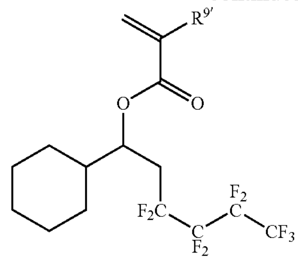
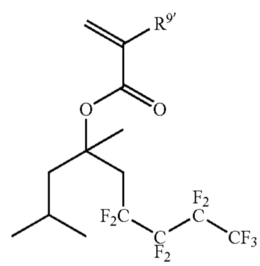
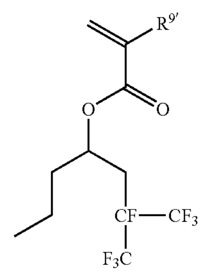
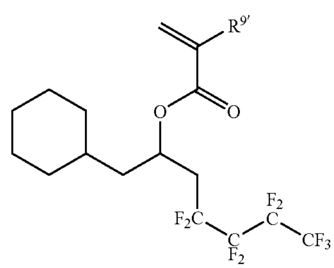
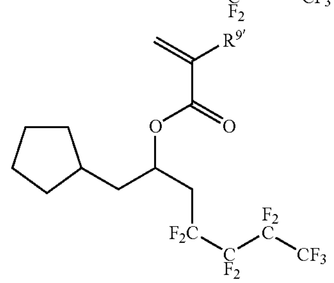
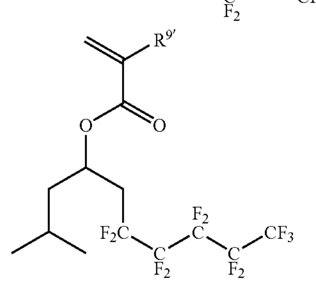
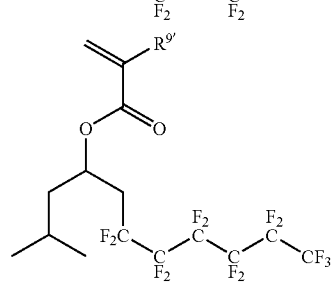

-continued

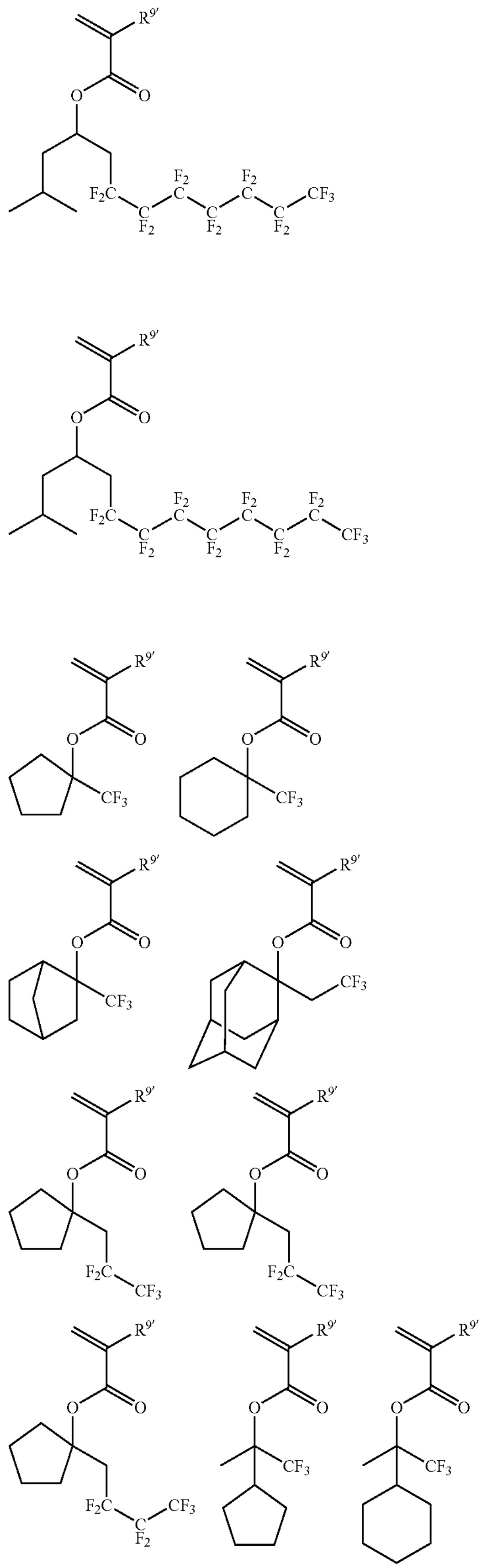

-continued

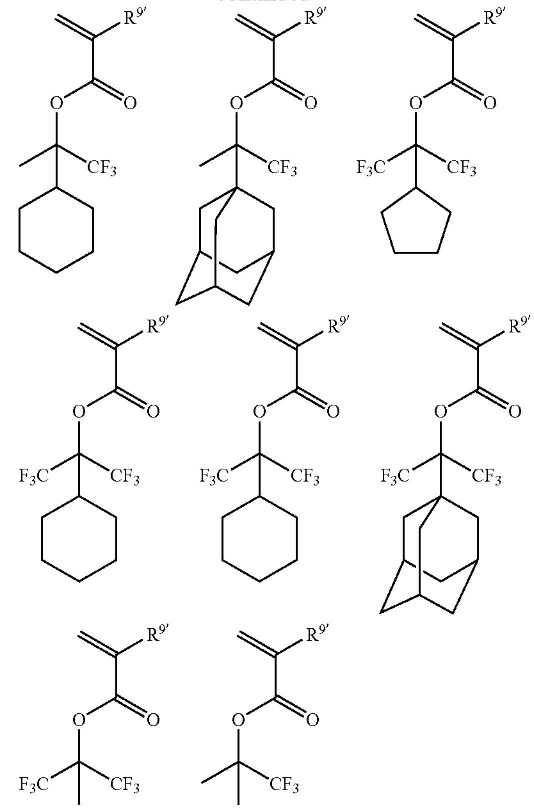

Wherein, $R^{9'}$ represents the same meanings as before.

Repeating units s-1 and s-2 may be copolymerized with an alkaline-soluble repeating unit containing a phenol group or a carboxyl group as mentioned before, or with an alkaline-insoluble repeating unit.

The amount of the alkaline-soluble surfactant as mentioned above to be added is preferably 0 to 50 parts, in particular 0 to 20 parts, relative to 100 parts of a base polymer. When the amount is too much, there is a chance of a increase in a film loss or a decrease in an etching resistance. When it is added, the amount is preferably one part or more.

As a basic quencher to be added in a composition for formation of a reverse film, a basic compound similar to the basic compound explained in the positive resist composition may be used. Namely, in a pattern-reversing film used in the patterning process of the present invention, a basic compound may be added in order to inhibit an acid-diffusion from a resist pattern after development. Especially, when a phenolic compound substituted with an acid-labile group or a carboxyl-containing compound are used as a material for formation of a reverse film, there are problems in that an alkali-dissolution rate is increased by diffusion of an acid from the resist pattern or by a deprotection reaction which increases a dimension of the reversed pattern thereby causing the film loss. Addition of a basic compound is effective to avoid such a problem. Basic compounds used in a resist composition and a reverse pattern film may be the same or different with each other.

The amount of the basic compound (basic quencher) to be added is preferably 0 to 10 parts, in particular 0 to 5 parts, relative to 100 parts of the base polymer. When it is added, the amount is preferably 0.1 part or more.

As an organic solvent in a material for a reverse pattern film used in the patterning process of the present invention, an alcohol having 3 to 10 carbon atoms or an ether having 8 to 12 carbon atoms, in addition to the organic solvent used in the positive resist composition as mentioned before, may be used in order to avoid a mixing with a positive resist film (resist pattern). Specific examples of it include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

As the ether compound having 8 to 12 carbon atoms, one or more kinds selected from di-n-butyl ether, di-isobutyl ether, di-sec-butyl ether, di-n-pentyl ether, di-isopentyl ether, di-sec-penthyl ether, di-tert-amyl ether, and di-n-hexyl ether may be used.

Amount of the organic solvent to be used is preferably 200 to 3,000 parts, in particular 400 to 2,000 parts, relative to 100 parts of the base polymer.

In the patterning method of the present invention, a chemically amplified resist composition with the composition as mentioned above is applied on a substrate to form a resist film. In this case of the present invention, as shown in FIG. 1(A), by using a positive resist composition, a resist film 30 is formed on a processing film 20 formed on a substrate 10 directly or via an intermediate film (underlying film) 50. In this case, a thickness of the resist film is preferably 10 to 1,000 nanometers, in particular 20 to 500 nanometers. This resist film is heated (pre-baked) before an exposure with conditions of preferably a temperature of 60 to 180° C., in particular 70 to 150° C., and a time of 10 to 300 seconds, in particular 15 to 200 seconds.

A silicon substrate is generally used as a substrate 10. A processing film 20 may be exemplified by $SiO_2$, SiN, SiON, SiOC, p-Si, α-Si, TiN, Wsi, BPSG, SOG, Cr, CrO, CrON, MoSi, a low dielectric film and its etching stopper film, and the like. An intermediate film 50 may be exemplified by a hard mask such as $SiO_2$, SiN, SiON, and p-Si, an underlying film formed of a carbon film and a silicon-containing intermediate film, an organic anti-reflection film, and the like.

The carbon film may be formed by spin-coating, or may be an amorphous carbon film formed by a CVD method.

A spin-on carbon film may be exemplified by resin compounds including a nortricyclene copolymer disclosed in Japanese Patent Laid-Open (kokai) No. 2004-205658, a hydrogenated naphthol novolak resin disclosed in Japanese Patent Laid-Open (kokai) No. 2004-205676, a naphthol dicyclopentadiene copolymer disclosed in Japanese Patent Laid-Open (kokai) No. 2004-205685, a phenol dicyclopentadiene copolymer disclosed in Japanese Patent Laid-Open (kokai) Nos. 2004-354554 and 2005-10431, a fluorene bisphenol novolak disclosed in Japanese Patent Laid-Open (kokai) No. 2005-128509, an acenaphthylene copolymer disclosed in Japanese Patent Laid-Open (kokai) No. 2005-250434, an indene copolymer disclosed in Japanese Patent Laid-Open (kokai) No. 2006-53543, a phenol-containing fullerene disclosed in Japanese Patent Laid-Open (kokai) No. 2006-227391, a bisphenol compound and its novolak resin disclosed in Japanese Patent Laid-Open (kokai) Nos. 2006-259249, 2006-293298, and 2007-316282, dibisphenol compound and its novolak resin disclosed in Japanese Patent Laid-Open (kokai) No. 2006-259482, a novolak resin of an adamantane phenol compound disclosed in Japanese Patent Laid-Open (kokai) No. 2006-285095, a hydroxyvinyl naphthalene copolymer disclosed in Japanese Patent Laid-Open (kokai) No. 2007-171895, a bisnaphthol compound and its novolak resin disclosed in Japanese Patent Laid-Open (kokai) No. 2007-199653, ROMP disclosed in Japanese Patent Laid-Open (kokai) No. 2008-26600, and a tricyclopentadiene copolymer disclosed in Japanese Patent Laid-Open (kokai) No. 2008-96684.

A material for the organic anti-reflection film may be exemplified by a condensate between a diphenylamine derivative and a formaldehyde-modified melamine resin, and by a mixture of an alkaline-soluble resin and a light-absorber disclosed in Japanese Patent Publication No. H7-69611, a reaction product of a maleic anhydride copolymer with a diamine-type light-absorber disclosed in U.S. Pat. No. 5,294,680, a mixture containing a resin binder and a methylolmelamine type crosslinking agent disclosed in Japanese Patent laid-Open (kokai) No. H6-118631, an acryl-based resin containing a carboxylic acid group, an epoxy group, and a light-absorbing group in the same molecule disclosed in Japanese Patent laid-Open (kokai) No. H6-118656, a mixture containing a methylol melamine and a benzophenone-type light-absorber disclosed in Japanese Patent laid-Open (kokai) No. H8-87115, a mixture containing a polyvinyl alcohol resin and a low-molecular weight light-absorber disclosed in Japanese Patent laid-Open (kokai) No. H8-179509, and the like. All of them are formed by adding a light-absorber to a binder polymer or by introducing a light-absorbing substituent to a binder polymer.

Then, an exposure is done. High energy beams with wavelengths of 140 to 250 nanometers, in particular an ArF excimer laser with a wavelength of 193 nanometers, are preferably used. An exposure may be done in an atmosphere, in a dry nitrogen stream, or in water-immersion exposure. In the ArF immersion lithography, a pure water or a liquid with a refractive index of 1 or more and a high transparency to a wavelength of an exposure such as an alkane may be used as an immersion solvent. In the immersion lithography, a pure water or other liquid is introduced between a resist film after the pre-bake and a projector lens. With this, a lens with NA of 1.0 or more may be designable, thereby enabling to form a further finer pattern. The immersion lithography is an important technology to prolong a life of the ArF lithography till a 45 nanometers node. In the immersion exposure, in order to remove water droplets remained on a resist film, rinsing with a pure water may be done after the exposure (post soak), or a top coat may be formed on a resist film after the pre-bake in order to inhibit dissolution from a resist film or to improve a smoothness of a film surface. A resist-top coat used in the immersion lithography is preferably a material formed of a base polymer having a 1,1,1,3,3,3-hexafluoro-2-propanol residue, dissolved in an alcoholic solvent having 4 or more carbons, an ether-type solvent having 8 to 12 carbon atoms, or a mixture thereof. After formation of a photo resist film, an acid-generator and so forth may be extracted from a film surface by rinsing with a pure water (post soak), or particles may be rinsed out, or after exposure, remaining water on the film may be removed by rinsing (post soak).

The exposure amount in the exposure is about 1 $mJ/cm^2$ to about 200 $mJ/cm^2$, and preferably about 10 $mJ/cm^2$ to about 100 $mJ/cm^2$. Then, a post exposure bake (PEB) is done on a hot plate at 60 to 150° C. and for 1 to 5 minutes, and preferably at 80 to 120° C. and for 1 to 3 minutes.

Development is done with a dip method, a puddle method, a spray method, and the like, used in the art, by using an aqueous alkaline developer such as tetramethyl ammonium hydroxide (TMAH) with a concentration of 0.1 to 5% by weight, preferably 2 to 3% by weight, and for 0.1 to 3 minutes, preferably 0.5 to 2 minutes, to obtain a desired resist pattern 30*a* on a substrate (See FIG. 1(B)).

In this case, a dot patter with a half pitch of 38×38 nanometers to 100×100 nanometers, in particular 40×40 nanometers to 80×80 nanometers may be formed. A dot with a minimum half-pitch of 38 nanometers may be formed if NA of 1.35 is used, though the dimension is dependent on NA of a projector lens. The dot pattern may be a rectangular or a square. Method for forming the dot pattern is not particularly limited, but the finest half-pitch hole may be formed when a high energy beam is irradiated to form a first line pattern on the resist film as mentioned above, and then irradiated to form a second line pattern so as to perpendicularly intersect with the first line pattern, which is then followed by development.

Figure 2:
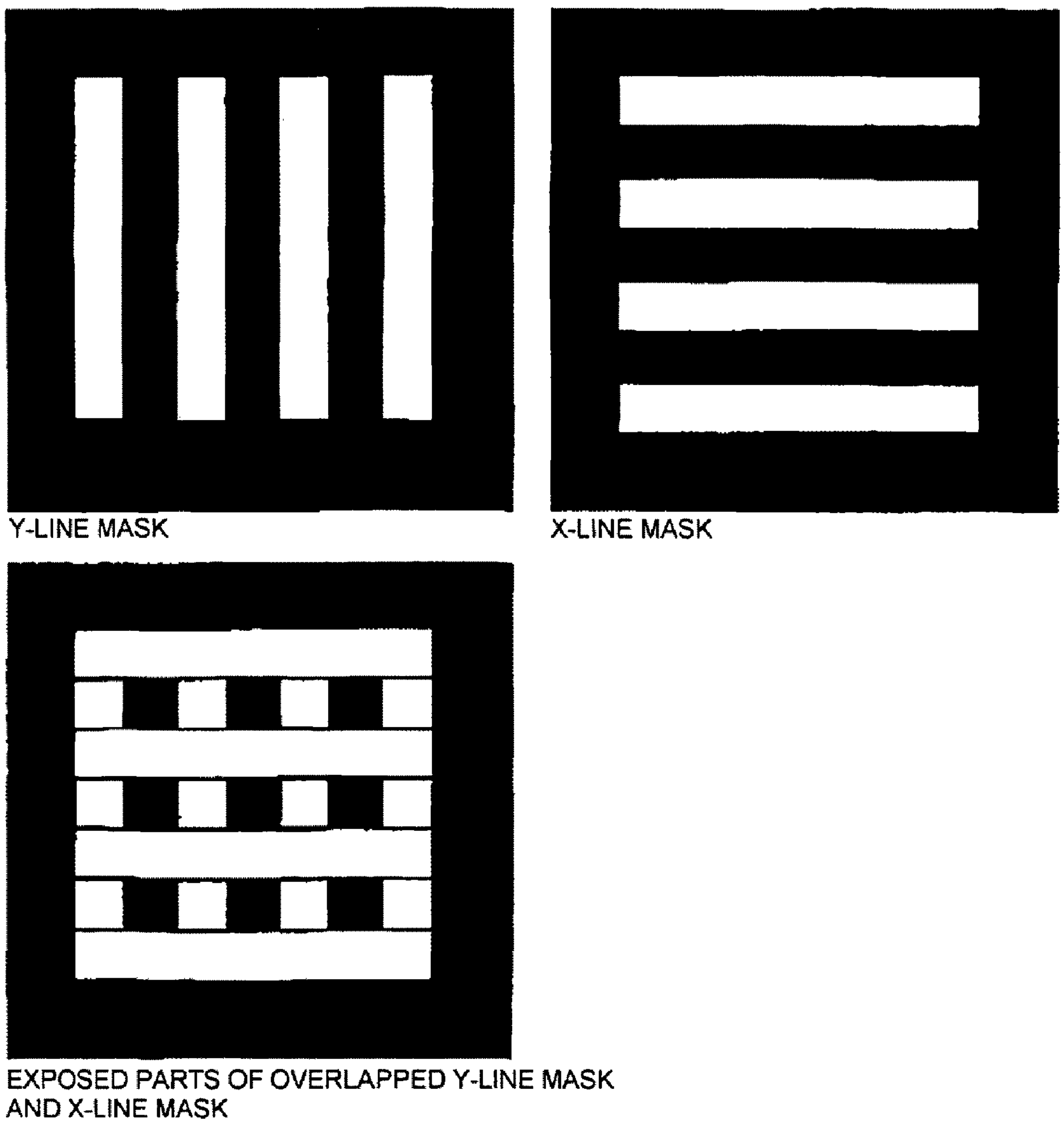
FIG. 2 is a drawing explaining how to obtain a dot pattern by a double dipole exposure.

For example, FIG. 2 illustrates a double dipole exposure method in which the dot pattern is formed by a Y-line exposure, then an X-line exposure, PEB, and development thereafter. In this case, white parts are an exposed region and black parts are a masked region.

FIG. 2 illustrates an optical contrast of holes, dots, and lines with a 45-nanometers pattern dimension and a 90-nanometers pitch by using a 1.3 NA lens. Each mask is a binary mask using a light-shielding Cr belt. Here, lines are formed with a dipole illumination with a 0.98 and diameter σ 0.2 plus s-polarized illumination, dots are formed with σ 0.98/0.735 ¾ annular illumination plus Azimuthally polarized illumination, and holes are formed with σ 0.98/0.735 ¾ annular illumination plus Azimuthally polarized illumination.

Usually, a slope of a mask edge shows an image contrast, and a steeper slope is advantageous in the pattern formation. According to this, a line pattern shows the highest contrast, followed by a dot pattern, and then a hole pattern. The contrast in a hole pattern is extremely low so that the pattern formation is difficult even with an extraordinarily high contrast resist film. Contrast of a dot pattern is slightly higher than a hole pattern. Contrast of a line pattern by a dipole illumination with an obliquely incoming stronger light plus a strong s-polarized illumination is high, thereby rendering a higher limiting resolution as compared with a two-dimensional dot pattern or a hole pattern which cannot use a strong deformed illumination. Formation of a fine hole pattern is one of immediate problems in a lithography technology. If a hole pattern is formed by reversing a dot pattern, a further improved miniaturization may be attained. A dot pattern may be formed by a double dipole method involving line-pattern exposures in X-direction, then in Y-direction, which is followed by development. With this method, it may be possible to form a finer dot pattern than a conventional method using a mask having a dot pattern.

Accordingly, a fine hole with high precision may be formed by reversing this according to the present invention.

Figure 3:
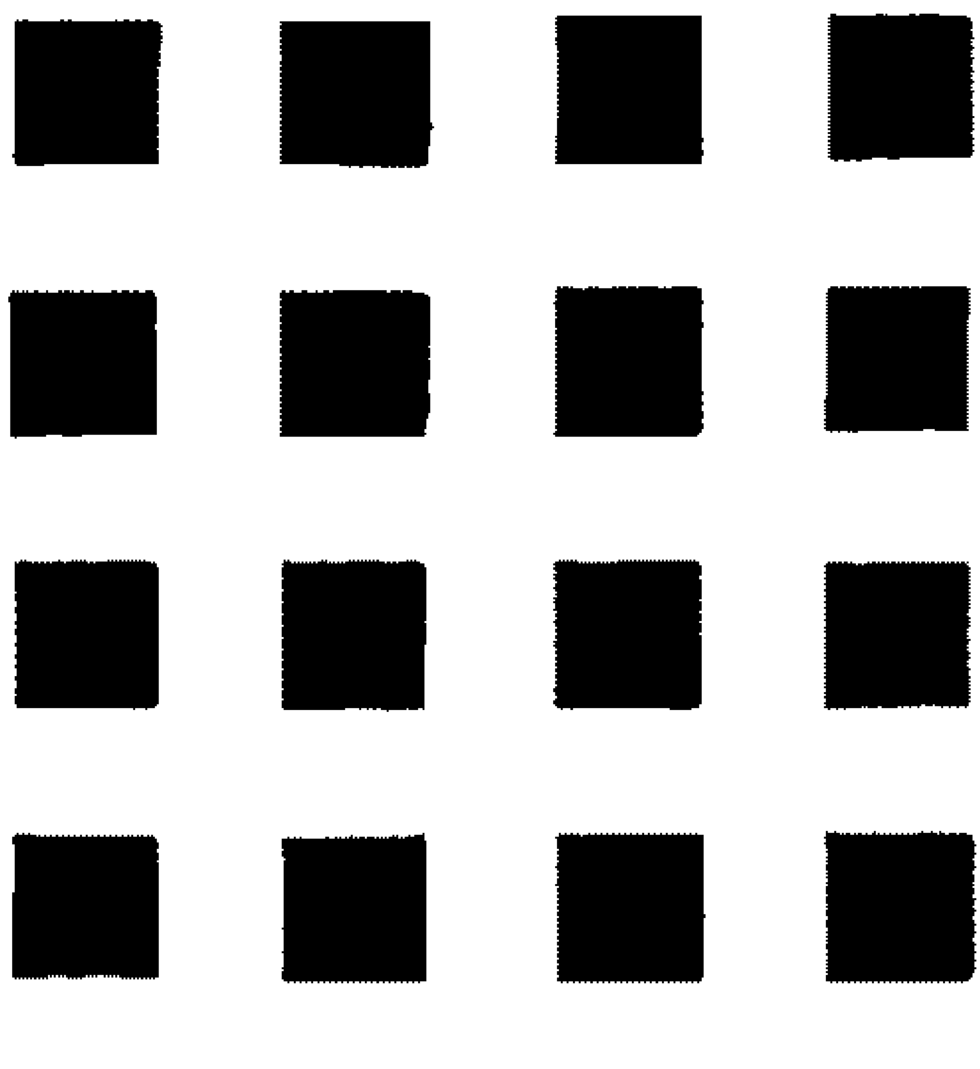
FIG. 3 is a diagram explaining how to obtain a dot pattern by a single exposure by using a mask with a dot pattern.

According to the present invention, holes may be formed by reversing a dot pattern after it is formed by a single exposure using a mask shown in FIG. 3. In this case, although formation of holes with fine pitches comparable with the dots formed by two exposures as mentioned above may not be expected, there is a merit of easy forming of a dot pattern by a single exposure.

Then, an acid-labile group of a polymer in the above-mentioned pattern is dissociated, and concurrently the polymer is crosslinked to form a crosslinked pattern 30*b* (see FIG. 1(C)). In this case, dissociation of an acid-labile group of a polymer in the resist pattern and crosslinking may be done by using an acid or a heat. Here, after an acid is generated, deprotection of the acid-labile group and crosslinking may be done simultaneously by heating. Acid generation may be done by decomposing a photo-inductive acid-generator with a flood exposure to the wafer (pattern) after development. Wavelength of the flood exposure is 180 to 400 nanometers and the exposure amount is 10 mJ/cm$^2$ to 1 J/cm$^2$. Exposure of an excimer laser or an excimer lamp with wavelength of 180 nm or less, in particular 172 nanometers, 146 nanometers, and 122 nanometers not only generates an acid from an acid-generator but also accelerates crosslinking by light, thereby decreasing an alkali-dissolution rate due to excessive crosslinking, thus it is not preferable. Preferably used wavelengths in the flood exposure are 180 nanometers or longer in an ArF excimer laser, 222 nanometers in a KrCl excimer lamp, 248 nanometers in a KrF excimer laser, around 254 nanometers in a low-pressure mercury lamp, 308 nanometers in a XeCl excimer lamp, and 365 nanometers in an i-line. An acid may also be generated by heating a heat-inductive acid generator of an ammonium salt added in a positive resist composition. In this case, generation of an acid and crosslinking take place simultaneously. Heating conditions with a temperature of 150 to 300° C., in particular 150 to 250° C., and a time of 10 to 300 seconds are preferable. With this, a solvent-insoluble used in a material for formation of a reverse film crosslinked resist pattern of a material for formation of a reverse film is formed. When the heating temperature is 150° C. or lower, the crosslinking is insufficient, which may lead to insufficient solvent resistance in a reverse film material in a certain case. When the heating temperature is 250° C. or higher, crosslinking goes too far so that the alkali-dissolution rate is also decreased, thereby risking not to form a reverse pattern. Accordingly, the conditions may be chosen in such a manner as to secure the etching rate in an alkaline wet-etching liquid used in a positive-negative reversing step, and to render an appropriate resistance with regard to an organic solvent used in a composition for formation of a reverse film.

Specific examples of the heat-inductive acid-generator, as mentioned above, include the following compounds with its added amount being preferably 0 to 15 parts, in particular 0 to 10 parts, relative to 100 parts of a base resin. When added, the amount is preferably 0.1 part or more:

(P1a-2)

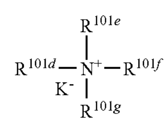

Wherein, $K^-$ represents a sulfonic acid whose at least one α-position is fluorinated, perfluoroalkyl imidic acid, or perfluoroalkyl methide acid. Each of $R^{101d}$, $R^{101e}$, $R^{101f}$ and $R^{101g}$ represents any of a hydrogen atom, a linear, a branched, or a cyclic alkyl group, an alkenyl group, an oxoalkyl group, an oxoalkenyl group having 1 to 12 carbon atoms, an aryl group having 6 to 20 carbon atoms, an aralkyl group and aryloxoalkyl group having 7 to 12 carbon atoms, wherein a part or all of hydrogen atoms of these groups may be substituted by an alkoxy group. $R^{101d}$ and $R^{101e}$, and $R^{101d}$, $R^{101e}$, and $R^{101f}$ may be bonded to form a ring together with a nitrogen atom to which these groups are bonded, and when forming the ring, $R^{101d}$ and $R^{101e}$ and $R^{101d}$, $R^{101e}$, and $R^{101f}$ represent an alkylene group having 3 to 10 carbon atoms or form a heteroaromatic ring containing the nitrogen atom in the formula in it.

Then, as shown in FIG. 1(D), a reverse film 40 is formed by coating to cover a crosslinked resist pattern 30*b* by a material for formation of a reverse film. In this case, a thickness of a reverse film 40 is preferably the same as the height of the resist pattern or within ±30 nanometers of it.

Thereafter, a surface part of the reverse film 40 is dissolved by the alkaline developer (wet-etching liquid) as mentioned above to expose the crosslinked resist pattern 30*b*. With this, the dissolution rate of the crosslinked resist pattern 30*b* into the alkaline developer is extraordinary faster than the dissolution rate of the revere film 40, and thus, the crosslinked resist pattern 30*b* is selectively dissolved and removed to form a pattern 40*a* having a reversed pattern of the crosslinked resist pattern 30*b* in the reverse film 40 as shown in FIG. 1(E). In this case, when the resist pattern 30*a* is a dot pattern, a hole pattern is formed as a reversed pattern.

As shown in FIG. 1(F), if there is an intermediate film 50 such as a hard mask with a mask of the reversed pattern 40*a*, this intermediate film is etched, and then a processing film 20 of a substrate film 10 is etched as shown in FIG. 1(G). In this case, the intermediate film 50 such as a hard mask is etched by a dry etching using a Freon or a halogen gas. Etching of a processing film 20 may be done with a dry etching using a gas arbitrarily selected from Freons, halogen-types, an oxygen, a hydrogen, and the like under arbitrarily selected conditions to differentiate from the hard mask etching. Finally, the reverse film and the underlying film are removed in a method known in the art.

EXAMPLES

In the following, the present invention will be explained specifically by Synthetic Examples, Examples, and Comparative Examples, but the present invention is not restricted to the following Examples and so forth. Here, the weight-average molecular weight (Mw) is shown in terms of the weight-average molecular weight of polystyrene obtained by a GPC method.

Synthetic Examples

By combining each monomer, a co-condensation reaction was carried out in the presence of an acetic acid catalyst in water/ethanol. The resulting reaction mixture was washed by water repeatedly until an organic film became neutral, and then concentrated to obtain an oligomer for a polymer used in a reverse film.

This was diluted by toluene, and heated with addition of potassium hydroxide under reflux. After cooled, the resulting reaction solution was diluted by methyl isobutyl ketone, washed by water repeatedly until an organic film became neutral, and then concentrated to obtain a polymer. The polymers obtained as mentioned above are shown below (Polymers 1 to 14, and Comparative Polymers 1 and 2).

Polymer 1: Polymer 1 was obtained from Monomer 1 and Monomer 2 which will be explained later.

Molecular weight (Mw)=2,800

Molecular weight distribution (Mw/Mn)=1.88

Polymer 1

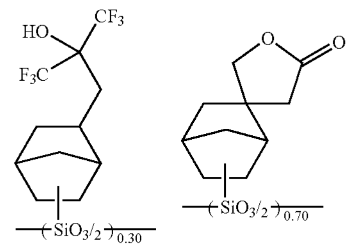

Polymer 2: Polymer 2 was obtained from Monomer 3 and Monomer 4.

Molecular weight (Mw)=2,100

Molecular weight distribution (Mw/Mn)=1.53

Polymer 2

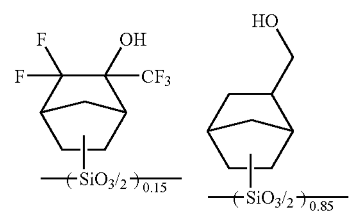

Polymer 3: Polymer 3 was obtained from Monomer 5 and Monomer 6.

Molecular weight (Mw)=5,100

Molecular weight distribution (Mw/Mn)=1.75

Polymer 3

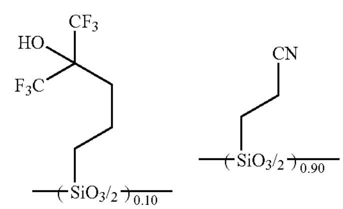

Polymer 4: Polymer 4 was obtained from Monomer 7 and Monomer 8.

Molecular weight (Mw)=4,300

Molecular weight distribution (Mw/Mn)=1.47

Polymer 4

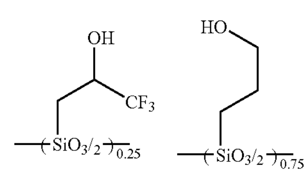

Polymer 5: Polymer 5 was obtained from Monomer 9 and Monomer 10.

Molecular weight (Mw)=2,200

Molecular weight distribution (Mw/Mn) 1.43

Polymer 5

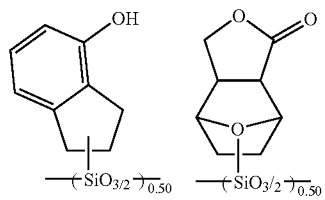

Polymer 6: Polymer 6 was obtained from Monomer 11 and Monomer 10.

Molecular weight (Mw)=3,100

Molecular weight distribution (Mw/Mn)=1.53

Polymer 6

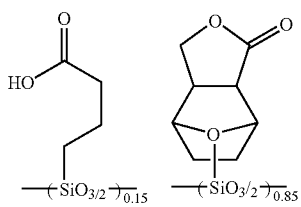

Polymer 7: Polymer 7 was obtained from Monomer 12 and Monomer 6.

Molecular weight (Mw)=4,300

Molecular weight distribution (Mw/Mn)=1.48

Polymer 7

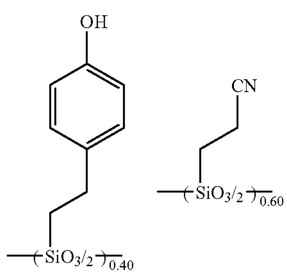

Polymer 8: Polymer 8 was obtained from Monomer 5, Monomer 6, and tetraethoxy silane.

Molecular weight (Mw)=5,700

Molecular weight distribution (Mw/Mn)=1.82

Polymer 8

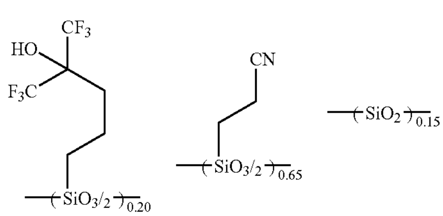

Polymer 9: Polymer 9 was obtained from Monomer 5, Monomer 8, and Monomer 13.

Molecular weight (Mw)=5,900

Molecular weight distribution (Mw/Mn)=1.78

Polymer 9

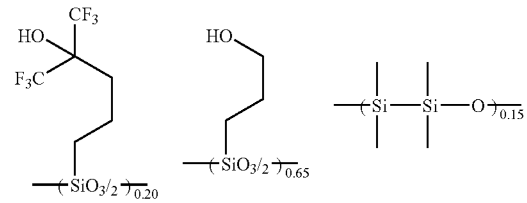

Polymer 10: Polymer 10 was obtained from Monomer 5, Monomer 6, and titanium tetrabutoxide.

Molecular weight (Mw)=6,100

Molecular weight distribution (Mw/Mn)=2.10

Polymer 10

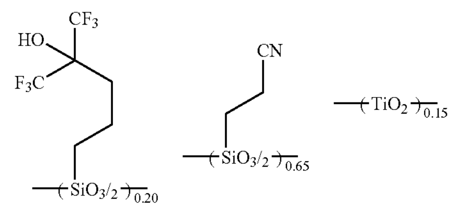

Polymer 11: Polymer 11 was obtained from Monomer 5, Monomer 6, and zirconium tetrabutoxide.

Molecular weight (Mw)=5,100

Molecular weight distribution (Mw/Mn)=1.98

Polymer 11

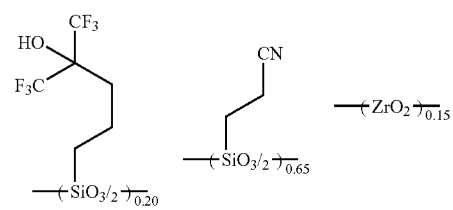

Polymer 12: Polymer 12 was obtained from Monomer 14, Monomer 1, and Monomer 2.

Molecular weight (Mw)=1,900

Molecular weight distribution (Mw/Mn)=1.33

Polymer 12

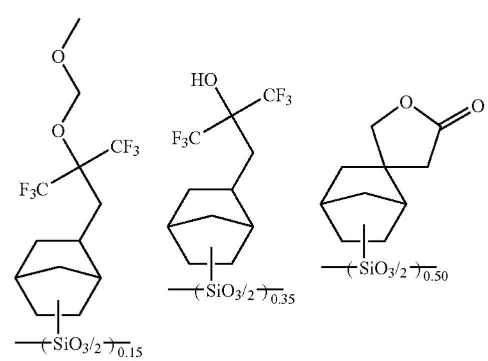

Polymer 13: Polymer 13 was obtained from tetraethoxy silane.

Molecular weight (Mw)=8,900

Molecular weight distribution (Mw/Mn)=1.93

$-(SiO_2)_{1.0}$ Polymer 13

Polymer 14: Polymer 14 was obtained from tetraethoxy silane and phenyl triethoxy silane Molecular weight (Mw)=8,300

Molecular weight distribution (Mw/Mn)=1.92

Polymer 14

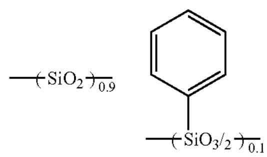

Polymers 1 to 14 as mentioned above, Comparative Polymers 1 and 2 as will be mentioned below, an alkaline-soluble surfactant to improve the alkali-dissolution rate on the surface, an alkali-soluble etching-resistance improver, a basic quencher, and a solvent were blended according to the composition shown in Table 1 to obtain a material for a reverse pattern film. Into a solvent was added 100 ppm of a fluorinated surfactant FC-4430 (manufactured by Sumitomo 3M Ltd.). The material for a reverse pattern film was applied on a HMDS primer-treated silicon substrate with 8 inch diameters (200 millimeters), and baked at 110° C. for 60 seconds to form a reverse pattern film with thickness of nanometers. This was developed in a developer of an aqueous tetramethyl ammonium hydroxide (TMAH, concentration of 2.38% by weight) for 30 seconds to measure a film loss from which a dissolution rate per one second was calculated. RF-19 and RF-20 were developed in a developer of an aqueous tetramethyl ammonium hydroxide (TMAH, concentration of 0.0476% by weight) for 30 seconds to measure a film loss from which a dissolution rate per one second was calculated. The results are shown in Table 1.

Monomer 1

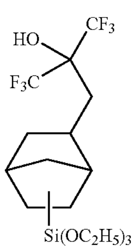

Monomer 2

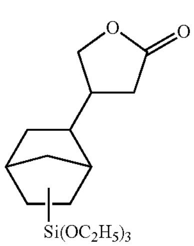

-continued

Monomer 3

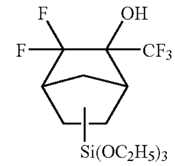

Monomer 4

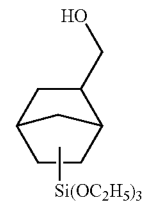

Monomer 5

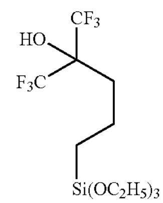

Monomer 6

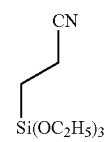

Monomer 7

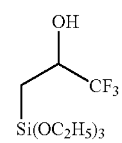

Monomer 8

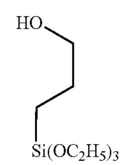

Monomer 9

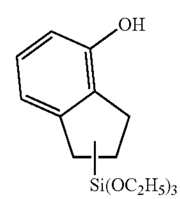

Monomer 10

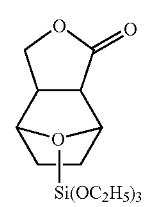

-continued

Monomer 11

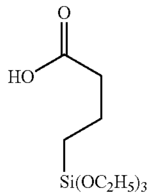

Monomer 12

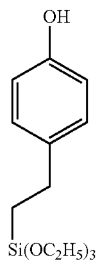

Monomer 13

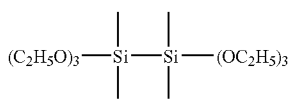

Monomer 14

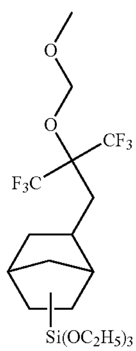

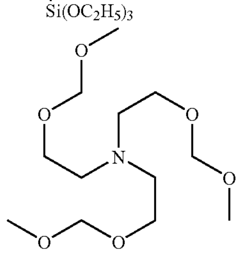

Basic quencher

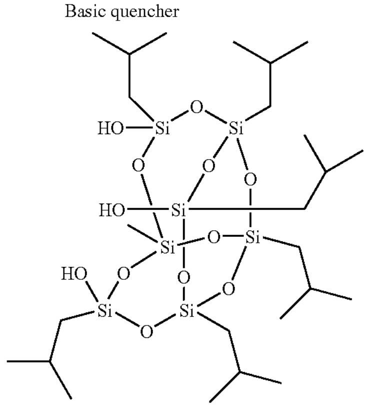

Silicon-type additive

Comparative Polymer 1
Molecular weight (Mw)=9,100
Molecular weight distribution (Mw/Mn)=1.74

Comparative Polymer 1

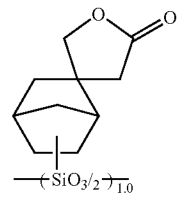

Comparative Polymer 2
Molecular weight (Mw)=9,900
Molecular weight distribution (Mw/Mn)=1.89

Comparative Polymer 2

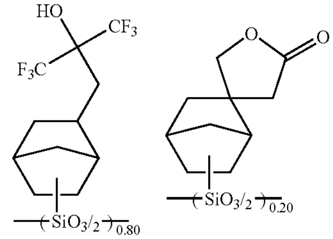

Alkali-soluble surfactant 1

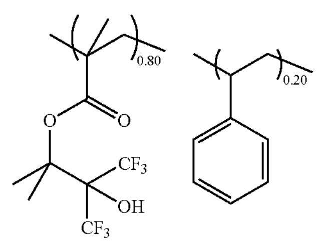

Mw 8,300 Mw/Mn 1.80

Alkali-soluble surfactant 2

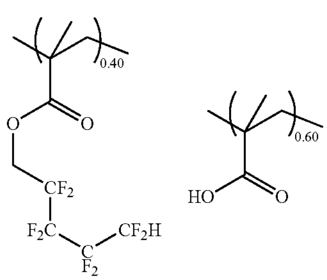

Mw 9,700 Mw/Mn 1.79

Alkali-soluble surfactant 3

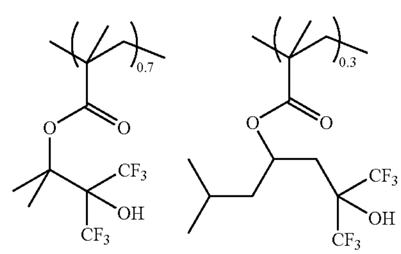

Mw 8,200 Mw/Mn 1.76

TABLE 1

| Reverse pattern film | Polymer (Parts by Weight) | Additive (Parts by Weight) | Solvent (Parts by Weight) | Dissolution Rate (nm/s) |
| --- | --- | --- | --- | --- |
| RF 1 | Polymer 1 (100) | | PGMEA (3000) | 0.2 |
| RF 2 | Polymer 2 (100) | | EL (3200) | 0.3 |
| RF 3 | Polymer 3 (100) | — | PGMEA/EL (2550/450) | 0.2 |
| RF 4 | Polymer 4 (100) | — | PGME/EL (2550/450) | 0.16 |
| RF 5 | Polymer 5 (100) | — | PGMEA/PGME (2550/450) | 0.11 |
| RF 6 | Polymer 6 (100) | — | PGMEA/Cyclohexanone (2550/450) | 0.5 |
| RF 7 | Polymer 7 (100) | — | PGME (3000) | 0.3 |
| RF 8 | Polymer 8 (100) | — | PGME (3000) | 0.3 |
| RF 9 | Polymer 9 (100) | — | PGME (3000) | 0.3 |
| RF 10 | Polymer 10 (100) | — | PGME (3000) | 0.3 |
| RF 11 | Polymer 11 (100) | — | PGME (3000) | 0.3 |
| RF 12 | Polymer 12 (100) | Basic quencher (1.0) | PGME (3000) | 0.3 |
| RF 13 | Polymer 4 (100) | Organic silicon Additive (5.0) | PGME (3000) | 0.16 |
| RF 14 | Polymer 5 (95) | Alkali-soluble surfactant 1 (5.0) | PGMEA (3000) | 0.45 |
| RF 15 | Polymer 5 (80) | Alkali-soluble surfactant 3 (5.0) | PGMEA (3000) | 0.15 |
| RF 16 | Comparative Polymer 1 (70) | Alkali-soluble surfactant 2 (5.0) | PGMEA (3000) | 0.13 |
| RF 17 | Comparative Polymer 1 (70) | — | PGMEA (3000) | 0.001 |
| RF 18 | Comparative Polymer 2 (70) | — | PGMEA (3000) | 8.5 |
| RF 19 | Polymer 13 (100) | | PGPE (3000) Water (100) | 0.2 |
| RF 20 | Polymer 14 (100) | | PGPE (3200) | 0.3 |

PGMEA: Propyleneglycol monomethyl ether acetate

EL: Ethyl lactate

PGME: Propyleneglycol monomethyl ether

PGPE: Propyleneglycol monopropyl ether

[Preparation of Chemically Amplified Positive Resist Compositions and Materials for Alkali-Soluble Top Coats]

Each of polymers shown below (Resist Polymers 1 to 9, Comparative Resist Polymers 1 and 2, and Polymer for Top Coat) was dissolved according to the composition shown in Tables 2 and 3, and the resulting solution was filtered through a filter of 0.2-micrometer pore diameter to obtain a resist solution and a solution for a top coat.

Each composition in Table 2 and 3 are as following.

Resist Polymer 1

Molecular weight (Mw)=8,310

Molecular weight distribution (Mw/Mn)=1.73

Resist Polymer 1

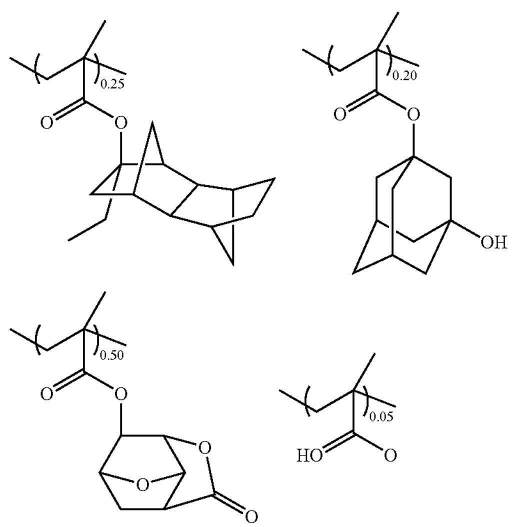

Resist Polymer 2

Molecular weight (Mw)=7,300

Molecular weight distribution (Mw/Mn)=1.67

Resist Polymer 2

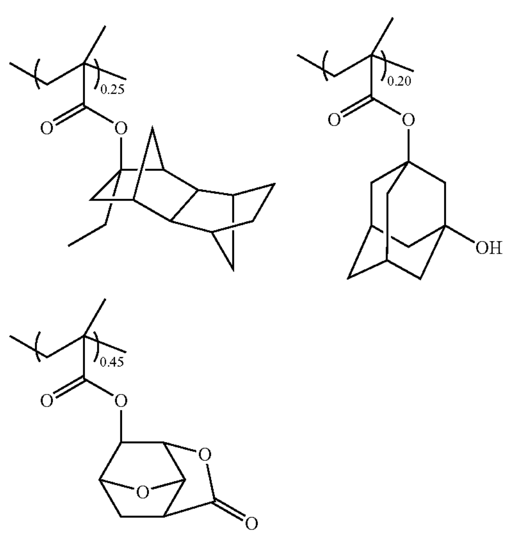

-continued

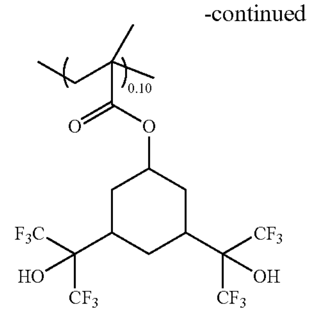

Resist Polymer 3

Molecular weight (Mw)=7,300

Molecular weight distribution (Mw/Mn)=1.67

Resist Polymer 3

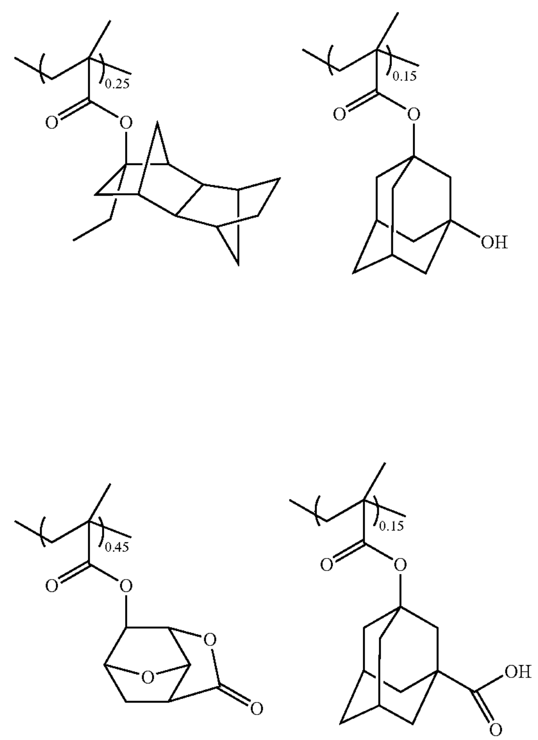

Resist Polymer 4

Molecular weight (Mw)=6,600

Molecular weight distribution (Mw/Mn)=1.83

Resist Polymer 4

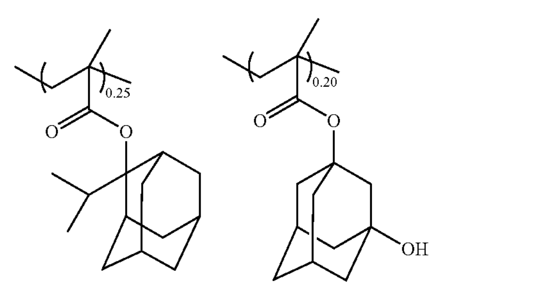

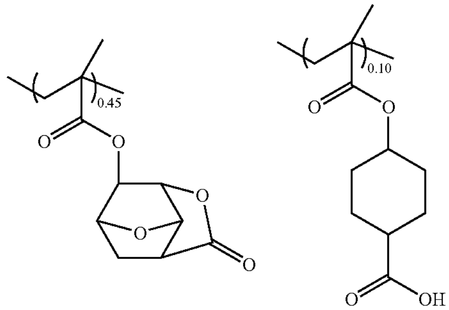

Resist Polymer 5

Molecular weight (Mw)=7,100

Molecular weight distribution (Mw/Mn)=1.73

Resist Polymer 5

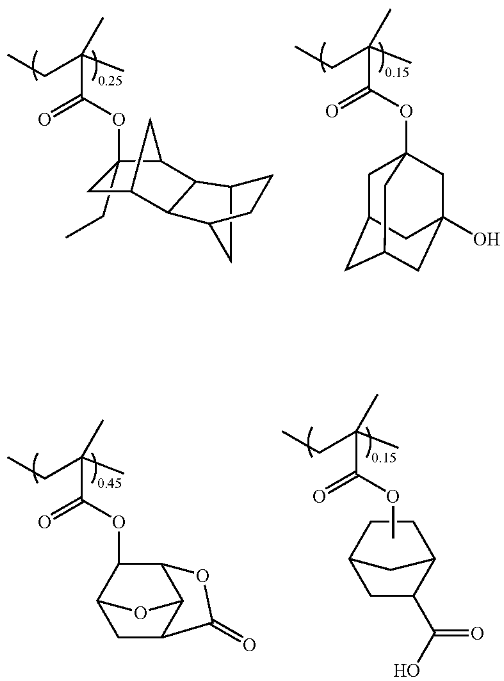

Resist Polymer 6

Molecular weight (Mw)=7,500

Molecular weight distribution (Mw/Mn)=1.85

Resist Polymer 6

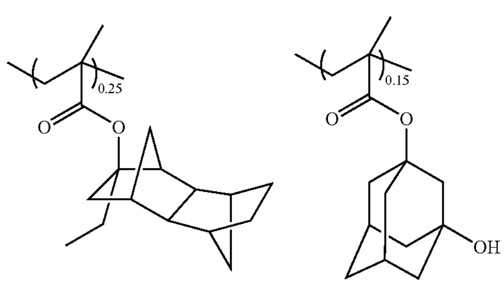

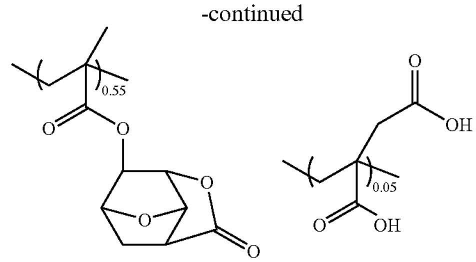

Resist Polymer 7

Molecular weight (Mw)=7,300

Molecular weight distribution (Mw/Mn)=1.67

Resist Polymer 7

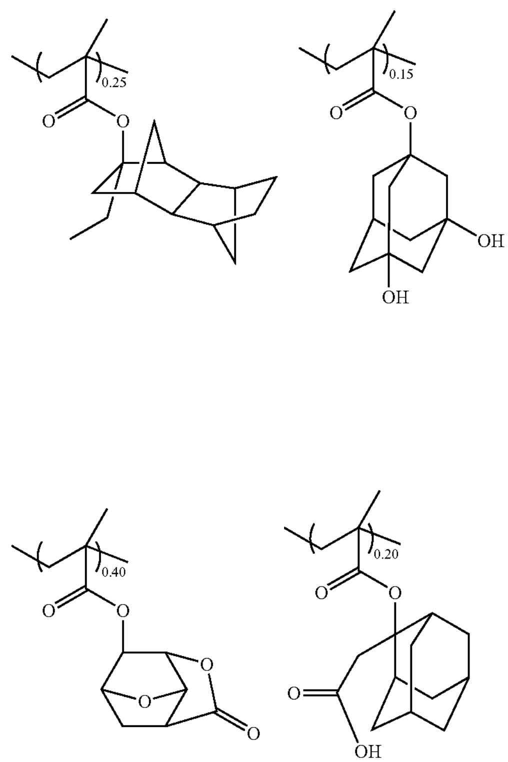

Resist Polymer 8

Molecular weight (Mw)=6,800

Molecular weight distribution (Mw/Mn)=1.79

Resist Polymer 8

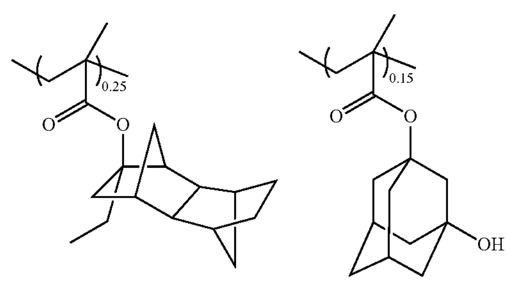

-continued
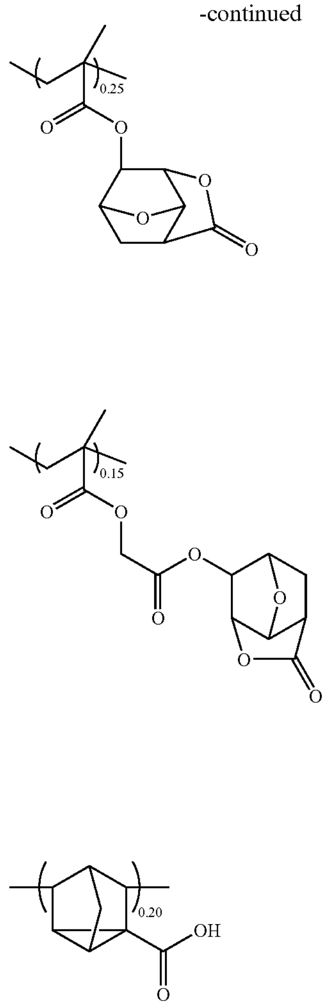
Resist Polymer 9
Molecular weight (Mw)=7,500
Molecular weight distribution (Mw/Mn)=1.86
Resist Polymer 9
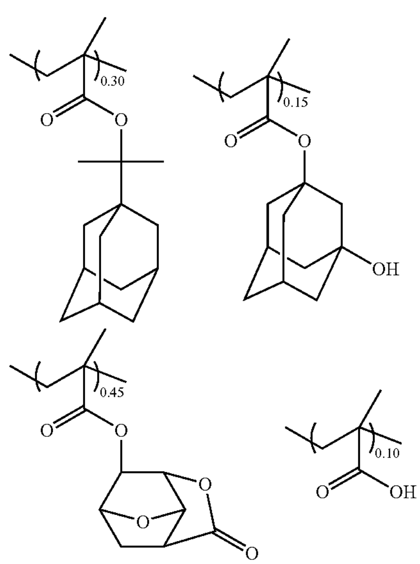
Comparative Resist Polymer 1
Molecular weight (Mw)=7,800
Molecular weight distribution (Mw/Mn)=1.67
Comparative Resist Polymer 1
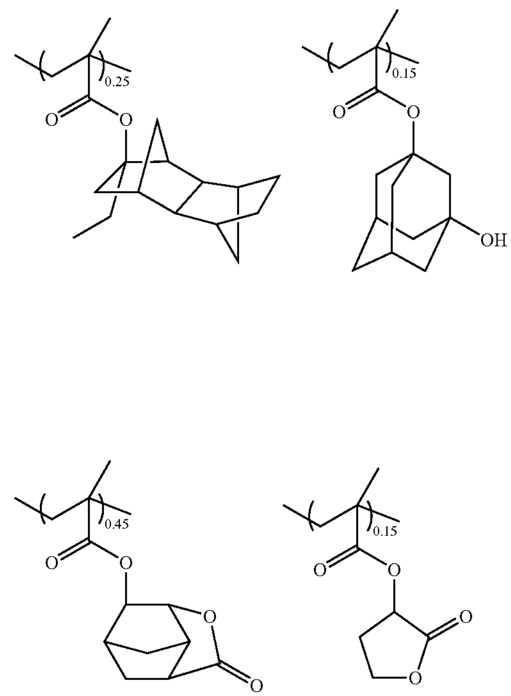
Comparative Resist Polymer 2
Molecular weight (Mw)=7,900
Molecular weight distribution (Mw/Mn)=1.78
Comparative Resist Polymer 2
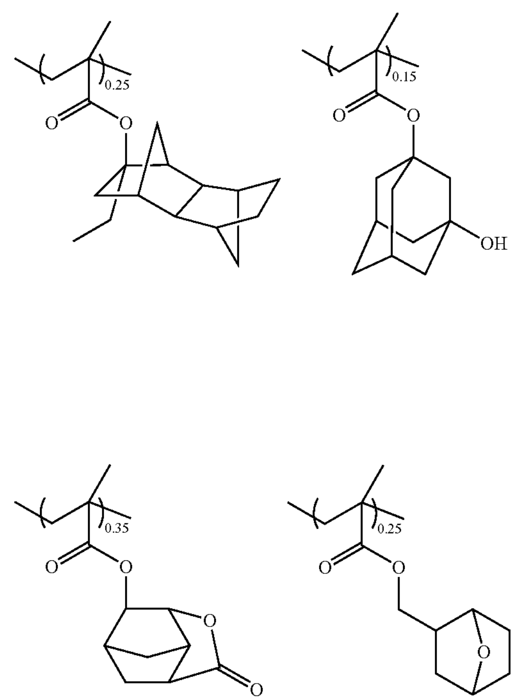

Polymer for Top Coat

Molecular weight (Mw)=8,800

Molecular weight distribution (Mw/Mn)=1.69

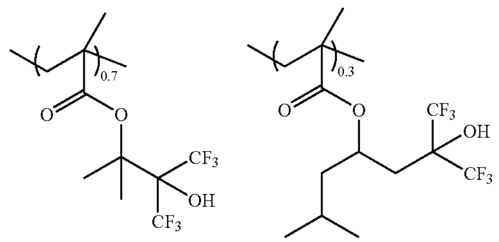

Polymer for Top Coat

Acid-Generator: PAG 1 (See the Following Formula)

PAG 1

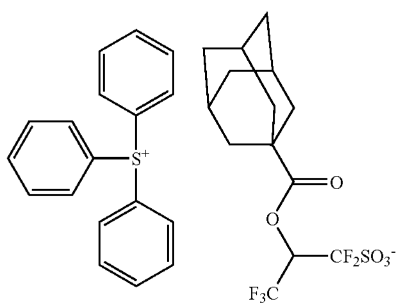

Heat-Inductive Acid-Generator: TAG 1 (See the Following Formula)

TAG 1

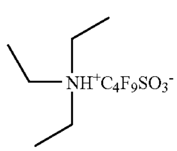

Basic Quencher: Quencher 1 (See the Following Formula)

Quencher 1

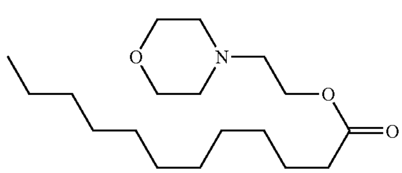

Organic Solvent: PGMEA (Propyleneglycol Monomethyl Ether Acetate)

TABLE 2

| | Polymer (Parts by weight) | Acid-generator (Parts by weight) | Basic compound (Parts by weight) | Organic solvent (Parts by weight) |
|---|---|---|---|---|
| Resist 1 | Resist Polymer 1 (100) | PAG 1 (14.0) | Quencher 1 (1.20) | PGMEA (2,000) |
| Resist 2 | Resist Polymer 2 (100) | PAG 1 (14.0) | Quencher 1 (1.20) | PGMEA (2,000) |
| Resist 3 | Resist Polymer 1 (100) | PAG 1 (14.0) TAG 1 (0.5) | Quencher 1 (1.20) | PGMEA (2,000) |
| Resist 4 | Resist Polymer 2 (100) | PAG 1 (14.0) TAG 1 (0.5) | Quencher 1 (1.20) | PGMEA (2,000) |
| Resist 5 | Resist Polymer 3 (100) | PAG 1 (14.0) TAG 1 (0.5) | Quencher 1 (1.20) | PGMEA (2,000) |
| Resist 6 | Resist Polymer 4 (100) | PAG 1 (14.0) TAG 1 (0.5) | Quencher 1 (1.20) | PGMEA (2,000) |
| Resist 7 | Resist Polymer 5 (100) | PAG 1 (14.0) TAG 1 (0.5) | Quencher 1 (1.20) | PGMEA (2,000) |
| Resist 8 | Resist Polymer 6 (100) | PAG 1 (14.0) TAG 1 (0.5) | Quencher 1 (1.20) | PGMEA (2,000) |
| Resist 9 | Resist Polymer 7 (100) | PAG 1 (14.0) TAG 1 (0.5) | Quencher 1 (1.20) | PGMEA (2,000) |
| Resist 10 | Resist Polymer 8 (100) | PAG 1 (14.0) TAG 1 (0.5) | Quencher 1 (1.20) | PGMEA (2,000) |
| Resist 11 | Resist Polymer 9 (100) | PAG 1 (14.0) TAG 1 (0.5) | Quencher 1 (1.20) | PGMEA (2,000) |
| Comparative Resist 1 | Comparative Resist Polymer 1 (100) | PAG 1 (14.0) TAG 1 (0.5) | Quencher 1 (1.20) | PGMEA (2,000) |
| Comparative Resist 2 | Comparative Resist Polymer 2 (100) | PAG 1 (14.0) TAG 1 (0.5) | Quencher 1 (1.20) | PGMEA (2,000) |

TABLE 3

| | Polymer (Parts by weight) | Additive (Parts by weight) | Organic solvent (Parts by weight) |
|---|---|---|---|
| TC 1 | Top coat polymer (100) | — | Diisoamyl ether (2,700) 2-Methyl-1-butanol (270) |
| TC 2 | Top coat polymer (100) | Quencher 1 (0.3) | Diisoamyl ether (2,700) 2-Methyl-1-butanol (270) |
| TC 3 | Top coat polymer (100) | Tri-n-octylamine (0.3) | Diisoamyl ether (2,700) 2-Methyl-1-butanol (270) |

[Measurements of Dissolution Rates into a Solvent and an Alkaline Liquid After High-Temperature Baking]

ODL-50 (80% of carbon weight, manufactured by Shin-Etsu Chemical Co., Ltd.) was applied by spin-coating on a silicon wafer and baked at 250° C. for 60 seconds to obtain an underlying film with 200 nanometers in thickness. On it was applied ARC-29A (manufactured by Nissan Chemical Industries, Ltd.) as an anti-reflection film with spin-coating, and then it was baked at 200° C. for 60 seconds to obtain a substrate with the film thickness of 90 nanometers. A resist composition prepared according to the composition shown in Table 2 was applied with spin-coating on the thus obtained substrate, and then baked at 105° C. for 60 seconds on a hot plate to obtain a resist film with 120 nanometers in thickness.

Films of Resists 1 and 2 were exposed entirely on the wafer with an open-frame exposure with the exposure amount of 50 mJ/cm$^2$ by using an ArF scanner S-305B (manufactured by Nicon Corp., NA 0.68, a 0.85, normal illumination), and then baked at 190° C. for 60 seconds.

Films of Resists 3 to 11 were baked without exposure at 190° C. for 60 seconds.

As Comparative Example, Resist 3 was applied on the substrate as mentioned above, and then baked at 140° C. for 60 seconds. Similarly, Resist 3 was applied on the substrate as mentioned above, and then baked at 280° C. for 60 seconds.

Comparative Resist 1 and Comparative Resist 2 were baked without exposure at 190° C. for 60 seconds in a similar manner to that of films of Resists 3 to 11.

Comparative Resist 1 was irradiated by a Xe excimer lamp with a wavelength of 172 nanometers with the exposure amount of 200 $mJ/cm^2$, and then baked at 190° C. for 60 seconds.

Each solvent was dispensed to each of resist films baked under a still condition for 30 seconds, and then the solvent was span-off by rotation speed of 2000 rpm for 30 seconds. After it was baked at 100° C. for 60 seconds to dry-out the solvent, a change in the film thickness relative to the one after baking at 190° C. was measured by a film-thickness measurement instrument.

Thereafter, the alkali-dissolution rate after baking was measured in an aqueous TMAH (concentration of 2.38% by weight) using a resist development analyzer RDA-790 (manufactured by Litho Tech Japan, Co., Ltd.).

With regard to Resist 3, the alkali-dissolution rate in an aqueous TMAH with concentration of 0.0476% by weight was also measured.

The results are summarized in Table 4. In the case of the base polymer containing an oxanorbornane lactone, the film loss due to a solvent is decreased firstly as the crosslinking by an acid and a heat progresses. It can be seen that, when the crosslinking progresses further by raising a baking temperature or sifting a wavelength of an exposure to a shorter wavelength such as 172 nanometers, an alkali-dissolution rate is decreased too. Accordingly, it can be seen that, when conditions of crosslinking of a positive resist pattern arbitrarily are chosen, an acid-labile group in a positive resist pattern is dissociated and at the same time a crosslink is formed in such a degree as not to lose its solubility into an alkaline wet-etching liquid used in the positive-negative reversal thereby rendering a resistance with regard to an organic solvent used in the composition for formation of the reverse film used in the step of forming the reversed film.

[Evaluation an ArF Exposure Patterning]

ODL-50 (80% of carbon weight, manufactured by Shin-Etsu Chemical Co., Ltd.) was applied by spin-coating on a silicon wafer and baked at 250° C. for 60 seconds to obtain an underlying film with 200 nanometers in thickness. On it was applied ARC-29A (manufactured by Nissan Chemical Industries, Ltd.) as an anti-reflection film with spin-coating, and then it was baked at 200° C. for 60 seconds to obtain a substrate with the film thickness of 90 nanometers. A resist composition prepared according to the composition shown in Table 2 was applied with spin-coating on the thus obtained substrate, and then baked at 110° C. for 60 seconds on a hot plate to obtain a resist film with 120 nanometers in thickness. On it, in Examples 1 to 24 and Comparative Examples 1 to 8, a top-coat material TC-1 shown in Table 3 was applied by spin-coating, and then baked at 90° C. for 60 seconds to obtain a top coat with 50 nanometers in thickness. A top-coat material TC-2 was applied on the resist film in Example 25, and TC-3 in Examples 26 to 28, respectively, by spin-coating, and then each was baked at 90° C. for 60 seconds to obtain a respective top coat with 50 nanometers in thickness.

This was exposed in the X-direction with a 70-nanometers 1:1 line-and-space pattern by using an immersion scanner of an ArF excimer laser (S-307E, manufactured by Nicon Corp., NA 0.85, a 0.69/0.93, 20-degree dipole illumination, 6% half-tone phase shift mask) as the first exposure, and, as the second exposure, in the Y-direction with a 70-nanometers 1:1 line-and-space pattern in the place overlapping with the first exposure. Immediately after the exposure, it was baked at 100° C. for 60 seconds and then developed in an aqueous tetramethyl ammonium hydroxide with a concentration of 2.38% by weight for 30 seconds to obtain a dot pattern with 70 nanometers half-pitch. The entire dot patterns formed in Examples 1 and 2 were irradiated with an ArF excimer laser with the exposure amount of 30 $mJ/cm^2$ to generate an acid, and then baked at 190° C. for 60 seconds for deprotection of an acid-labile group and for crosslinking. The dot patterns formed in Examples 3 to 28 and Comparative Examples 1 to 5 were baked at 190° C. for 60 seconds to generate an acid from a heat-inductive acid-generator, thereby performed the deprotection of an acid-labile group and the crosslinking. In Comparative Example 6, the dot pattern after development was irradiated by a Xe excimer lamp with a 172 nanometers wavelength with the exposure amount of 200 $mJ/cm^2$, and then it was baked at 190° C. for 60 seconds. In Comparative Example 7, the dot pattern after development was baked at 140° C. for 60 seconds, and in Comparative Example 8, the dot pattern after development was baked at 280° C. for 60 seconds. Observation of the cross-section showed that the height of the dot pattern was about 60 nanometers.

A material for a reverse pattern film shown in Examples 1 to 26 (RF 1 to RF 16) and Comparative Examples 1 and 2 (RF 17 and RF 18) was applied on the dot pattern so as to give the film thickness of 50 nanometers, and then it was developed in an aqueous tetramethyl ammonium hydroxide with a concentration of 2.38% by weight for 30 seconds. In Examples 27 and 28 (RF 19 and RF 20), a material for a reverse pattern film was applied so as to give the film thickness of 50 nanometers, and then it was developed in an aqueous tetramethyl ammonium hydroxide with a concentration of 0.0476% by weight for 30 seconds. In Comparative Example 3, a 70-nanometers 1:1 hole pattern was exposed by using an ArF excimer laser scanner (S-307E, manufactured by Nicon Corp., NA 0.85, σ 0.69/0.93 annular illumination, 6% half-tone phase shift mask), and then the PEB development was made. Whether or not the dot pattern was reversed into the hole pattern was checked by TDSEM (S-9380, manufactured by Hitachi, Ltd.). The results are shown in Table 5.

TABLE 4

| | Solvent | Film loss by solvent (nm) | Dissolution Rate in Aq. tetramethyl ammonium hydroxide (TMAH 2.38% weight) (nm/s) | Dissolution Rate in Aq. tetramethyl ammonium hydroxide (TMAH 0.0476% weight) (nm/s) |
|---|---|---|---|---|
| Resist 1 | PGMEA | 0.5 | 170 | — |
| Resist 2 | PGMEA | 1.5 | 153 | — |
| Resist 3 | PGMEA | 0.6 | 180 | 17 |
| Resist 3 | EL | 1.2 | " | " |
| Resist 3 | PGMEA/EL (85/15) | 0.7 | " | " |
| Resist 3 | PGMEA/PGME (85/15) | 1.3 | " | " |

TABLE 4-continued

| | Solvent | Film loss by solvent (nm) | Dissolution Rate in Aq. tetramethyl ammonium hydroxide (TMAH 2.38% weight) (nm/s) | Dissolution Rate in Aq. tetramethyl ammonium hydroxide (TMAH 0.0476% weight) (nm/s) |
|---|---|---|---|---|
| Resist 3 | PGMEA/Cyclo-hexanone (85/15) | 0.4 | " | " |
| Resist 3 | 2-heptanone | 0.8 | " | " |
| Resist 4 | PGMEA | 1.8 | 162 | — |
| Resist 5 | PGMEA | 0.2 | 140 | — |
| Resist 6 | PGMEA | 0.6 | 132 | — |
| Resist 7 | PGMEA | 0.3 | 144 | — |
| Resist 8 | PGMEA | 0.6 | 280 | — |
| Resist 9 | PGMEA | 0.8 | 148 | — |
| Resist 10 | PGMEA | 0.7 | 126 | — |
| Resist 11 | PGMEA | 0.6 | 177 | — |
| Comparative Resist 1 | PGMEA | 53 | 40 | — |
| Comparative Resist 2 | PGMEA | 0.2 | 2 | — |
| Comparative Resist 1 172 nm exposure. | PGMEA | 5 | 3 | — |
| Resist 3 140° C. Bake | PGMEA | 120 | 3 | — |
| Resist 3 280° C. Bake | PGMEA | 0 | 3 | — |

TABLE 5

Results of reversal of dot pattern to hole pattern

| | Resist | Reverse pattern film | Hole dimension after reversal |
|---|---|---|---|
| Example 1 | Resist 1 | RF 1 | 71 nm |
| Example 2 | Resist 2 | RF 1 | 75 nm |
| Example 3 | Resist 3 | RF 1 | 71 nm |
| Example 4 | Resist 4 | RF 1 | 71 nm |
| Example 5 | Resist 3 | RF 2 | 74 nm |
| Example 6 | Resist 3 | RF 3 | 71 nm |
| Example 7 | Resist 3 | RF 4 | 72 nm |
| Example 8 | Resist 3 | RF 5 | 75 nm |
| Example 9 | Resist 3 | RF 6 | 76 nm |
| Example 10 | Resist 3 | RF 7 | 72 nm |
| Example 11 | Resist 3 | RF 8 | 71 nm |
| Example 12 | Resist 3 | RF 9 | 71 nm |
| Example 13 | Resist 3 | RF 10 | 71 nm |
| Example 14 | Resist 3 | RF 11 | 74 nm |
| Example 15 | Resist 3 | RF 12 | 72 nm |
| Example 16 | Resist 3 | RF 13 | 70 nm |
| Example 17 | Resist 3 | RF 14 | 71 nm |
| Example 18 | Resist 3 | RF 15 | 72 nm |
| Example 19 | Resist 4 | RF 16 | 72 nm |
| Example 20 | Resist 5 | RF 1 | 71 nm |
| Example 21 | Resist 6 | RF 1 | 72 nm |
| Example 22 | Resist 7 | RF 1 | 72 nm |
| Example 23 | Resist 8 | RF 1 | 73 nm |
| Example 24 | Resist 9 | RF 1 | 71 nm |
| Example 25 | Resist 10 | RF 1 | 71 nm |
| Example 26 | Resist 11 | RF 1 | 71 nm |
| Example 27 | Resist 3 | RF 19 | 71 nm |
| Example 28 | Resist 3 | RF 20 | 74 nm |
| Comparative Example 1 | Resist 3 | RF 17 | Hole not opened |
| Comparative Example 2 | Resist 3 | RF 18 | 90 nm |
| Comparative Example 3 | Resist 3 | — | Hole not opened |
| Comparative Example 4 | Comparative Resist 1 | RF 1 | Hole not opened |
| Comparative Example 5 | Comparative Resist 2 | RF 1 | Hole not opened |
| Comparative Example 6 | Comparative Resist 1 72 nm exposure | RF 1 | Hole not opened |
| Comparative Example 7 | Resist 3 140° C. Bake | RF 1 | Resist pattern dissolved and disappeared when reverse film material was applied |
| Comparative Example 8 | Resist 3 280° C. Bake | RF 1 | Hole not Opened |

From the results shown in Table 4, it can be seen the followings. In Resists 1 to 11, a solvent-insoluble and alkali-soluble film is formed after baking at 190° C. In Resist 3, an alkali-soluble film, even soluble in a diluted developer (aqueous TMAH of 0.0476% by weight concentration), is formed. When a material not containing an oxanorbornane lactone is used, or a baking temperature is low even if an oxanorbornane lactone is contained, a sufficient solvent-resistance cannot be obtained because of insufficient crosslinking. When a baking temperature is too high, or too much crosslinking occurs by irradiating of a light with a short wavelength such as 172 nanometers, the alkali-dissolution rate is also decreased, thereby the reversal to a hole pattern cannot be made.

From the results shown in Table 5, it can be seen the followings. In the patterning process of Examples 1 to 28, a dot pattern is converted to a hole pattern within 10% of a dimensional change. When the alkali-dissolution rate of a reverse pattern film is too slow (Comparative Example 1), a hole is not opening, while too fast (Comparative Example 2), a larger hole diameter is resulted. When exposure is made in a usual manner (Comparative Example 3), a hole with 50 nanometers cannot be resolved. In Comparative Example 4, when a material for a reverse pattern film is applied on the Comparative Resist, the resist pattern is dissolved into a solvent of the reverse film material, thereby causing a mixing so that a hole pattern is not opening. When the baking temperature is too low, a pattern is dissolved into a solvent at the time of coating of a reverse film, and when the baking temperature is too high, the crosslinking progresses too far, thereby lowering the alkali-dissolution rate, and thus a hole is not opening.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

What is claimed is:

1. A resist patterning process using a positive-negative reversal, comprising at least a step in which a composition for formation of a chemically-amplified positive resist film containing a resin containing a repeating unit having an acid-labile group dissociable by an acid is applied on a processing substrate to form a resist film; a step of pattern-irradiating a high energy beam on the resist film, making an acid generated by the exposure to act on the acid-labile group, taking place a dissociation reaction in an exposed part of the acid-labile group of the resin, and forming a positive pattern by developing in an alkaline developer; a step of dissociating the acid-labile group in the positive resist pattern with a concurrent crosslinking in such a degree as not to lose its solubility in an alkaline wet-etching liquid in a positive-negative reversal step to be followed, thereby rendering a resistance with regard to an organic solvent used in a composition for formation of a reverse film used in a step of forming a reverse film to be followed; a step of forming a reverse film by using a composition for formation of a reverse film containing an organic silicon compound having a siloxane bond on the positive resist pattern rendered with the resistance; and a step of reversing the positive pattern to a negative pattern by dissolving the positive pattern rendered with the resistance into an alkaline wet-etching liquid for its removal.

2. The patterning process according to claim 1, wherein the step of dissociating the acid-labile group in the positive resist pattern with a concurrent crosslinking in such a degree as not to lose its solubility in an alkaline wet-etching liquid in a positive-negative reversal step thereby rendering a resistance with regard to an organic solvent used in a composition for formation of a reverse film used in a step of forming a reverse film is preferably performed in such a manner as to render a solubility in terms of an etching rate of 2 nanometers/second or faster when an etching is done in an aqueous tetramethyl ammonium hydroxide (TMAH, 2.38% by weight) as the alkaline wet-etching liquid, and a resistance with regard to the solvent, as expressed by a film loss, of 10 nanometers or less when contacted with the solvent for 30 second, wherein the solvent is selected from ethyleneglycol, diethyleneglycol, triethyleneglycol, propyleneglycol, dipropyleneglycol, butanediol, pentanediol, propyleneglycol monomethyl ether acetate, cyclohexanone, propyleneglycol monomethyl ether, propyleneglycol monoethyl ether, propyleneglycol monopropyl ether, propyleneglycol monobutyl ether, and ethyl lactate, singly or as a mixture thereof.

3. The patterning process according to claim 1, wherein the composition for formation of the reverse film contains, in addition to the organic silicon compound, an oxide of an element belonging to group III, group IV, and group V other than a silicon atom.

4. The patterning process according to claim 1, wherein a silsesquioxane material is used as the organic silicon compound.

5. The patterning process according to claim 1, wherein a dissolution rate of the formed reverse film by the alkaline wet-etching liquid is equal to or more than 0.02 nanometer/second and equal to or less than 2 nanometers/second.

6. The patterning process according to claim 1, wherein the step of dissociating the acid-labile group in the positive resist pattern with a concurrent crosslinking in such a degree as not to lose its solubility in an alkaline wet-etching liquid in a positive-negative reversal step thereby rendering a resistance with regard to an organic solvent used in a composition for formation of a reverse film used in a step of forming a reverse film is performed by any one of irradiating a light to the obtained positive resist pattern or heating it, or both, thereby dissociating the acid-labile group contained in the resist composition in the resist pattern by an acid thereby generated together with concurrent crosslinking.

7. The patterning process according to claim 1, wherein the step of dissociating the acid-labile group in the positive resist pattern with a concurrent crosslinking in such a degree as not to lose its solubility in an alkaline wet-etching liquid in a positive-negative reversal step thereby rendering a resistance with regard to an organic solvent used in a composition for formation of a reverse film used in a step of forming a reverse film is performed, with using the composition for formation of a chemically amplified positive resist film for coating on the processing substrate which is added by a heat-inductive acid-generator, by heating the obtained positive resist pattern to generate an acid from the heat-inductive acid-generator and concurrently dissociate the acid-labile group in the positive resist by the acid thereby generated.

8. The patterning process according to claim 7, wherein the heat-inductive acid-generator represented by the following general formula (P1a-2) is used:

(P1a-2)

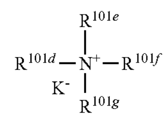

wherein, K− represents a sulfonic acid whose at least one α-position is fluorinated, perfluoroalkyl imidic acid, or perfluoroalkyl methide acid; each of $R^{101d}$, $R^{101e}$, $R^{101f}$, and $R^{101g}$ represents a hydrogen atom, a linear, a branched, or a cyclic alkyl group, alkenyl group, oxoalkyl group, or oxoalkenyl group having 1 to 12 carbon atoms, an aryl group having 6 to 20 carbon atoms, or an aralkyl group or aryloxoalkyl group having 7 to 12 carbon atoms, wherein a part or all of hydrogen atoms of these groups may be substituted by an alkoxy group; $R^{101d}$ and $R^{101e}$, and $R^{101d}$, $R^{101e}$, and $R^{101f}$ may be bonded to form a ring together with a nitrogen atom to which these groups are bonded, and when forming the ring, $R^{101d}$ and $R^{101e}$, and $R^{101d}$, $R^{101e}$, and $R^{101f}$ represent an alkylene group having 3 to 10 carbon atoms or form a heteroaromatic ring containing the nitrogen atom in the formula in it.

9. The patterning process according to claim 1, wherein the step of dissociating the acid-labile group in the positive resist pattern with a concurrent crosslinking in such a degree as not to lose its solubility in an alkaline wet-etching liquid in a positive-negative reversal step thereby rendering a resistance with regard to an organic solvent used in a composition for formation of a reverse film used in a step of forming a reverse film is performed, with using the composition for formation of a chemically amplified positive resist film for coating on the processing substrate containing a repeating unit having a lactone ring or a 7-oxanorbornane ring and a repeating unit having an alicyclic acid-labile group dissociable by an acid, by heating the obtained positive resist pattern to dissociate the acid-labile group in the positive resist with concurrent crosslinking.

10. The patterning process according to claim 9, wherein the repeating unit having the 7-oxanorbornane ring is a repeating unit (a) as shown by the following general formula (1):

(1)

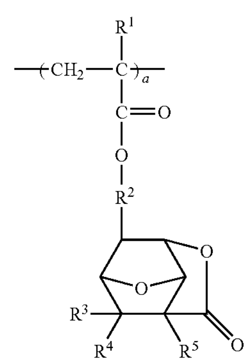

wherein, $R^1$ represents a hydrogen atom or a methyl group; $R^2$ represents a single bond, or a linear, a branched, or a cyclic alkylene group having 1 to 6 carbon atoms, optionally containing an ether group or an ester group, while, if it is a linear, a branched, or a cyclic alkylene group having 1 to 6 carbon atoms, a carbon atom to which the ester group in the formula is bonded is a primary or a secondary; each of $R^3$, $R^4$, and $R^5$ represents a hydrogen atom, or a linear, a branched, or a cyclic alkyl group having 1 to 6 carbon atoms; and the number (a) is in the range of $0<a<1.0$.

11. The patterning process according to claim 1, wherein the repeating unit having the acid-labile group dissociable by an acid is a repeating unit (b) as shown by the following general formula (3):

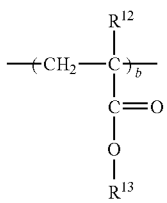

(3)

wherein, $R^{12}$ represents a hydrogen atom or a methyl group; and $R^{13}$ represents an acid-labile group.

12. The patterning process according to claim 1, wherein the pattern-exposure of a high energy beam is done by a liquid immersion exposure using water as the liquid.

13. The patterning process according to claim 12, wherein a composition for formation of a chemically-amplified positive resist film is applied on a processing substrate to form a resist film, and then a top coat is formed on it.

14. The patterning process according to claim 1, wherein a high energy beam is pattern-irradiated onto the resist film to form a dot pattern in the step of forming the positive pattern, then a hole pattern is formed by converting the positive dot pattern in the positive-negative conversion step.

15. The patterning process according to claim 14, wherein, to form the dot pattern by a pattern-exposure of a high energy beam onto the resist film in the step of forming the positive pattern, an exposure is done onto a necessary part of the resist film in such a manner as to form a first line pattern on the resist film, then the resist film is exposed to form a second line pattern perpendicularly intersected with the first line pattern, and then a development using the alkaline developer is done after heat-treatment.

16. The patterning process according to claim 1, wherein a film containing 75% by weight or more carbons is formed on the processing substrate by a CVD method (a chemical vapor deposition method) or a spin coating method in advance in the step of forming the resist film, then the positive pattern is formed on the carbon film, and with this, the carbon film is processed by dry etching by using a pattern of the silicon-containing film having the reversed positive pattern as a mask, and then the processing substrate is processed by using the carbon film as a mask.

17. The patterning process according to claim 16, wherein an anti-reflection film formed of a hydrocarbon material is further formed on the carbon film formed in advance on the processing substrate, and then the resist film is formed on the anti-reflection film.

* * * * *